United States Patent
Matsuura

(10) Patent No.: US 7,881,399 B2
(45) Date of Patent: Feb. 1, 2011

(54) TRANSMISSION CIRCUIT AND COMMUNICATION DEVICE

(75) Inventor: Toru Matsuura, Osaka (JP)

(73) Assignee: Panasonic Corporation, Osaka (JP)

( * ) Notice: Subject to any disclaimer, the term of this patent is extended or adjusted under 35 U.S.C. 154(b) by 802 days.

(21) Appl. No.: 11/898,989

(22) Filed: Sep. 18, 2007

(65) Prior Publication Data
US 2008/0068240 A1    Mar. 20, 2008

(30) Foreign Application Priority Data
Sep. 19, 2006  (JP) .............................. 2006-252763

(51) Int. Cl.
*H04L 27/00* (2006.01)
(52) U.S. Cl. ....................... 375/295; 375/260; 375/298; 375/302; 455/108; 455/110; 332/120; 332/150
(58) Field of Classification Search .................. 375/295, 375/298, 300, 302, 260, 261, 268, 271; 455/91, 455/108, 110, 114, 3; 332/120, 149, 150
See application file for complete search history.

(56) References Cited

U.S. PATENT DOCUMENTS

| 6,661,363 | B2 |  | 12/2003 | Zierhofer |  |
| 7,061,989 | B2 | * | 6/2006 | Bellaouar et al. | 375/295 |
| 7,336,934 | B2 | * | 2/2008 | Ikedo et al. | 455/108 |

| 2005/0129142 | A1 | * | 6/2005 | Yellin et al. | 375/302 |

FOREIGN PATENT DOCUMENTS

| JP | 2004-048703 | 2/2004 |
| JP | 2004-072734 | 3/2004 |
| JP | 2004-159319 | 6/2004 |

* cited by examiner

*Primary Examiner*—Dac V Ha
(74) *Attorney, Agent, or Firm*—Wenderoth, Lind & Ponack, L.L.P.

(57) ABSTRACT

Provided is a transmission circuit which is small in size, operates with high efficiency, and outputs a transmission signal having high linearity. A signal generation section 11 generates an amplitude signal m(t) and a phase signal. An angle modulation section 17 angle-modulates the phase signal to output an angle-modulated signal. An amplitude calculation section 12 outputs a discrete value signal V(t) having a plurality of discrete values corresponding to a magnitude of the amplitude signal m(t). A dividing section 13 divides the amplitude signal m(t) by the discrete value signal V(t) to output an amplitude signal M(t). A delta-sigma modulation section 14 delta-sigma modulates the amplitude signal M(t) to output a delta-sigma modulated signal. A variable gain amplifier section 15 amplifies the delta-sigma modulated signal by a gain corresponding to the discrete value signal V(t). An amplitude amplifying section 16 supplies, to an amplitude modulation section 18, a voltage corresponding to a magnitude of the delta-sigma modulated signal. The amplitude modulation section 18 amplitude-modulates the angle-modulated signal by the voltage supplied from the amplitude amplifying section 16, to output a modulation signal.

41 Claims, 39 Drawing Sheets

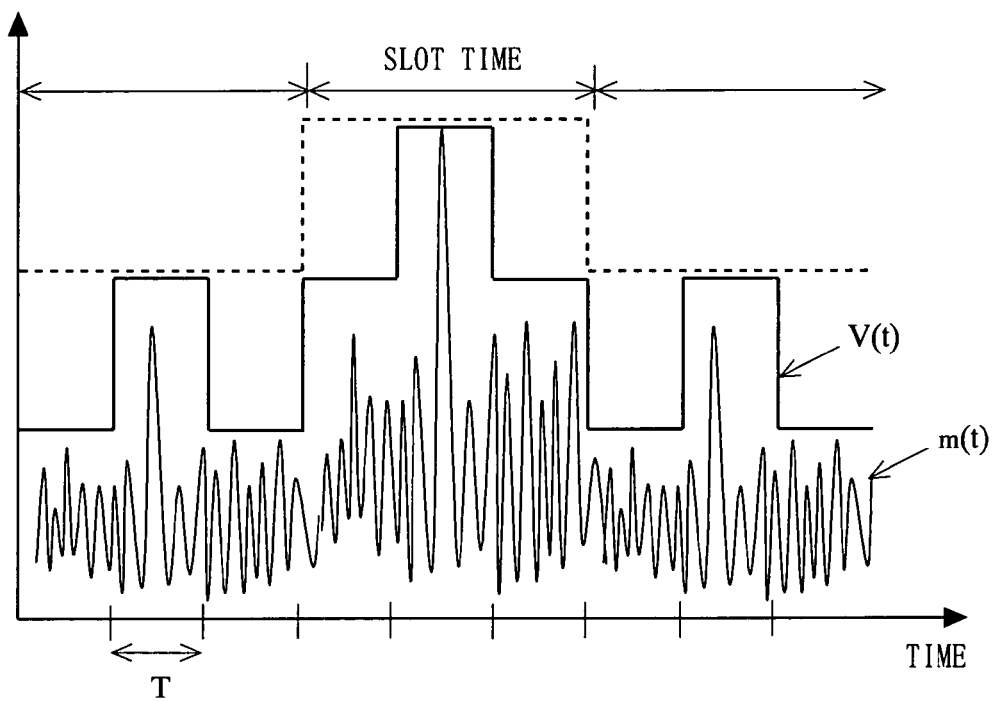

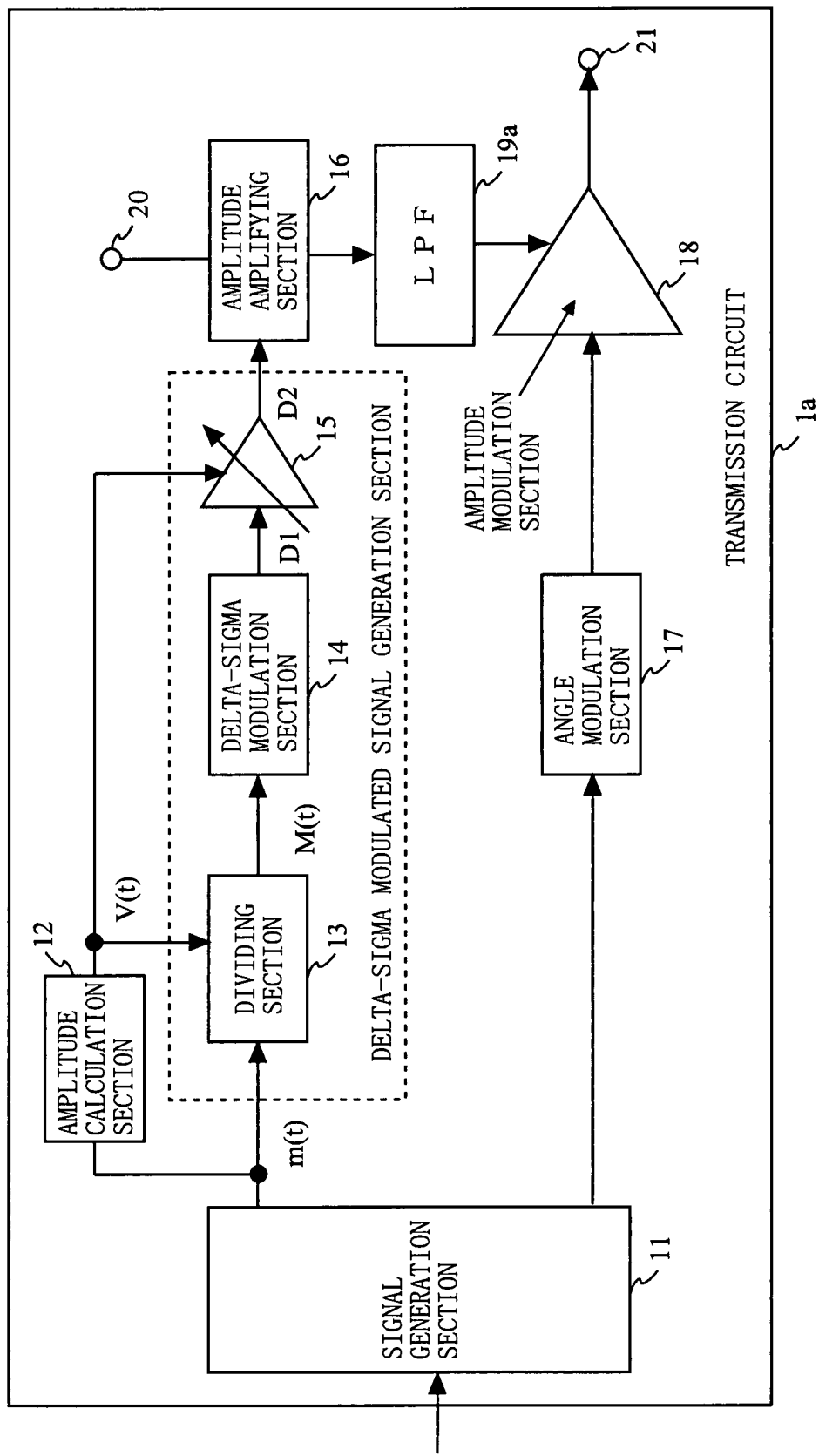
F I G. 8A

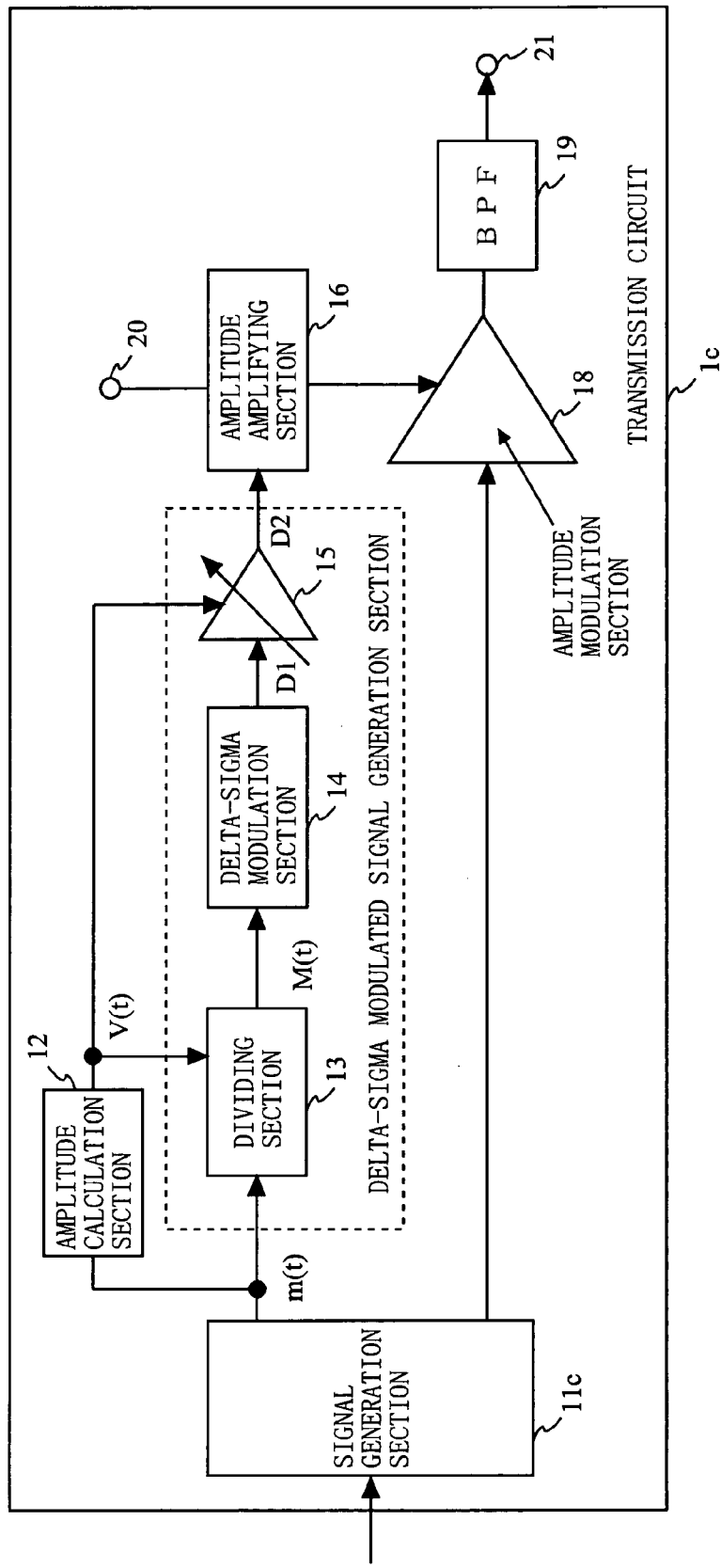
F I G. 8 C

F I G. 1 1 D
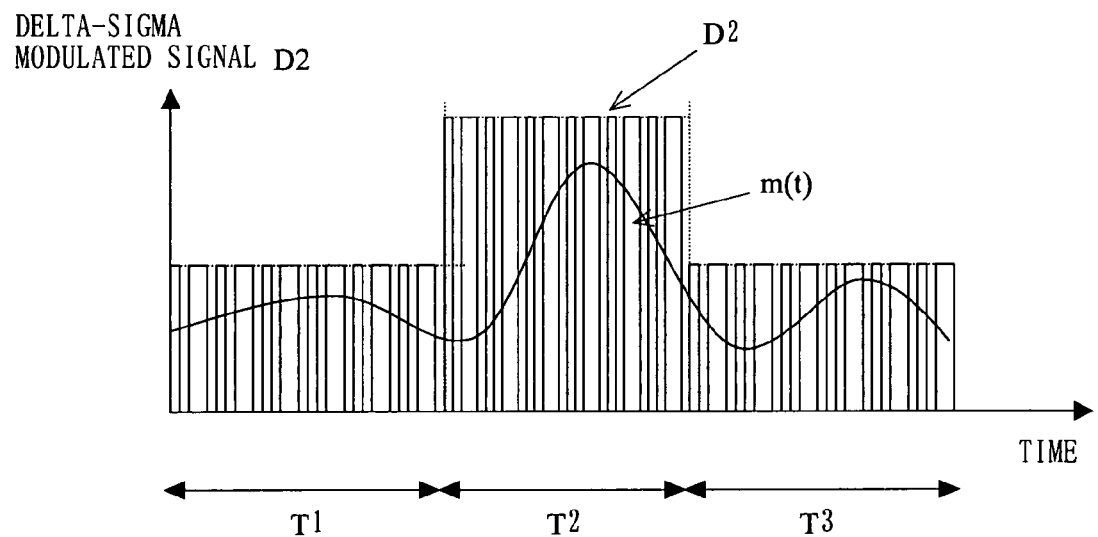

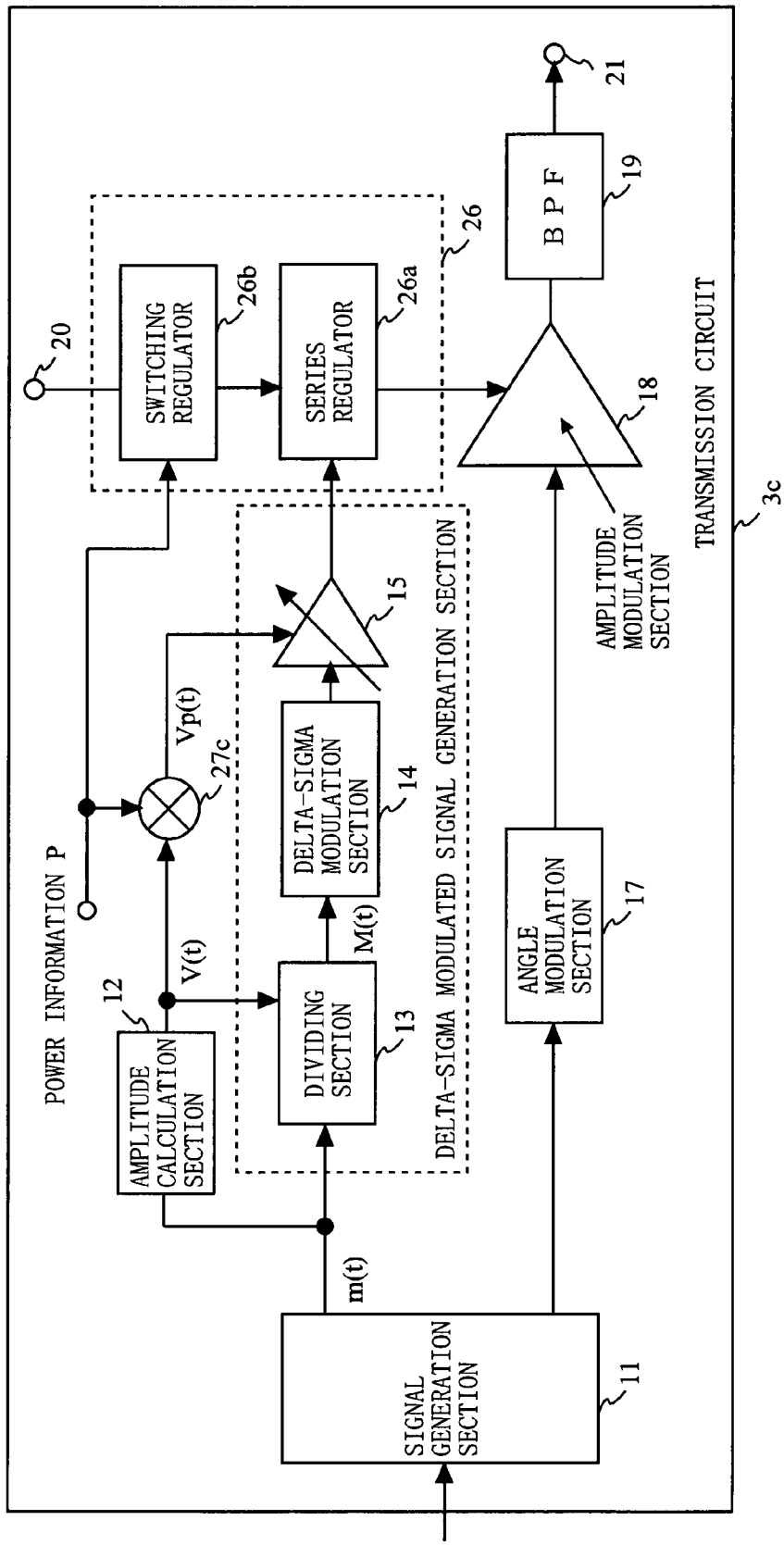
F I G. 14C

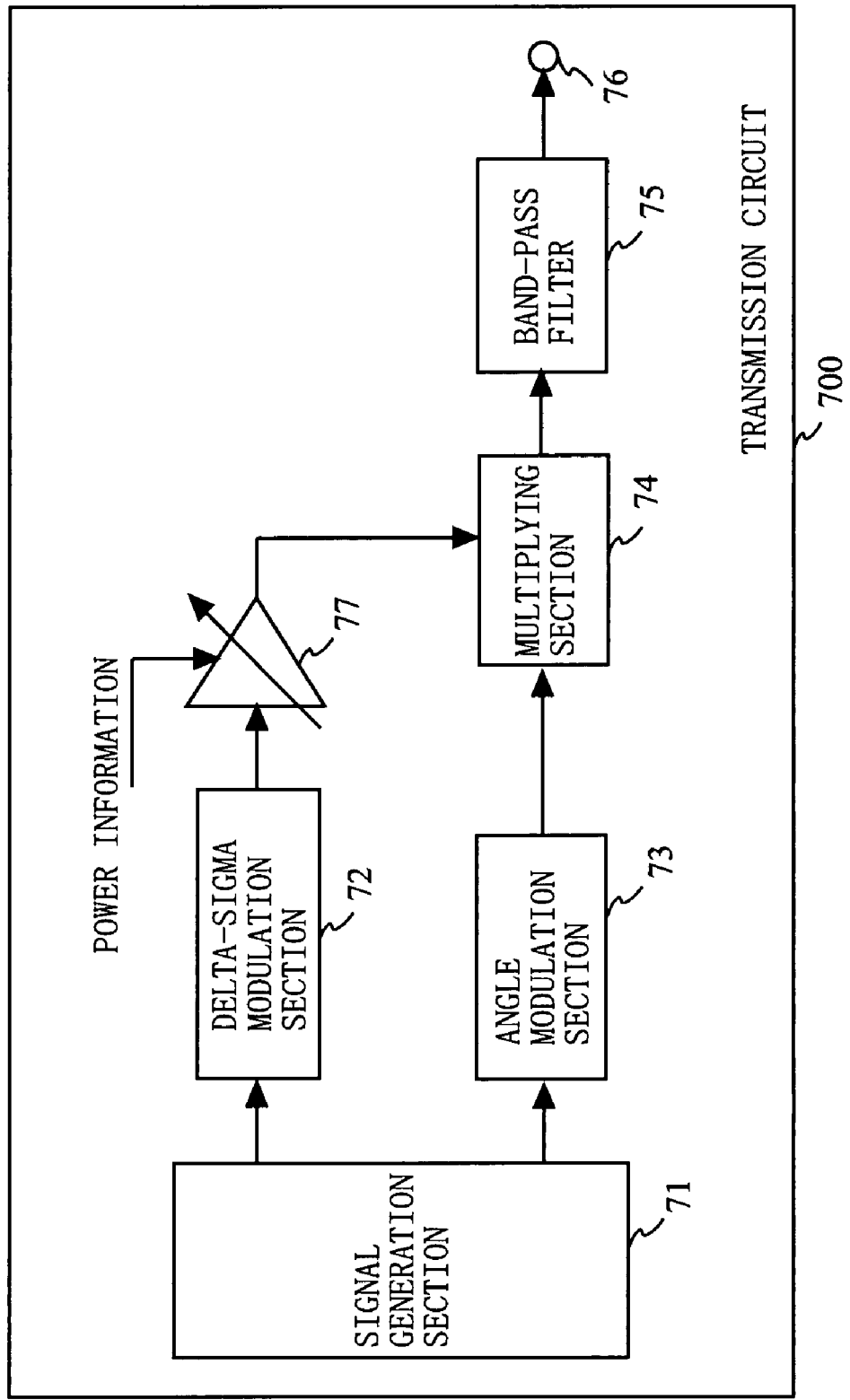
F I G. 2 2 PRIOR ART

F I G. 2 4 B PRIOR ART
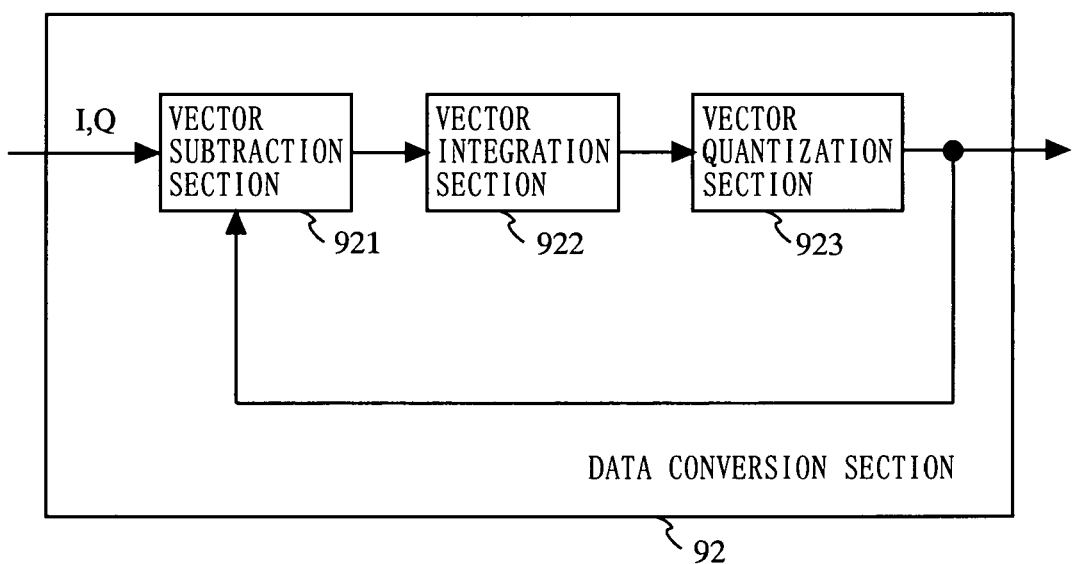

TRANSMISSION CIRCUIT AND COMMUNICATION DEVICE

BACKGROUND OF THE INVENTION

1. Field of the Invention

The present invention relates to a transmission circuit used for communication devices such as mobile phones and wireless LAN devices. The present invention particularly relates to a transmission circuit, which is small in size, operates with high efficiency and outputs a transmission signal having high linearity, and to a communication device using the transmission circuit.

2. Description of the Background Art

Communication devices such as mobile phones and wireless LAN devices are required to, regardless of a magnitude of output power thereof, secure precision of a transmission signal and operate with low power consumption. For such a communication device, a transmission circuit, which is small in size, operates with high efficiency and outputs a transmission signal having high linearity, is used. Hereinafter, conventional transmission circuits will be described.

One of the conventional transmission circuits is, for example, a transmission circuit disclosed in FIG. 1 of the Japanese Laid-Open Patent Publication No. 2004-048703 (hereinafter, referred to as Patent Document 1). FIG. 22 is a block diagram showing an exemplary structure of a conventional transmission circuit 700 disclosed in Patent Document 1. As shown in FIG. 22, the conventional transmission circuit 700 comprises a signal generation section 71, delta-sigma modulation section 72, angle modulation section 73, multiplying section 74, band-pass filter 75, output terminal 76 and a variable gain amplifier section 77.

In the conventional transmission circuit 700, the signal generation section 71 generates an amplitude signal and a phase signal. The amplitude signal is inputted to the delta-sigma modulation section 72. The delta-sigma modulation section 72 delta-sigma modulates the inputted amplitude signal, and outputs a resultant signal as a delta-sigma modulated signal. The delta-sigma modulated signal is inputted to the variable gain amplifier section 77. The variable gain amplifier section 77 amplifies the delta-sigma modulated signal by a gain corresponding to power information indicating a magnitude of an output power of the transmission circuit. The delta-sigma modulated signal amplified by the variable gain amplifier section 77 is inputted to the multiplying section 74.

The phase signal is inputted to the angle modulation section 73. The angle modulation section 73 angle-modulates the phase signal, and outputs a resultant signal as an angle-modulated signal. The angle-modulated signal is inputted to the multiplying section 74. The multiplying section 74 multiplies the delta-sigma modulated signal by the angle-modulated signal, and outputs a resultant signal as a modulation signal. The band-pass filter 75 removes quantization noise contained in the modulation signal. The modulation signal from which the quantization noise has been removed by the band-pass filter 75 is outputted as a transmission signal from the output terminal 76.

Another one of the conventional circuits is, for example, a transmission circuit disclosed in FIGS. 11 and 17 of Japanese Laid-Open Patent Publication No. 2004-072734 (hereinafter, referred to as Patent Document 2). FIG. 23A is a block diagram showing an exemplary structure of a conventional transmission circuit 800 disclosed in Patent Document 2. In FIG. 23A, the conventional transmission circuit 800 comprises a data generation section 81, vector modulation section 82, amplifier section 83, band-pass filter 84 and an antenna 85.

In the conventional transmission circuit 800, the data generation section 81 generates first data and second data which are orthogonal to each other. The data generation section 81 will be described later in detail. The vector modulation section 82 vector-modulates the first and second data, and outputs a resultant signal as a modulation signal. The amplifier section 83 amplifies the modulation signal. The band-pass filter 84 removes quantization noise contained in the modulation signal. The modulation signal whose quantization noise has been removed by the band-pass filter 84 is outputted from the antenna 85 as a transmission signal.

FIG. 23B is a block diagram showing an exemplary structure of the data generation section 81. As shown in FIG. 23B, the data generation section 81 includes a source data generation section 811, delta-sigma modulation section 812, multiplying section 813 and a multiplying section 814. The source data generation section 811 generates, based on a baseband signal, an amplitude signal, a standardized I signal and a standardized Q signal. The standardized I signal is calculated by dividing an I signal (in-phase signal), which is a baseband signal, by an amplitude signal. Similarly, the standardized Q signal is calculated by dividing a Q signal (quadrature-phase signal), which is a baseband signal, by the amplitude signal.

The amplitude signal is inputted to the delta-sigma modulation section 812. The delta-sigma modulation section 812 delta-sigma modulates the inputted amplitude signal, and outputs a resultant signal as a delta-sigma modulated signal. The multiplying section 813 multiplies the standardized I signal by the delta-sigma modulated signal, and outputs a signal resulting from the multiplication as the first data. The multiplying section 814 multiplies the standardized Q signal by the delta-sigma modulated signal, and outputs a signal resulting from the multiplication as the second data.

Still another one of the conventional transmission circuits is, for example, a transmission circuit disclosed in FIG. 24A of Japanese Laid-Open Patent Publication No. 2004-159319 (hereinafter, referred to as Patent Document 3). FIG. 24A is a block diagram showing an exemplary structure of a conventional transmission circuit 900 disclosed in Patent Document 3. As shown in FIG. 24A, the conventional transmission circuit 900 comprises a data generation section 91, data conversion section 92, modulation section 93, amplifier section 94, band-pass filter 95 and an antenna 96.

In the conventional transmission circuit 900, the data generation section 91 generates an I signal and a Q signal. The I and Q signals are inputted to the data conversion section 92. The data conversion section 92 converts the inputted I and Q signals into quantized signals each having a binary value. The data conversion section 92 will be described later in detail. The modulation section 93 modulates the quantized signals, and outputs a resultant signal as a modulation signal. The amplifier section 94 amplifies the modulation signal. The band-pass filter 95 removes quantization noise contained in the modulation signal amplified by the amplifier section 94. The modulation signal, whose quantization noise has been removed by the band-pass filter 95, is outputted from the antenna 96 as a transmission signal.

FIG. 24B is a block diagram showing an exemplary structure of the data conversion section 92. As shown in FIG. 24B, the data conversion section 92 includes a vector subtraction section 921, vector integration section 922 and vector quantization section 923. The I and Q signals are inputted to the data conversion section 92 from the data generation section 91. The I and Q signals are inputted to the vector integration section 922 via the vector subtraction section 921. The vector integration section 922 integrates the I and Q signals, respectively. Signals outputted from the vector integration section 922 are inputted to the vector quantization section 923. The vector quantization section 923 quantizes the inputted signals, and outputs resultant signals as quantized signals each having a binary value. Then, the vector subtraction section 921 subtracts the quantized signals from the inputted I and Q signals, respectively, thereby stabilizing an output of the quantized signals.

However, in the conventional transmission circuit 700 shown in FIG. 22, an envelope of the amplitude signal generated by the signal generation section 71 significantly varies, and thus quantization noise frequently occurs in the delta-sigma modulation section 72. For this reason, the band-pass filter 75 is required to have a steep characteristic in order to remove the quantization noise. This consequently causes an increase in power consumption and size of the transmission circuit. Thus, the conventional transmission circuit 700 has a problem of decreased power efficiency and increased circuit size. Also, there is a possibility that a quality of the transmission signal deteriorates due to the quantization noise which has not been removed by the band-pass filter 75.

Further, in the conventional transmission circuit 800 shown in FIGS. 23A and 23B, an envelope of the amplitude signal generated by the source data generation section 811 significantly varies, and thus quantization noise frequently occurs in the delta-sigma modulation section 812. For this reason, the band-pass filter 84 is required to have a steep characteristic in order to remove the quantization noise. This consequently causes an increase in power consumption and size of the transmission circuit. Thus, the conventional transmission circuit 800 has a problem of decreased power efficiency and increased circuit size. Also, there is a possibility that a quality of the transmission signal deteriorates due to the quantization noise which has not been removed by the band-pass filter 84.

Still further, in the conventional transmission circuit 900 shown in FIGS. 24A and 24B, an envelope of each signal inputted to the vector quantization section 923 significantly varies, and thus quantization noise frequently occurs in the vector quantization section 923. For this reason, the band-pass filter 95 is required to have a steep characteristic in order to remove the quantization noise. This consequently causes an increase in power consumption and size of the transmission circuit. Thus, the conventional transmission circuit 900 has a problem of decreased power efficiency and increased circuit size. Also, there is a possibility that a quality of the transmission signal deteriorates due to the quantization noise which has not been removed by the band-pass filter 95.

SUMMARY OF THE INVENTION

Therefore, an object of the present invention is to provide a transmission circuit for solving the above problem, which is small in size, operates with high efficiency and outputs a transmission signal having high linearity, and also to provide a communication device using the transmission circuit.

The present invention is directed to a transmission circuit for generating and outputting a transmission signal based on input data. In order to achieve the above object, the transmission circuit comprises: a signal generation section for performing predetermined signal processing on the input data, thereby generating an amplitude signal and an angle-modulated signal; an amplitude calculation section for performing predetermined arithmetic processing on the amplitude signal, and outputting a resultant signal as a discrete value signal having a plurality of discrete values corresponding to a magnitude of the amplitude signal; a delta-sigma modulated signal generation section for delta-sigma modulating the amplitude signal in accordance with the discrete value signal, and outputting a resultant signal as a delta-sigma modulated signal; an amplitude amplifying section for outputting a signal corresponding to a magnitude of the delta-sigma modulated signal; and an amplitude modulation section for amplitude-modulating, by amplifying the angle-modulated signal in accordance with the signal outputted from the amplitude amplifying section, the angle-modulated signal, and outputting a resultant signal as a transmission signal having been angle-modulated and amplitude-modulated. The amplitude calculation section retains at least one threshold value and two or more discrete values corresponding to the at least one threshold value; determines, at predetermined time periods, whether or not the amplitude signal exceeds the at least one threshold value; selects, based on a determination result, a discrete value to be outputted; and outputs the selected discrete value as the discrete value signal.

Preferably, the delta-sigma modulated signal generation section includes: a dividing section for dividing the amplitude signal by the discrete value signal, and outputting a resultant signal as an amplitude signal whose envelope variation is small; a delta-sigma modulation section for delta-sigma modulating the amplitude signal outputted from the dividing section, and outputting a resultant signal as the delta-sigma modulated signal; and a variable gain amplifier section for amplifying the delta-sigma modulated signal by a gain corresponding to a magnitude of the discrete value signal.

Alternatively, the delta-sigma modulated signal generation section may include a delta-sigma modulation section for delta-sigma modulating the amplitude signal, and outputting a resultant signal as the delta-sigma modulated signal. The delta-sigma modulation section changes the magnitude of the delta-sigma modulated signal to be outputted, such that the magnitude of the delta-sigma modulated signal has a same characteristic as that of a magnitude of the discrete value signal.

Preferably, the delta-sigma modulation section changes the magnitude of the delta-sigma modulated signal to be outputted, so as to be proportional to the magnitude of the discrete value signal.

The delta-sigma modulation section refers to a look-up table, in which an optimal value is preset, thereby changing, in accordance with the magnitude of the discrete value signal, the magnitude of the delta-sigma modulated signal to be outputted.

Preferably, the signal generation section includes: a polar coordinate signal generation section for generating the amplitude signal and a phase signal respectively based on an amplitude component and a phase component which are obtained by performing signal processing on the input data; and an angle modulation section for angle-modulating the phase signal, and outputting a resultant signal as the angle-modulated signal.

Alternatively, the signal generation section may include: a quadrature signal generation section for generating, by performing signal processing on the input data, a vector signal comprising an in-phase signal (I signal) and a quadrature-phase signal (Q signal) which are orthogonal to each other; a vector modulation section for vector-modulating the vector signal; an envelope detection section for detecting an envelope component of a signal outputted from the vector modulation section, and outputting the detected envelope component as the amplitude signal; and a limiter for limiting, to a particular magnitude, the envelope component of the signal outputted from the vector modulation section, and outputting the signal, whose envelope component has been limited in magnitude, as the angle-modulated signal.

Preferably, the amplitude calculation section includes a maximum amplitude detection section for detecting, at the predetermined time periods, a maximum value of the amplitude signal, and a quantization section for: retaining the at least one threshold value and the two or more discrete values corresponding to the at least one threshold value; determining, at the predetermined time periods, whether or not the maximum value of the amplitude signal exceeds the at least one threshold value; selecting, based on a determination result, the discrete value to be outputted; and outputting the selected discrete value as the discrete value signal.

Preferably, the transmission circuit further comprises a band-pass filter, which is connected subsequent to the amplitude modulation section, for removing a quantization noise from the transmission signal outputted from the amplitude modulation section.

Alternatively, the transmission circuit may further comprise a low-pass filter, which is connected between the amplitude amplifying section and the amplitude modulation section, for removing a quantization noise from the signal outputted from the amplitude amplifying section. Still alternatively, the transmission circuit may further comprise a low-pass filter, which is provided between the delta-sigma modulated signal generation section and the amplitude amplifying section, for removing a quantization noise from the delta-sigma modulated signal.

The amplitude amplifying section may be structured by a switching regulator, and supply, to the amplitude modulation section, a voltage corresponding to the magnitude of the delta-sigma modulated signal generated by the delta-sigma modulated signal generation section. Alternatively, the amplitude amplifying section may be structured by a series regulator, and supply, to the amplitude modulation section, a voltage corresponding to the magnitude of the delta-sigma modulated signal generated by the delta-sigma modulated signal generation section. Further alternatively, the amplitude amplifying section may be structured by a current-driven regulator, and supply, to the amplitude modulation section, an electric current corresponding to the magnitude of the delta-sigma modulated signal generated by the delta-sigma modulated signal generation section.

Preferably, the amplitude amplifying section includes: a series regulator for supplying, to the amplitude modulation section, a voltage corresponding to the magnitude of the delta-sigma modulated signal generated by the delta-sigma modulated signal generation section; and a switching regulator for supplying, to the series regulator, a voltage corresponding to a magnitude of the discrete value signal outputted from the amplitude calculation section.

Preferably, the transmission circuit further comprises a timing control section, which is connected between the amplitude calculation section and the switching regulator, for controlling, so as to compensate for rising of the switching regulator, a timing of inputting, to the switching regulator, the discrete value signal outputted from the amplitude calculation section.

Alternatively, the transmission circuit may further comprise a multiplying section which is connected subsequent to the signal generation section and to which power information indicating a magnitude of output power of the transmission circuit is inputted. The multiplying section multiplies the amplitude signal, which is generated by the signal generation section, by the power information. The amplitude signal is inputted to the amplitude calculation section and the delta-sigma modulated signal generation section from the multiplying section.

Further alternatively, the transmission circuit may further comprise a multiplying section which is connected subsequent to the amplitude calculation section and to which power information indicating a magnitude of output power of the transmission circuit is inputted. The amplitude amplifying section includes: a series regulator for supplying, to the amplitude modulation section, a voltage corresponding to the magnitude of the delta-sigma modulated signal generated by the delta-sigma modulated signal generation section; and a switching regulator for supplying, to the series regulator, a voltage corresponding to a magnitude of an output signal of the multiplying section. The multiplying section multiplies the discrete value signal, which is outputted from the amplitude calculation section, by the power information. The discrete value signal, which has been multiplied by the power information, is inputted to the switching regulator and the variable gain amplifier section from the multiplying section.

Further alternatively, the transmission circuit may further comprise a multiplying section which is connected subsequent to the amplitude calculation section and to which power information indicating a magnitude of output power of the transmission circuit is inputted. The amplitude amplifying section includes: a series regulator for supplying, to the amplitude modulation section, a voltage corresponding to the magnitude of the delta-sigma modulated signal generated by the delta-sigma modulated signal generation section; and a switching regulator for supplying, to the series regulator, a voltage corresponding to the power information. The multiplying section multiplies the discrete value signal, which is outputted from the amplitude calculation section, by the power information. The discrete value signal is inputted to the variable gain amplifier section from the multiplying section.

The amplitude amplifying section may include: a plurality of series regulators for supplying, to the amplitude modulation section, a voltage corresponding to the magnitude of the delta-sigma modulated signal generated by the delta-sigma modulated signal generation section; a switch for switching a connection between the amplitude modulation section and the plurality of series regulators; and a switching regulator for supplying, to the plurality of series regulators, a voltage corresponding to a magnitude of the discrete value signal outputted from the amplitude calculation section. The plurality of series regulators may include a first series regulator, which is connectable to the amplitude modulation section via the switch, and a second series regulator, which is larger in size than the first series regulator and which is connectable to the amplitude modulation section via the switch. In such a case, when the magnitude of the delta-sigma modulated signal is smaller than a predetermined threshold value, the amplitude amplifying section switches the switch such that the first series regulator and the amplitude modulation section are connected, and when the magnitude of the delta-sigma modulated signal is equal to or greater than the threshold value, the amplitude amplifying section switches the switch such that the second series regulator and the amplitude modulation section are connected.

Alternatively, the amplitude amplifying section may include: one switching regulator for supplying, to the amplitude modulation section, a voltage corresponding to the magnitude of the delta-sigma modulated signal generated by the delta-sigma modulated signal generation section; and another switching regulator for supplying, to said one switching regulator, a voltage corresponding to a magnitude of the discrete value signal outputted from the amplitude calculation section.

Further alternatively, the amplitude amplifying section may include: a plurality of switching regulators for supplying, to the amplitude modulation section, a voltage corresponding to the magnitude of the delta-sigma modulated signal generated by the delta-sigma modulated signal generation section; a switch for switching a connection between the amplitude modulation section and the plurality of switching regulators; and a switching regulator for supplying, to the plurality of switching regulators, a voltage corresponding to a magnitude of the discrete value signal outputted from the amplitude calculation section. The plurality of switching regulators may include a first switching regulator, which is connectable to the amplitude modulation section via the switch, and a second switching regulator, which is larger in size than the first switching regulator and which is connectable to the amplitude modulation section via the switch. In such a case, when the magnitude of the delta-sigma modulated signal is smaller than a predetermined threshold value, the amplitude amplifying section switches the switch such that the first switching regulator and the amplitude modulation section are connected, and when the magnitude of the delta-sigma modulated signal is equal to or greater than the threshold value, the amplitude amplifying section switches the switch such that the second switching regulator and the amplitude modulation section are connected.

The transmission circuit of the present invention may alternatively comprise: a signal generation section for generating, based on the input data, a vector signal comprising an in-phase signal (I signal) and a quadrature-phase signal (Q signal), which are orthogonal to each other, and an amplitude signal representing a magnitude of the vector signal; an amplitude calculation section for performing predetermined arithmetic processing on the amplitude signal, and outputting a resultant signal as a discrete value signal having a plurality of discrete values corresponding to a magnitude of the amplitude signal; a modulation signal generation section for modulating the vector signal in accordance with the discrete value signal, thereby generating a modulation signal; an amplitude amplifying section for outputting a signal corresponding to a magnitude of the discrete value signal; and an amplifier section for amplifying the modulation signal in accordance with the signal outputted from the amplitude amplifying section, and outputting a resultant signal as a transmission signal. The amplitude calculation section retains at least one threshold value and two or more discrete values corresponding to the at least one threshold value; determines at predetermined time periods whether or not the amplitude signal exceeds the at least one threshold value; selects, based on a determination result, a discrete value to be outputted; and outputs the selected discrete value as the discrete value signal.

Preferably, the modulation signal generation section includes: a dividing section for dividing the vector signal by the discrete value signal; a signal processing section for performing predetermined signal processing on the vector signal to quantize the vector signal which has been divided by the dividing section, and outputting a resultant signal as a quantized signal; a vector modulation section for vector-modulating the quantized signal, and outputting a resultant signal as the modulation signal; and a variable gain amplifier section for amplifying the modulation signal outputted from the vector modulation section, by a gain corresponding to the magnitude of the discrete value signal.

Alternatively, the modulation signal generation section may include: a dividing section for dividing the vector signal by the discrete value signal; a signal processing section for performing predetermined signal processing on the divided vector signal to quantize the vector signal, and outputting a resultant signal as a quantized signal; a variable gain amplifier section for amplifying the quantized signal by again corresponding to the magnitude of the discrete value signal; and a vector modulation section for vector-modulating the quantized signal, which has been amplified by the variable gain amplifier section, and outputting a resultant signal as the modulation signal.

Further alternatively, the modulation signal generation section may include: a signal processing section for performing predetermined signal processing on the vector signal to quantize the vector signal, and outputting a resultant signal as a quantized signal; and a vector modulation section for vector-modulating the quantized signal, and outputting a resultant signal as the modulation signal. The signal processing section changes a magnitude of the quantized signal, such that the magnitude of the quantized signal has a same characteristic as that of the magnitude of the discrete value signal.

Preferably, the signal processing section changes the magnitude of the quantized signal so as to be proportional to the magnitude of the discrete value signal.

The signal processing section refers to a look-up table, in which an optimal value is preset, thereby changing the magnitude of the quantized signal in accordance with the magnitude of the discrete value signal.

Preferably, the signal processing section includes: a signal conversion section, to which the divided vector signal is inputted from the dividing section, for converting the inputted vector signal into a signal, which represents a magnitude of the inputted vector signal, and into a standardized vector signal, which is calculated by dividing the inputted vector signal by the signal representing the magnitude of the inputted vector signal; a delta-sigma modulation section for delta-sigma modulating the signal representing the magnitude of the inputted vector signal; and a multiplying section for multiplying the delta-sigma modulated signal by the standardized vector signal, and outputting a resultant signal as the quantized signal.

The signal processing section includes: a vector calculation section to which the divided vector signal is inputted from the dividing section; and a vector quantization section for quantizing an output signal of the vector calculation section, and outputting a resultant signal as the quantized signal. The vector calculation section has: a vector subtraction section for subtracting the quantized signal from the divided vector signal inputted thereto; and a vector integration section for integrating a signal inputted thereto via the vector subtraction section, and outputting a resultant signal.

Preferably, the signal processing section further comprises, at an output of the vector calculation section, at least one vector calculation section.

Preferably, the transmission circuit further comprises a band-pass filter for removing a quantization noise from the transmission signal outputted from the amplifier section.

Alternatively, the transmission circuit may further comprise a low-pass filter for removing a quantization noise from the signal outputted from the amplitude amplifying section.

Here, the predetermined time periods are each shorter than a time period for controlling an output power of the transmission circuit. Preferably, the amplitude calculation section changes a length of the predetermined time periods in accordance with a degree of envelope variation of the transmission signal. To be specific, when a degree of envelope variation of the transmission signal is small, the amplitude calculation section shortens the predetermined time periods, and when the degree of envelope variation of the transmission signal is large, the amplitude calculation section lengthens the predetermined time periods.

Alternatively, the amplitude calculation section may change a length of the predetermined time periods in accordance with a modulation mode of the transmission signal.

Preferably, the transmission circuit further comprises, at an output of the signal generation section, a distortion compensation section for compensating for at least either one of the amplitude signal and the angle-modulated signal so as to suppress at least distortion occurring at the amplitude modulation section.

Alternatively, the transmission circuit further comprises, at an output of the signal generation section, a distortion compensation section for compensating for at least either one of the amplitude signal and the vector signal so as to suppress at least distortion occurring at the amplifier section.

The present invention is also directed to a communication device comprising the above-described transmission circuit. The communication device comprises: the transmission circuit for generating a transmission signal; and an antenna for outputting the transmission signal generated by the transmission circuit. The communication device may further comprise: a reception circuit for processing a reception signal received from the antenna; and an antenna duplexer for outputting the transmission signal generated by the transmission circuit to the antenna, and outputting the reception signal received from the antenna to the reception circuit.

As described above, in the transmission circuit of the present invention, the delta-sigma modulation section delta-sigma modulates the amplitude signal whose envelope variation is small. This allows the quantization noise occurring at the time of performing delta-sigma modulation to be reduced. For this reason, a filter for reducing the quantization noise is not required to have a steep characteristic, and power consumption and a size thereof are reduced. This enables the transmission circuit to be small in size, operate with high efficiency, and output a transmission signal having high linearity.

In the transmission circuit, the amplitude amplifying section, which includes the series regulator and switching regulator, uses characteristics of the series regulator and switching regulator, thereby supplying, to the amplitude modulation section, the voltage corresponding to the magnitude of the delta-sigma modulated signal. This allows the transmission circuit to operate with further improved efficiency and further lowered distortion.

By having the timing control section subsequent to the amplitude calculation section, the transmission circuit is able to eliminate instability of the switching regulator at the time of rising thereof, and operate with further lowered distortion. Further, the amplitude amplifying section adjusts, based on the power information indicating the magnitude of output power, the voltage, which is to be supplied to the amplitude modulation section, to an optimal level for the amplitude modulation section. This allows the transmission circuit to operate with further improved efficiency and further lowered distortion.

Further, in the transmission circuit, the signal processing section quantizes the Iv and Qv signals which have been calculated by multiplying the I and Q signals by the discrete value signal. This allows the quantization noise occurring at the time of performing quantization to be reduced. As a result, a filter for reducing the quantization noise is not required to have a steep characteristic, and power consumption and a size thereof are reduced. This allows the transmission circuit to be small in size, operate with high efficiency, and output a transmission signal having high linearity.

Still further, the transmission circuit of the present invention is able to operate with further lowered distortion by additionally having the distortion compensation section for compensating for at least distortion occurring in the amplitude modulation section or in the amplifier section. Still further, by using the above-described transmission circuit, the communication device of the present invention is able to, regardless of a magnitude of output power thereof, secure precision of a transmission signal and operate with low power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 shows a relationship between the amplitude signal m(t) and a discrete value signal V(t);

FIG. 6A is a block diagram showing an exemplary structure of a series regulator 16a;

FIG. 7A is a block diagram showing an exemplary structure of an amplitude modulation section 18a;

FIG. 8A is a block diagram showing an exemplary structure of a transmission circuit 1a according to the first embodiment of the present invention;

FIG. 8C is a block diagram showing an exemplary structure of a transmission circuit 1c according to the first embodiment of the present invention;

FIG. 10B shows an exemplary timing chart of signals which are handled by the transmission circuit 2a;

FIG. 11D shows an exemplary waveform of the delta-sigma modulated signal D2 outputted from the variable gain amplifier section 15;

FIG. 14C is a block diagram showing an exemplary structure of a transmission circuit 3c according to the third embodiment of the present invention;

FIG. 16A is a block diagram showing an exemplary structure of a signal processing section 44a;

FIG. 22 is a block diagram showing an exemplary structure of a conventional transmission circuit 700;

FIG. 24B is a block diagram showing an exemplary structure of a data conversion section 92.

DESCRIPTION OF THE PREFERRED EMBODIMENTS

First Embodiment

Figure 1:
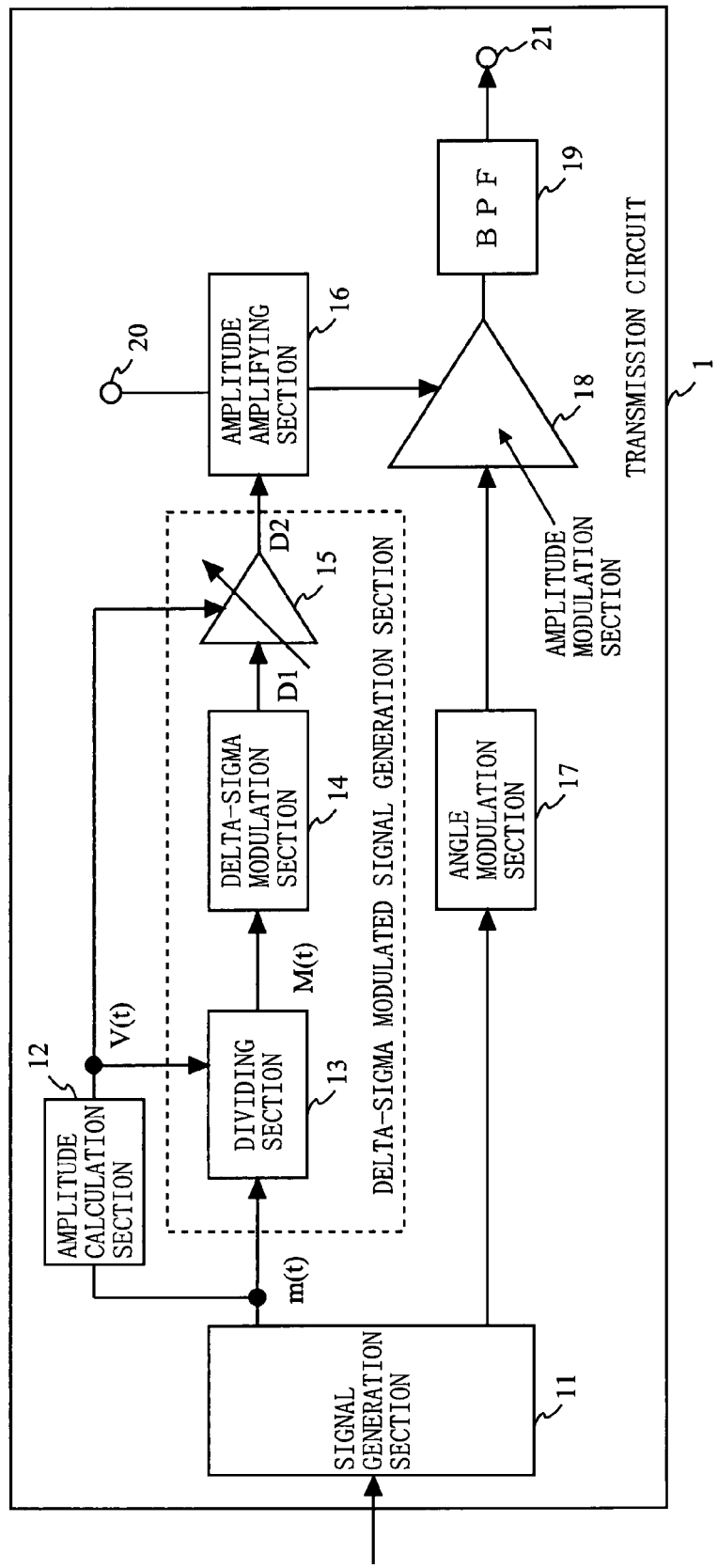
FIG. 1 is a block diagram showing an exemplary structure of a transmission circuit 1 according to a first embodiment of the present invention.

FIG. 1 is a block diagram showing an exemplary structure of a transmission circuit 1 according to a first embodiment of the present invention. As shown in FIG. 1, the transmission circuit 1 comprises a signal generation section 11, amplitude calculation section 12, dividing section 13, delta-sigma modulation section 14, variable gain amplifier section 15, amplitude amplifying section 16, angle modulation section 17, amplitude modulation section 18, band-pass filter (BPF) 19, power supply terminal 20, and an output terminal 21. The signal generation section 11 generates an amplitude signal m(t) and a phase signal respectively based on an amplitude component and phase component which are obtained by performing signal processing on input data. Here, the signal generation section 11 may be referred to as a polar coordinate signal generation section since the signal generation section 11 generates the amplitude signal m(t) and phase signal which are polar coordinate signals.

The amplitude signal m(t) is inputted to the amplitude calculation section 12 and dividing section 13. The amplitude calculation section 12 performs predetermined arithmetic processing on the amplitude signal m(t), and outputs a discrete value signal V(t) having a plurality of discrete values controlled in accordance with a magnitude of the amplitude signal m(t). The amplitude calculation section 12 will be described later in detail. The discrete value signal V(t) is inputted to the dividing section 13 and variable gain amplifier section 15. The dividing section 13 divides the amplitude signal m(t) by the discrete value signal V(t), and outputs a resultant signal as an amplitude signal M(t). Since the amplitude signal M(t) has been divided by the discrete value signal V(t), envelope variation thereof is smaller than that of the amplitude signal m(t). Typically, the amplitude signal M(t) has an envelope of substantially fixed magnitude, regardless of the magnitude of the amplitude signal m(t). Here, the amplitude signal M(t) is representable by the equation below.

$$M(t)=m(t)/V(t) \quad \text{(equation 1)}$$

Figure 2A:
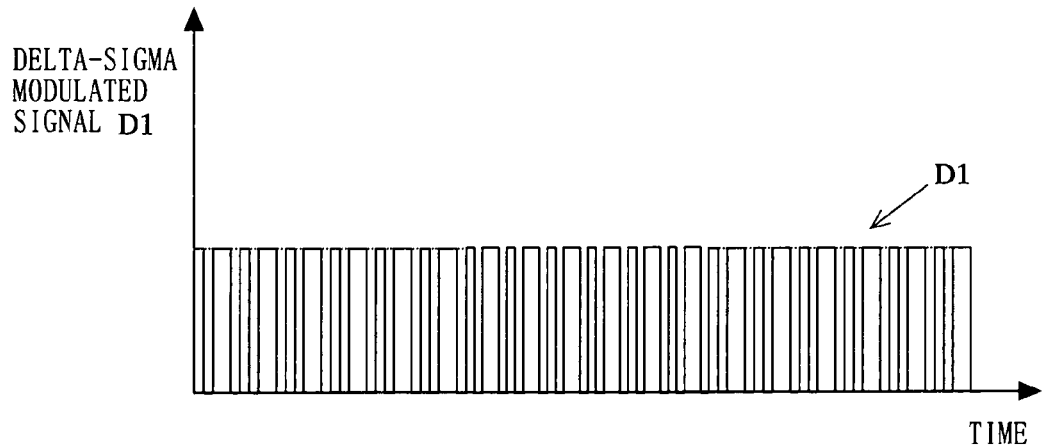
FIG. 2A shows an exemplary waveform of a delta-sigma modulated signal D1 outputted from a delta-sigma modulation section 14.
Figure 2B:
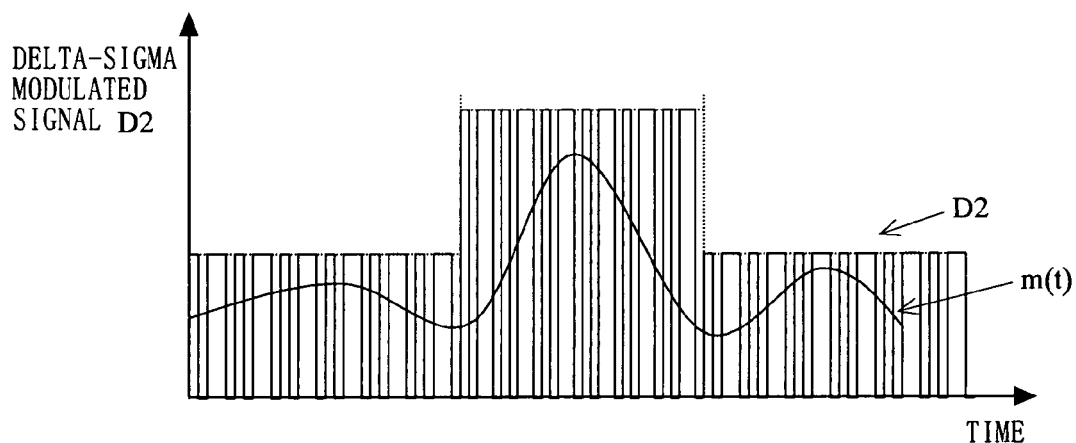
FIG. 2B shows an exemplary waveform of a delta-sigma modulated signal D2 outputted from a variable gain amplifier section 15.

The amplitude signal M(t) is inputted to the delta-sigma modulation section 14. The delta-sigma modulation section 14 delta-sigma modulates the amplitude signal M(t), and outputs a resultant signal as a delta-sigma modulated signal D1 (see FIG. 2A). Since the delta-sigma modulation section 14 delta-sigma modulates the amplitude signal M(t) whose envelope variation is small, quantization noise occurring at the time of performing delta-sigma modulation is limited. The delta-sigma modulated signal D1 is inputted to the variable gain amplifier section 15. The variable gain amplifier section 15 amplifies the delta-sigma modulated signal D1 by a gain corresponding to a magnitude of the discrete value signal V(t), and outputs a resultant signal as a delta-sigma modulated signal D2 (see FIG. 2B). Since the delta-sigma modulated signal D2 has been amplified by the variable gain amplifier section 15, the delta-sigma modulated signal D2 has an envelope whose maximum value varies in accordance with the amplitude signal m(t) as shown in FIG. 2B. The amplitude amplifying section 16 is supplied with a DC voltage from the power supply terminal 20. The amplitude amplifying section 16 supplies, to the amplitude modulation section 18, a voltage corresponding to a magnitude of the delta-sigma modulated signal D2 having been inputted to the amplitude amplifying section 16 via the variable gain amplifier section 15. Typically, the amplitude amplifying section 16 supplies, to the amplitude modulation section 18, a voltage proportional to the magnitude of the inputted delta-sigma modulated signal D2. Here, the amplitude amplifying section 16 may supply, to the amplitude modulation section 18, an electric current proportional to the magnitude of the inputted delta-sigma modulated signal D2.

On the other hand, the phase signal is inputted to the angle modulation section 17. The angle modulation section 17 angle-modulates the phase signal, and outputs a resultant signal as an angle-modulated signal. The angle-modulated signal is inputted to the amplitude modulation section 18. The amplitude modulation section 18 amplitude-modulates the angle-modulated signal by amplifying the angle-modulated signal in accordance with the voltage supplied from the amplitude amplifying section 16, and outputs a resultant signal as a modulation signal having been angle-modulated and amplitude-modulated. The band-pass filter 19 removes quantization noise contained in the modulation signal. The modulation signal whose quantization noise has been removed by the band-pass filter 19 is outputted as a transmission signal from the output terminal 21.

Note that, since the dividing section 13, delta-sigma modulation section 14 and variable gain amplifier section 15 in the transmission circuit 1 are components for generating the delta-sigma modulated signal D2 based on the amplitude signal m(t) and discrete value signal V(t) as shown in FIG. 2B, these sections may be collectively referred to as a delta-sigma modulated signal generation section.

Next, the amplitude calculation section 12 will be described in detail. The amplitude signal m(t) is inputted to the amplitude calculation section 12 from the signal generation section 11. The amplitude calculation section 12 retains at least one threshold value and two or more discrete values corresponding to the at least one threshold value. The amplitude calculation section 12 determines, at predetermined detection time periods T, whether or not a maximum value of the amplitude signal m(t) exceeds the at least one threshold value, and selects, based on a determination result, a discrete value to be outputted. Note that, the amplitude calculation section 12 may determine, at the predetermined detection time periods T, whether or not any one of values contained in the amplitude signal m(t) exceeds the at least one threshold value, and select, based on a determination result, a discrete value to be outputted.

Figure 3:
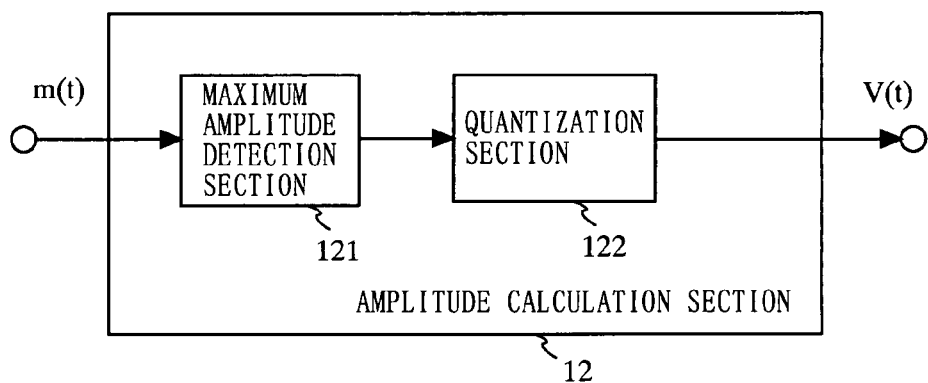
FIG. 3 is a block diagram showing an exemplary structure of an amplitude calculation section 12.
Figure 4A:
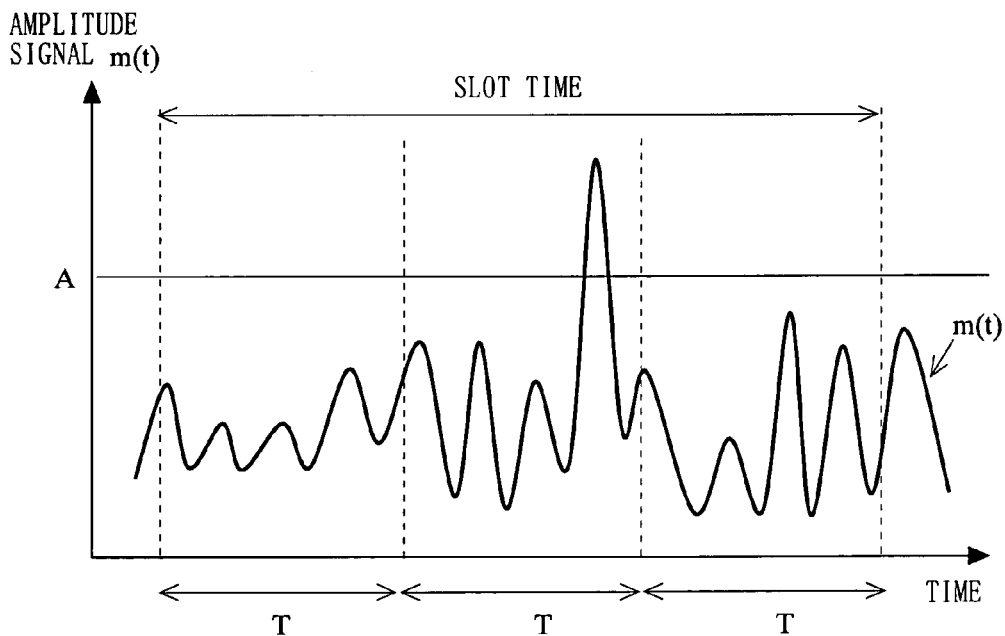
FIG. 4A shows an exemplary waveform of an amplitude signal m(t) inputted to a maximum amplitude detection section 121.

FIG. 3 is a block diagram showing an exemplary structure of the amplitude calculation section 12. As shown in FIG. 3, the amplitude calculation section 12 comprises a maximum amplitude detection section 121 and a quantization section 122. In this case, the amplitude signal m(t) is inputted to the maximum amplitude detection section 121 from the signal generation section 11. The maximum amplitude detection section 121 detects, at the predetermined detection time periods T, the maximum value of the amplitude signal m(t). FIG. 4A shows an exemplary waveform of the amplitude signal m(t) inputted to the maximum amplitude detection section 121. As shown in FIG. 4A, the detection time period T is set to be longer than a symbol time of a waveform of the amplitude signal m(t), and shorter than a time period (hereinafter, referred to as a slot time) for controlling an average output power of the transmission circuit 1. The maximum amplitude detection section 121 detects, at the predetermined time periods T, the maximum value of the amplitude signal m(t) at a sampling point. For example, when the detection time period T is 16 times longer than the symbol time, and a sampling time is 8 times longer than the symbol time, there exist 1024 sampling points in the detection time period T.

Figure 4B:
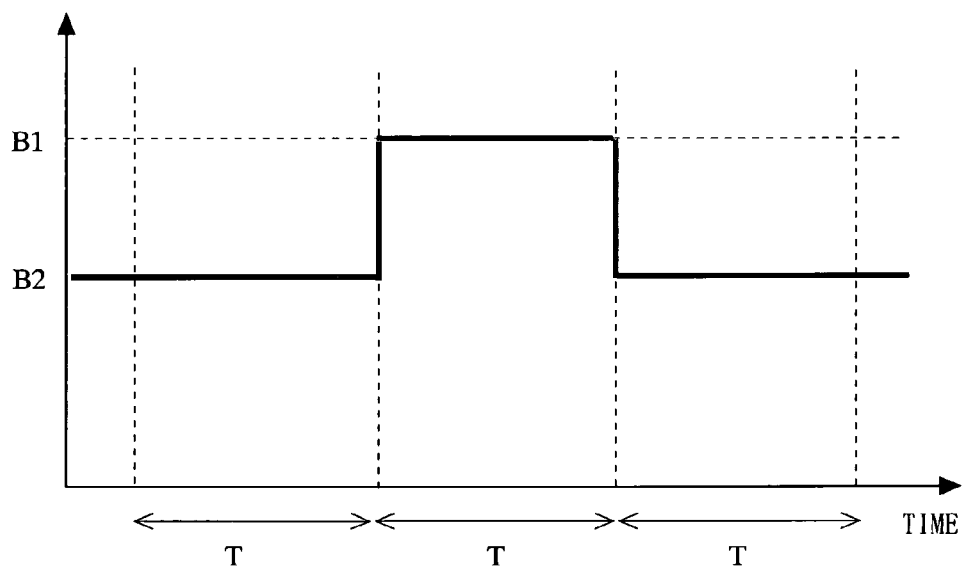
FIG. 4B shows an exemplary waveform of an output signal of a quantization section 122.

The quantization section 122 retains the at least one threshold value and the two or more discrete values corresponding to the at least one threshold value. The quantization section 122 determines whether or not the maximum value of the amplitude signal m(t) exceeds the at least one threshold value, and selects, based on a determination result, a discrete value to be outputted. FIG. 4B shows an exemplary waveform of an output signal from the quantization section 122. In this example, the quantization section 122 retains a threshold value A and two discrete values B1 and B2 corresponding to the threshold value A. Here, B1>B2. As shown in FIG. 4B, the quantization section 122 selects the discrete value B1 and outputs the discrete value B1 as the discrete value signal V(t) when the maximum value of the amplitude signal m(t) exceeds the threshold value A. Also, the quantization section 122 selects the discrete value B2 and outputs the discrete value B2 as the discrete value signal V(t) when the maximum value of the amplitude signal m(t) does not exceed the threshold value A.

In order to provide a simplified description, the above-described example shows that the quantization section 122 sets the single threshold value A, and outputs the two discrete values B1 and B2. However, the quantization section 122 may set two threshold values and output three discrete values, or the quantization section 122 may set more threshold values and output a large number of discrete values.

FIG. 5 shows a relationship between the amplitude signal m(t) and discrete value signal V(t). Here, a dotted line indicates, for reference, a discrete value signal to be outputted when the slot time is used instead of the detection time period T. As shown in FIG. 5, by setting the detection time period T to be shorter than the slot time, the amplitude calculation section 12 is able to output the discrete value signal V(t), which is controlled in accordance with the magnitude of the amplitude signal m(t), at time periods each of which is shorter than the slot time. This allows the transmission circuit 1 to control a power of the transmission signal at the time periods each of which is shorter than the slot time. As a result, power consumption is reduced as compared with a case where the power of the transmission signal is controlled at the slot time.

Hereinafter, the above-described manner of setting the detection time period T for the transmission circuit 1 according to the first embodiment will be further described in detail. As described above, the detection time period T is set to be longer than the symbol time of the waveform of the amplitude signal m(t), and shorter than the slot time. Here, the detection time period T is set in the below-described manner so as to satisfy the above condition. Note that, in the case of a W-CDMA system, the symbol time is set to be 0.26 μs (1/3.84 MHz), and the slot time is set to be 666 μs.

When the detection time period T of the transmission circuit 1 is set to be relatively long while satisfying the condition that the detection time period T is set to be longer than the symbol time of the waveform of the amplitude signal m(t) and shorter than the slot time, a required speed of the amplitude amplifying section 16 is relatively slow. For this reason, when, in particular, the amplitude amplifying section 16 is structured by a switching regulator, the transmission circuit 1 has an advantage of increasing efficiency of the amplitude amplifying section 16. However, when the detection time period T is set to be relatively long, a period, during which a magnitude of an output signal of the amplitude amplifying section 16 is great, is long even though the amplitude signal m(t) is small. This causes an increase in loss of the transmission circuit 1.

On the other hand, when the detection time period T of the transmission circuit 1 is set to be relatively short while satisfying the condition that the detection time period T is set to be longer than the symbol time of the waveform of the amplitude signal m(t) and shorter than the slot time, the output signal of the amplitude amplifying section 16 is controlled precisely in accordance with the magnitude of the amplitude signal m(t). This allows the transmission circuit 1 to have an advantage of reducing the loss thereof. However, when the detection time period T is set to be relatively short, the required speed of the amplitude amplifying section 16 is relatively high, and this causes a decrease in efficiency of the amplitude amplifying section 16. In other words, the detection time period T is set in consideration of a trade-off between the foregoing factors so as to enable the transmission circuit 1 to operate in a most efficient manner.

Figure 6A:
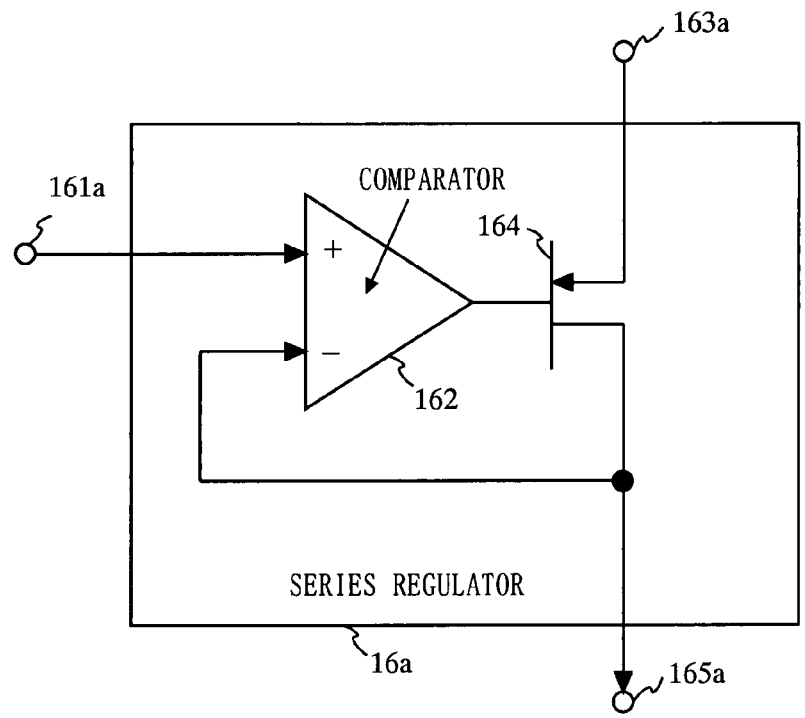

Next, the amplitude amplifying section 16 will be described in detail. For the purpose of stably supplying the voltage to the amplitude modulation section 18, the amplitude amplifying section 16 is structured by, e.g., a series regulator or a switching regulator. FIG. 6A is a block diagram showing an exemplary structure of a series regulator 16a. As shown in FIG. 6A, the series regulator 16a includes an input terminal 161a, comparator 162, power supply terminal 163a, transistor 164, and an output terminal 165a. Here, the transistor 164 is a field effect transistor. The delta-sigma modulated signal D2 is inputted to the input terminal 161a via the variable gain amplifier section 15. The delta-sigma modulated signal D2 is inputted to a gate terminal of the transistor 164 via the comparator 162. A drain terminal of the transistor 164 is supplied with the DC voltage from the power supply terminal 163a.

The transistor 164 outputs, from a source terminal, a voltage proportional to the magnitude of the inputted delta-sigma modulated signal D2. The voltage outputted from the source terminal of the transistor 164 is fed back to the comparator 162. The comparator 162 adjusts, based on the fed-back voltage, the magnitude of the delta-sigma modulated signal D2 to be inputted to the gate terminal of the transistor 164. In the above manner, the series regulator 16a is able to stably supply, from the output terminal 165a, the voltage corresponding to the magnitude of the delta-sigma modulated signal D2. Note that, the same effect as described above is obtained even if the transistor 164 is a bipolar transistor.

Figure 6B:
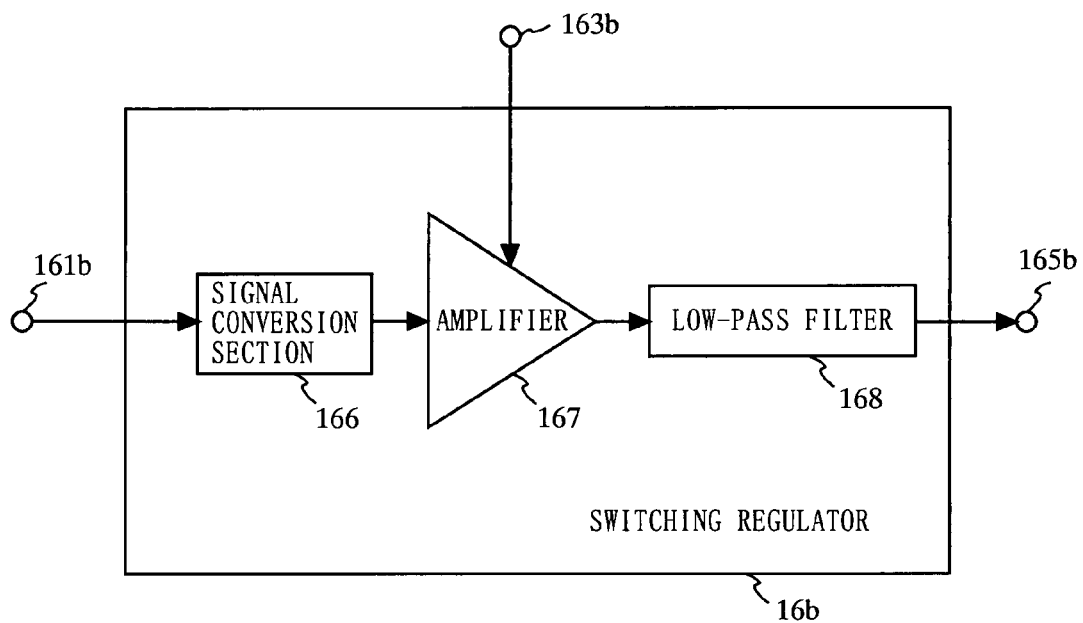
FIG. 6B is a block diagram showing an exemplary structure of a switching regulator 16b.

FIG. 6B is a block diagram showing an exemplary structure of a switching regulator 16b. As shown in FIG. 6B, the switching regulator 16b includes an input terminal 161b, signal converting section 166, power supply terminal 163b, amplifier 167, low-pass filter 168, and an output terminal 165b. The delta-sigma modulated signal D2 is inputted to the input terminal 161b via the variable gain amplifier section 15. The signal converting section 166 converts the delta-sigma modulated signal D2, which is inputted thereto via the input terminal 161b, to a switching signal such as a PWM signal. The switching signal resulting from the conversion by the signal converting section 166 is inputted to the amplifier 167. The amplifier 167 amplifies the inputted switching signal, and outputs a resultant signal. Note that, the amplifier 167 is supplied with the DC voltage from the power supply terminal 163b. Also, for the amplifier 167, a high-efficiency switching amplifier such as a D-class amplifier is used.

The signal outputted by the amplifier 167 is inputted to the low-pass filter 168. The low-pass filter 168 removes, from the signal outputted from the amplifier 167, spurious components such as quantization noise and switching noise. The signal, from which the spurious components have been removed by the low-pass filter 168, is outputted from the output terminal 165b as the voltage corresponding to the magnitude of the delta-sigma modulated signal D2. Here, the switching regulator 16b may feed back the signal, which is outputted from the low-pass filter 168, to the signal converting section 166 so as to stabilize the voltage to be outputted.

Figure 6C:
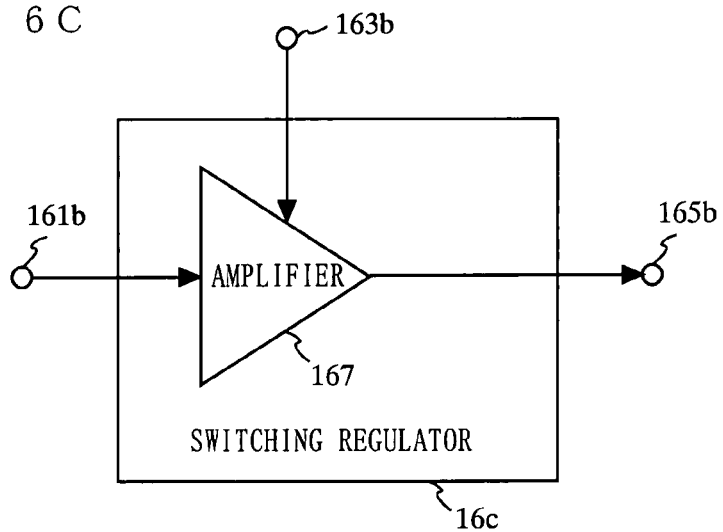
FIG. 6C is a block diagram showing an exemplary structure of a switching regulator 16c.

Further, since the delta-sigma modulated signal D2 inputted to the switching regulator has a magnitude discretely varying as shown in FIG. 2B, the switching regulator may be structured in a same manner as that of a switching regulator 16c shown in FIG. 6C. FIG. 6C is a block diagram showing an exemplary structure of the switching regulator 16c. As shown in FIG. 6C, the switching regulator 16c is different from the switching regulator 16b of FIG. 6B in that the switching regulator 16c does not have the signal converting section 166 and low-pass filter 168. The amplifier 167 amplifies the delta-sigma modulated signal D2, which is inputted thereto via the input terminal 161b, and outputs a resultant signal. For the amplifier 167, a high-efficiency switching amplifier such as a D-class amplifier is used.

Figure 6D:
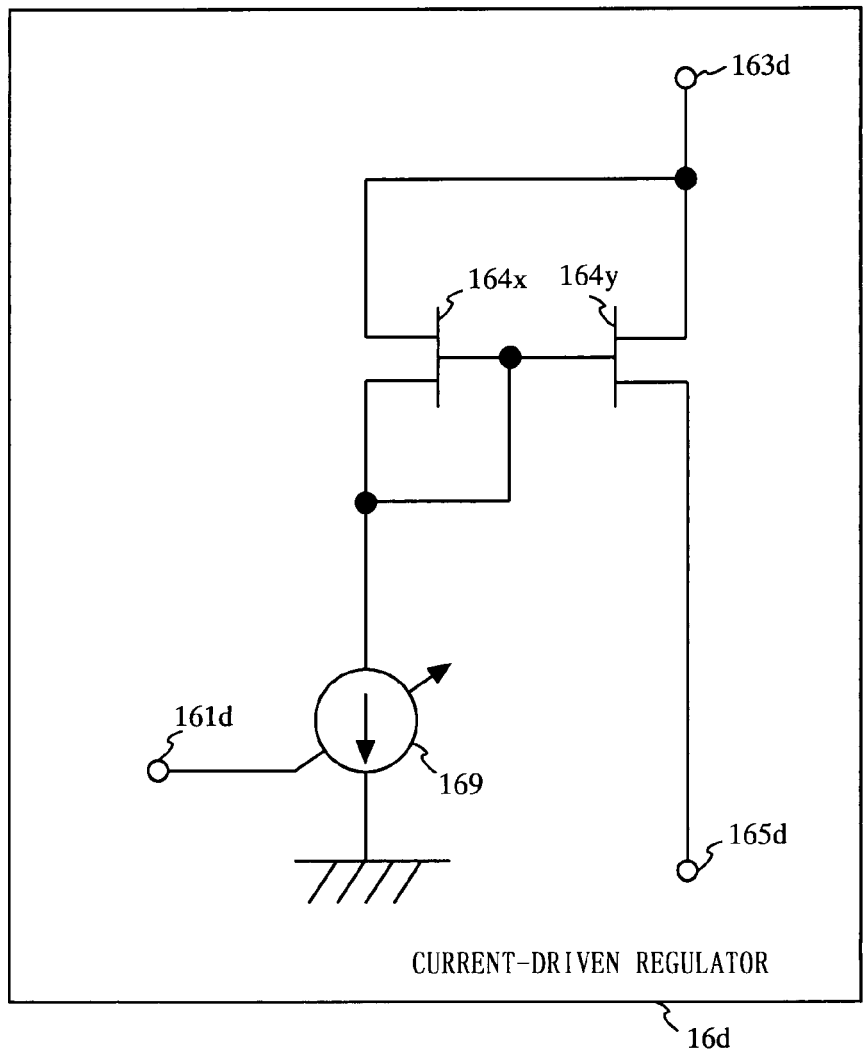
FIG. 6D is a block diagram showing an exemplary structure of a current-driven regulator 16d.

The amplitude amplifying section 16 may be structured by a current-driven regulator. FIG. 6D is a block diagram showing an exemplary structure of a current-driven regulator 16d. As shown in FIG. 6D, the current-driven regulator 16d includes an input terminal 161d, power supply terminal 163d, variable current source 169, transistor 164x, transistor 164y, and an output terminal 165d. The delta-sigma modulated signal D2 is inputted to the input terminal 161d from the variable gain amplifier section 15. The DC voltage is supplied to the power supply terminal 163d. The delta-sigma modulated signal D2 inputted via the input terminal 161d is outputted, as an electric current corresponding to the magnitude of the delta-sigma modulated signal D2, from the output terminal 165d via the variable current source 169, transistor 164x and transistor 164y. The above-described current-driven regulator 16d is useful when the amplitude modulation section 18 is structured by a bipolar transistor. Note that, the same effect is obtained whether the transistors 164x and 164y are field effect transistors or bipolar transistors.

Figure 7A:
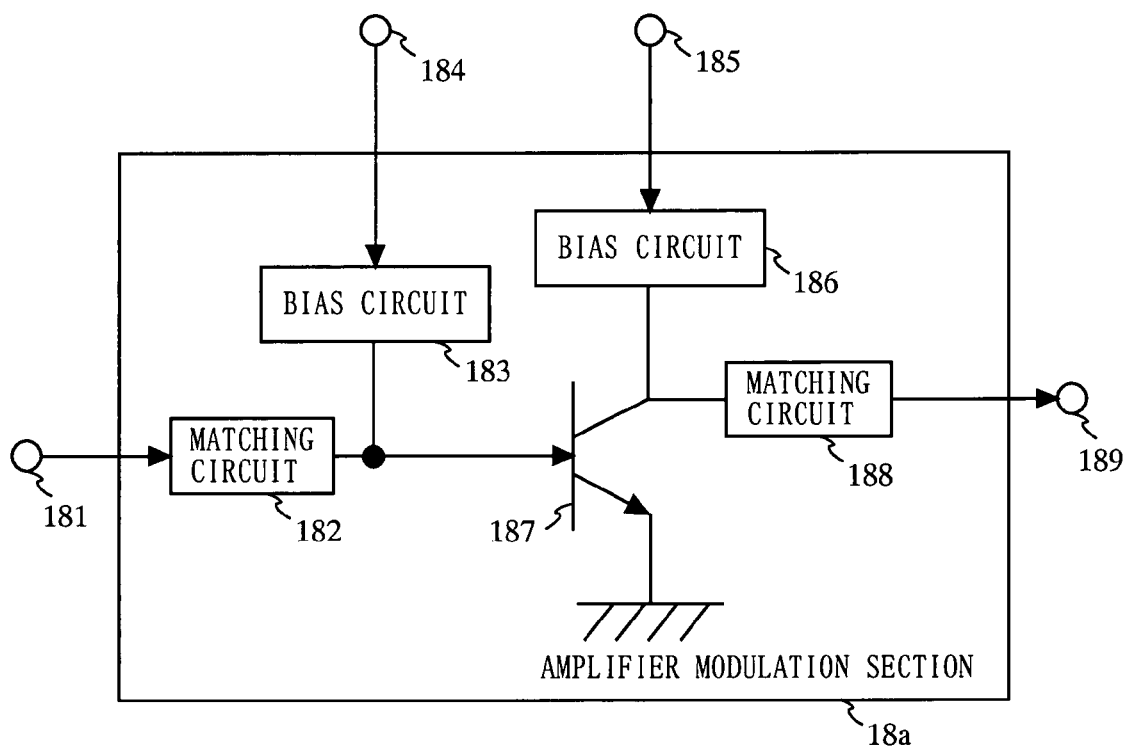

FIG. 7A is a block diagram showing an exemplary structure of the amplitude modulation section 18. In FIG. 7A, the amplitude modulation section 18 includes an input terminal 181, matching circuit 182, bias circuit 183, power supply terminal 184, power supply terminal 185, bias circuit 186, transistor 187, matching circuit 188, and an output terminal 189. Here, the transistor 187 is a bipolar transistor. The angle-modulated signal is inputted to the input terminal 181 from the angle modulation section 17. The angle-modulated signal is inputted to a base terminal of the transistor 187 via the matching circuit 182.

Here, a DC voltage is applied to the power supply terminal 184. In other words, the base terminal of the transistor 187 is supplied with a bias voltage via the power supply terminal 184 and bias circuit 183. The power supply terminal 185 is supplied with the voltage, which corresponds to the magnitude of the delta-sigma modulated signal D2, from the amplitude amplifying section 16. The voltage corresponding to the magnitude of the delta-sigma modulated signal D2 is supplied to a collector terminal of the transistor 187 via the bias circuit 186. The transistor 187 amplifies the angle-modulated signal by the voltage corresponding to the magnitude of the delta-sigma modulated signal D2, and outputs a resultant signal as the modulation signal.

The modulation signal outputted from the transistor 187 is outputted as a transmission signal from the output terminal 189 via the matching circuit 188. Note that, even if the transistor 187 is a field effect transistor, the same effect as that obtained in the case where the transistor 187 is a bipolar transistor is obtained. Further, in the amplitude modulation section 18*a*, the voltage inputted to the power supply terminal 184 and the voltage inputted to the power supply terminal 185 may be switched with each other. The same effect is obtained also in this case. When the amplitude amplifying section 16 is structured by the current-driven regulator 16*d*, the electric current corresponding to the magnitude of the delta-sigma modulated signal D2 is inputted from the current-driven regulator 16*d* to the power supply terminal 185. In this case, the electric current corresponding to the magnitude of the delta-sigma modulated signal D2 is inputted to the collector terminal of the transistor 187 via the bias circuit 186. The transistor 187 amplifies the angle-modulated signal by the electric current corresponding to the magnitude of the delta-sigma modulated signal D2, and outputs a resultant signal.

Figure 7B:
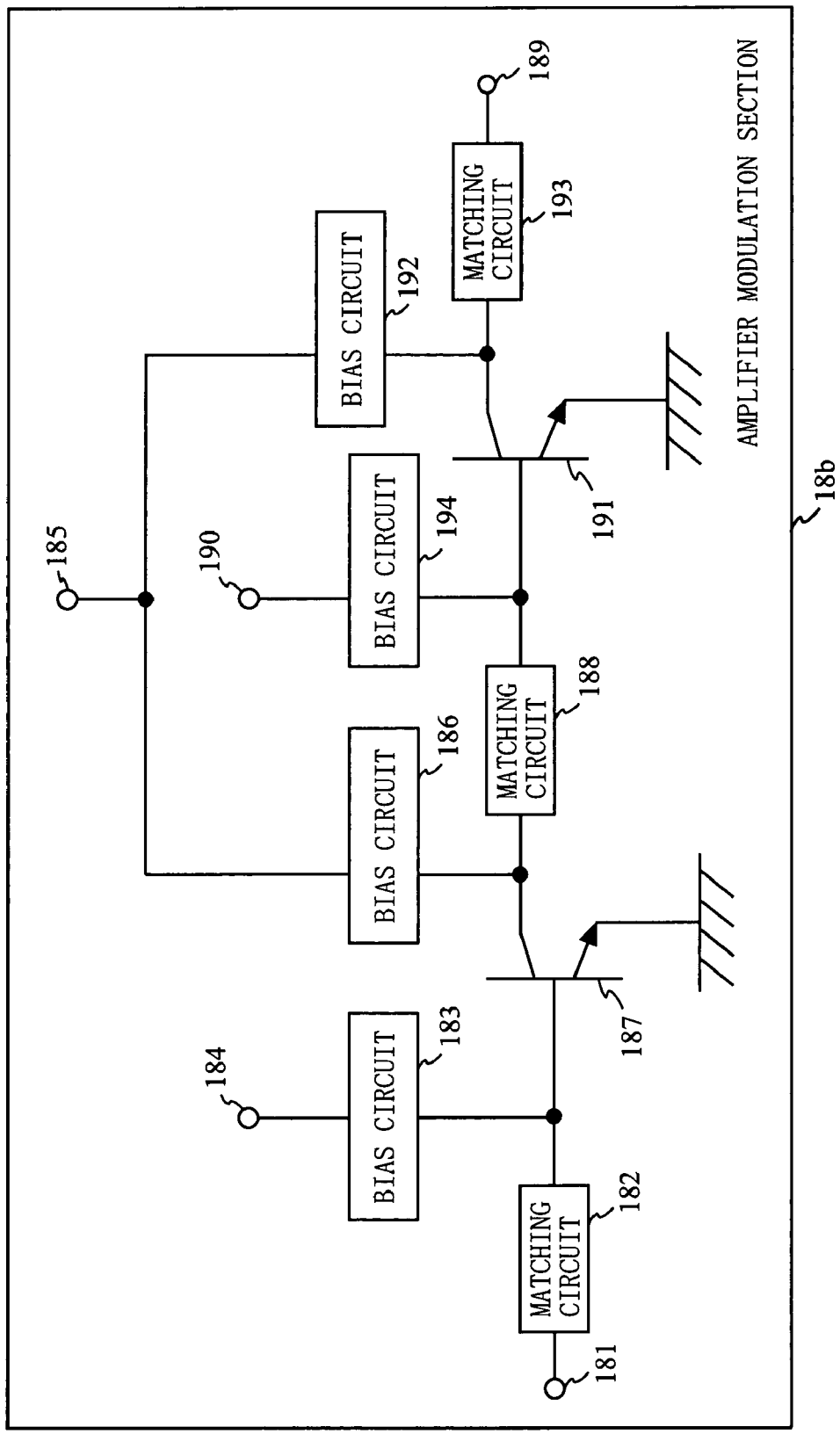
FIG. 7B is a block diagram showing an exemplary structure of an amplitude modulation section 18b.

The amplitude modulation section 18 may have a different structure from that of the above-described amplitude modulation section 18*a*. FIG. 7B is a block diagram showing an exemplary structure of an amplitude modulation section 18*b*. Fundamentally, the amplitude modulation section 18*b* is, as shown in FIG. 7B, structured by serially connecting two amplitude modulation sections 18*a*. Here, the transistor 187 and a transistor 191 are bipolar transistors. The base terminal of the transistor 187 is supplied with the bias voltage from the power supply terminal 184 via the bias circuit 183. A base terminal of the transistor 191 is supplied with a bias voltage from a power supply terminal 190 via a bias circuit 194.

The collector terminal of the transistor 187 is supplied with the voltage, which corresponds to the magnitude of the delta-sigma modulated signal D2, from the amplitude amplifying section 16 via the power supply terminal 185 and bias circuit 186. Also, a collector terminal of the transistor 191 is supplied with the voltage, which corresponds to the magnitude of the delta-sigma modulated signal D2, from the amplitude amplifying section 16 via the power supply terminal 185 and a bias circuit 192. The above-described structure allows the amplitude modulation section 18*b* to output the modulation signal which has a greater dynamic range than that of the modulation signal of the amplitude modulation section 18*a* shown in FIG. 7A. Note that, the same effect as that obtained in the case where the transistor 187 and transistor 191 are bipolar transistors are obtained even if the transistor 187 and transistor 191 are field effect transistors. Further, the voltages respectively supplied to the two bias circuits 186 and 192 are not necessarily identical. To be specific, a voltage supplied to one of the bias circuits may be a fixed voltage, and a voltage supplied to the other of the bias circuits may be the voltage corresponding to the magnitude of the delta-sigma modulated signal D2.

The above-described transmission circuit 1 may not comprise the band-pass filter 19 in the case where the output signal of the amplitude modulation section 18 does not significantly contain quantization noise. Further, the transmission circuit 1 may be structured, in a similar manner as that of a transmission circuit 1*a* shown in FIG. 8A, so as to have, instead of the band-pass filter 19, a low-pass filter (LPF) 19*a* between the amplitude amplifying section 16 and amplitude modulation section 18. FIG. 8A is a block diagram showing an exemplary structure of the transmission circuit 1a according to the first embodiment of the present invention. In FIG. 8A, the low-pass filter 19*a* removes quantization noise from the signal outputted from the amplitude amplifying section 16. Note that, although not shown, the transmission circuit 1 may have a structure in which the low-pass filter 19*a* is provided between the delta-sigma modulated signal generation section and the amplitude amplifying section 16. In this case, the low-pass filter 19*a* removes quantization noise from the delta-sigma modulated signal outputted from the delta-sigma modulated signal generation section.

Hereinafter, the difference between the transmission circuit 1 shown in FIG. 1 and the transmission circuit 1*a* shown in FIG. 8A will be further described in detail. In the case where the band-pass filter 19 is provided subsequent to the amplitude modulation section 18 as shown in FIG. 1, the band-pass filter 19 is required to control a pass band frequency in accordance with a frequency of the modulation signal. On the other hand, in the case where the low-pass filter 19*a* is provided prior to the amplitude modulation section 18 as shown in FIG. 8A, the low-pass filter 19*a* is not required to control the pass band frequency in accordance with the frequency of the modulation signal. In other words, quantization noise can be removed more easily when the low-pass filter 19*a* is provided prior to the amplitude modulation section 18.

However, when the low-pass filter 19*a* is provided prior to the amplitude modulation section 18 as shown in FIG. 8A, the amplitude modulation section 18 is required to linearly perform amplitude modulation by using a signal inputted via the low-pass filter 19*a*, and the amplitude modulation section 18 is required to have high linearity. On the other hand, when the band-pass filter 19 is provided subsequent to the amplitude modulation section 18 as shown in FIG. 1, a signal discretely changing a magnitude thereof is inputted from the amplitude amplifying section 16 to the amplitude modulation section 18. As a result, a required level of linearity of the amplitude modulation section 18 is lowered. It is necessary to design the transmission circuit in consideration of the above-described pros and cons.

Figure 8B:
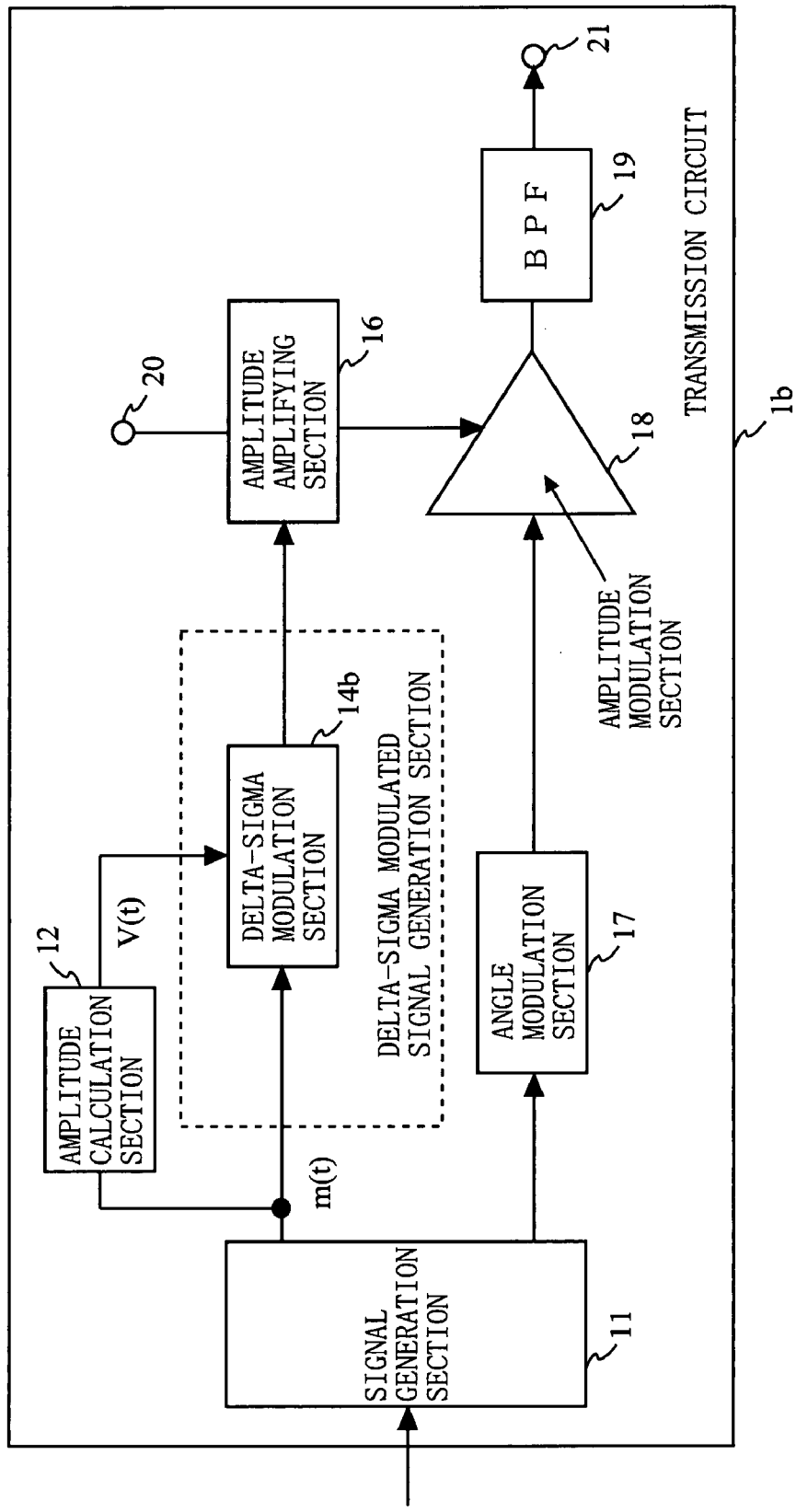
FIG. 8B is a block diagram showing an exemplary structure of a transmission circuit 1b according to the first embodiment of the present invention.

The above-described transmission circuit 1 may have a structure in which the delta-sigma modulated signal generation section is differently structured in a similar manner to that of a transmission circuit 1*b* shown in FIG. 8B. FIG. 8B is a block diagram showing an exemplary structure of the transmission circuit 1*b* according to the first embodiment of the present invention. As shown in FIG. 8B, the transmission circuit 1*b* comprises the signal generation section 11, the amplitude calculation section 12, a delta-sigma modulation section 14*b*, the amplitude amplifying section 16, the angle modulation section 17, the amplitude modulation section 18, the band-pass filter 19, the power supply terminal 20, and the output terminal 121. The delta-sigma modulated signal generation section includes the delta-sigma modulation section 14*b*. The amplitude signal m(t) and discrete value signal V(t) are inputted to the delta-sigma modulation section 14*b*.

The delta-sigma modulation section 14*b* changes a magnitude of a delta-sigma modulated signal to be outputted, such that the magnitude of the delta-sigma modulated signal has a same characteristic as that of the magnitude of the discrete value signal V(t). Typically, the delta-sigma modulation section 14*b* changes the magnitude of the delta-sigma modulated signal to be outputted, so as to be proportional to the magnitude of the discrete value signal V(t). To be specific, the delta-sigma modulation section 14*b* calculates the magnitude of the delta-sigma modulated signal to be outputted, by, e.g., referring to a look-up table in which an optimal value is preset, or performing predetermined arithmetic processing in accordance with the discrete value signal V(t). This enables the delta-sigma modulated signal generation section to output such a delta-sigma modulated signal as shown in FIG. 2B. Conceivable specific examples for changing the magnitude of the delta-sigma modulated signal to be outputted are as follows: in the case where the discrete value signal V(t) is small in magnitude, a quantizer included in the delta-sigma modulation section 14*b* outputs '1' when an input thereto is '1' or greater, and outputs '0' when the input thereto is less than '1';

and in the case where the discrete value signal V(t) is large in magnitude, the quantizer included in the delta-sigma modulation section 14b outputs "2" when the input thereto is '2' or greater, and outputs "0" when the input thereto is less than '2'.

Figure 8D:
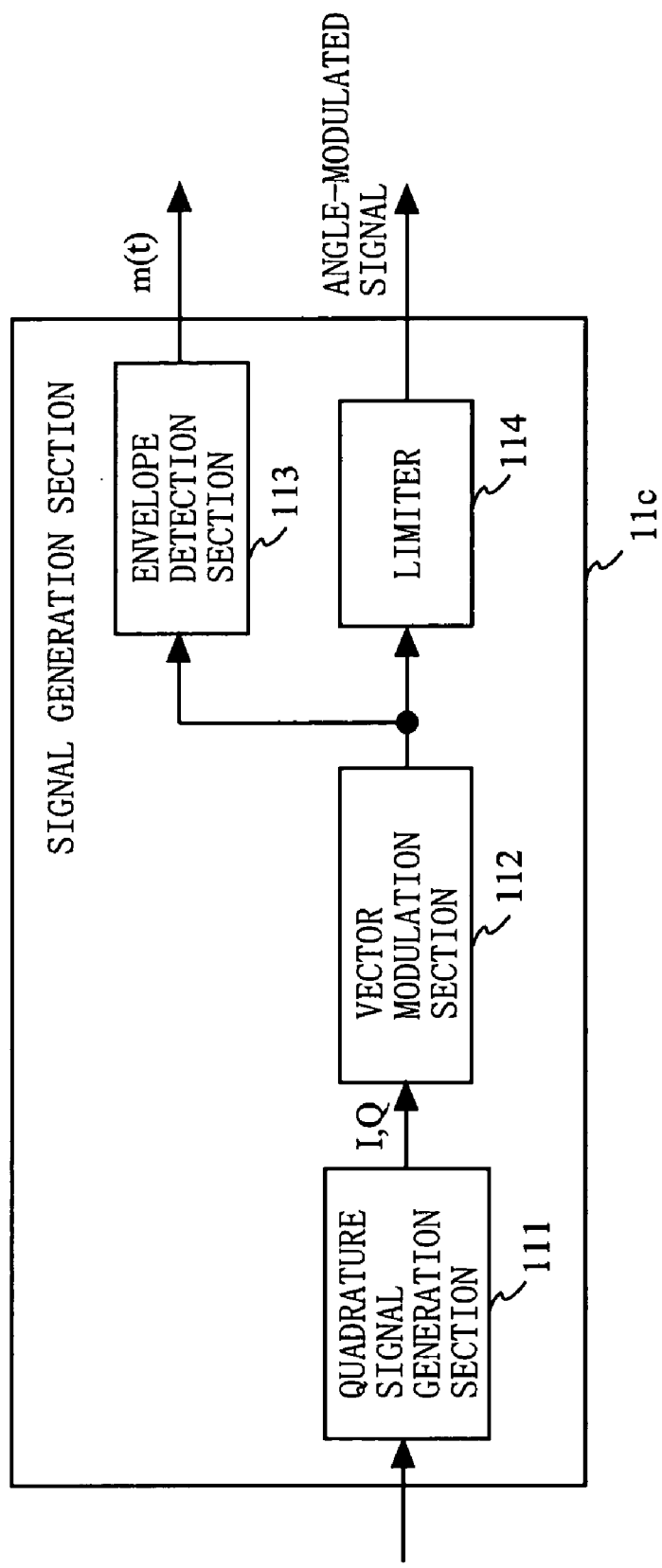
FIG. 8D is a block diagram showing an exemplary structure of a signal generation section 11c.

Still further, the above-described transmission circuit 1 may have a similar structure to that of a transmission circuit 1c shown in FIG. 8C in which the signal generation section 11c, instead of the angle modulation section, generates the angle-modulated signal. FIG. 8C is a block diagram showing an exemplary structure of the transmission circuit 1c according to the first embodiment of the present invention. In FIG. 8C, the signal generation section 11c performs predetermined signal processing on the input data to generate the amplitude signal m(t) and angle-modulated signal. FIG. 8D is a block diagram showing an exemplary structure of the signal generation section 11c. As shown in FIG. 8D, the signal generation section 11c includes a quadrature signal generation section 111, vector modulation section 112, envelope detection section 113 and a limiter 114. The quadrature signal generation section 111 performs signal processing on the input data to generate a vector signal comprising I and Q signals which are orthogonal to each other. The vector signal is inputted to the vector modulation section 112.

The vector modulation section 112 vector-modulates the vector signal. For the vector modulation section 112, a quadrature modulator is used, for example. A resultant signal outputted from the vector modulation section 112 is inputted to the envelope detection section 113 and limiter 114. The envelope detection section 113 detects an envelope component of the signal outputted from the vector modulation section 112, and outputs the detected envelope component as the amplitude signal m(t). The limiter 114 limits, to a particular magnitude, the envelope component of the signal outputted from the vector modulation section 112, and outputs the signal, whose envelope component has been limited in magnitude, as the angle-modulated signal. Operations performed thereafter are the same as those of the transmission circuit 1.

As described above, in the transmission circuit 1 according to the first embodiment of the present invention, the delta-sigma modulation section 14 delta-sigma modulates the amplitude signal M(t) whose envelope variation is small. This allows the quantization noise occurring at the time of performing delta-sigma modulation to be reduced. For this reason, a filter for reducing the quantization noise is not required to have a steep characteristic, and power consumption and a size thereof are reduced. This enables the transmission circuit 1 to be small in size, operate with high efficiency, and output a transmission signal having high linearity.

Second Embodiment

Figure 9:
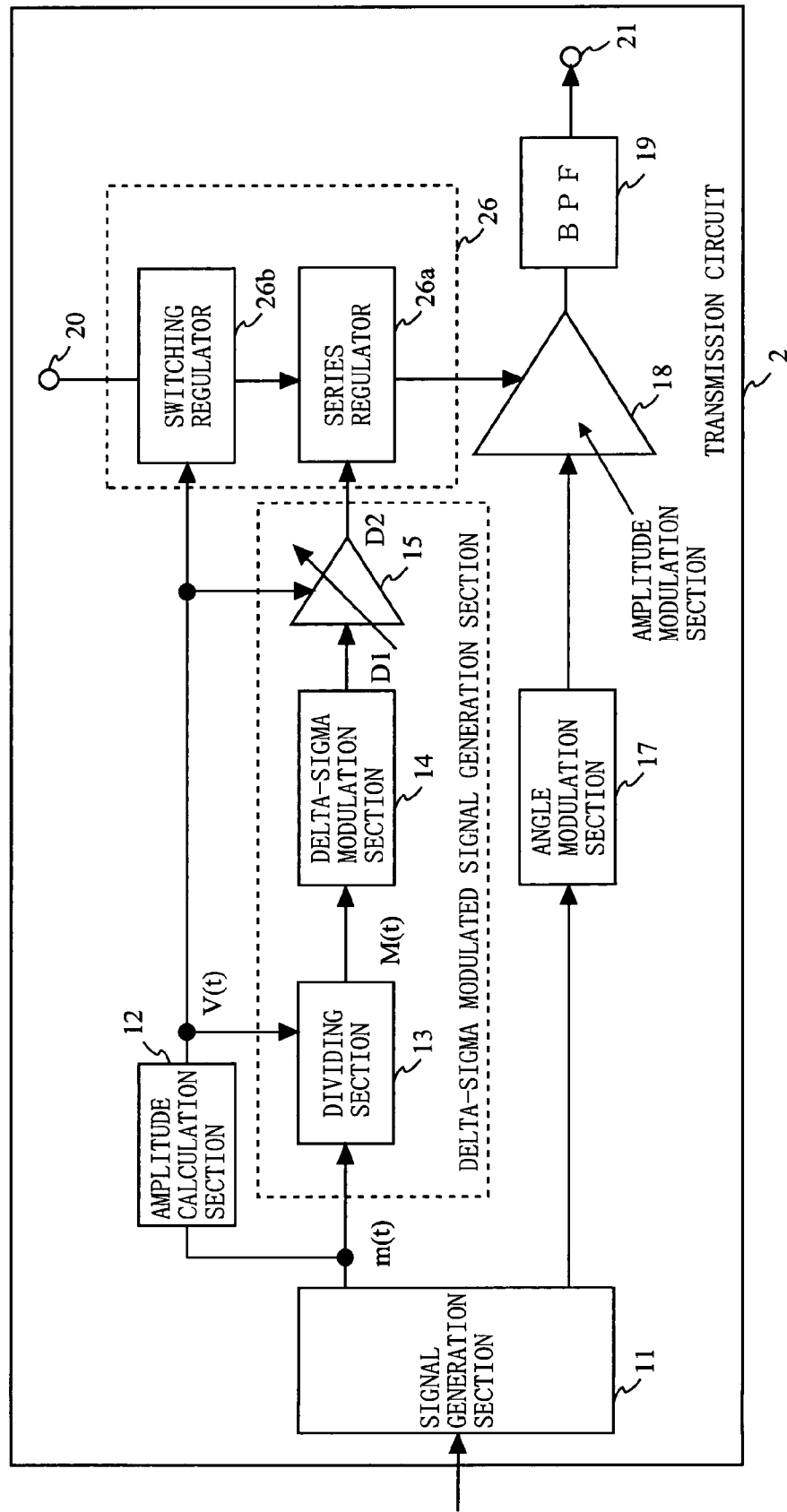
FIG. 9 is a block diagram showing an exemplary structure of a transmission circuit 2 according to a second embodiment of the present invention.

FIG. 9 is a block diagram showing an exemplary structure of a transmission circuit 2 according to a second embodiment of the present invention. As shown in FIG. 9, the transmission circuit 2 comprises the signal generation section 11, the amplitude calculation section 12, the dividing section 13, the delta-sigma modulation section 14, the variable gain amplifier section 15, an amplitude amplifying section 26, the angle modulation section 17, the amplitude modulation section 18, the band-pass filter 19, the power supply terminal 20, and the output terminal 21. The transmission circuit 2 is different from the transmission circuit 1 of the first embodiment in that the amplitude amplifying section 26 has a different structure from that of the amplitude amplifying section 16. The amplitude amplifying section 26 includes a series regulator 26a and switching regulator 26b. Note that, components of the transmission circuit 2, which are identical to those of the transmission circuit 1, are denoted by the same reference numerals as those used for the transmission circuit 1, and descriptions thereof will be omitted.

The discrete value signal V(t) is inputted to the switching regulator 26b from the amplitude calculation section 12. The switching regulator 26b is supplied with the DC voltage from the power supply terminal 20. The switching regulator 26b supplies, to the series regulator 26a, a voltage corresponding to the magnitude of the discrete value signal V(t). The delta-sigma modulated signal D2 is inputted to the series regulator 26a from the variable gain amplifier section 15. The series regulator 26a amplifies the inputted delta-sigma modulated signal D2 by using the voltage supplied from the switching regulator 26b, thereby supplying the voltage corresponding to the magnitude of the delta-sigma modulated signal D2 to the amplitude modulation section 18.

The series regulator 26a is able to operate with high efficiency since the voltage supplied from the switching regulator 26b is controlled in accordance with the magnitude of the discrete value signal V(t). The series regulator 26a may be structured in the same manner as that of the series regulator 16a shown in FIG. 6A. The switching regulator 26b may be structured in the same manner as that of the switching regulator 16b shown in FIG. 6B, or the switching regulator 16c shown in FIG. 6C. Further, the above-described amplitude amplifying section 26 is applicable to all the transmission circuits shown in FIGS. 8A, 8B and 8C.

Figure 10A:
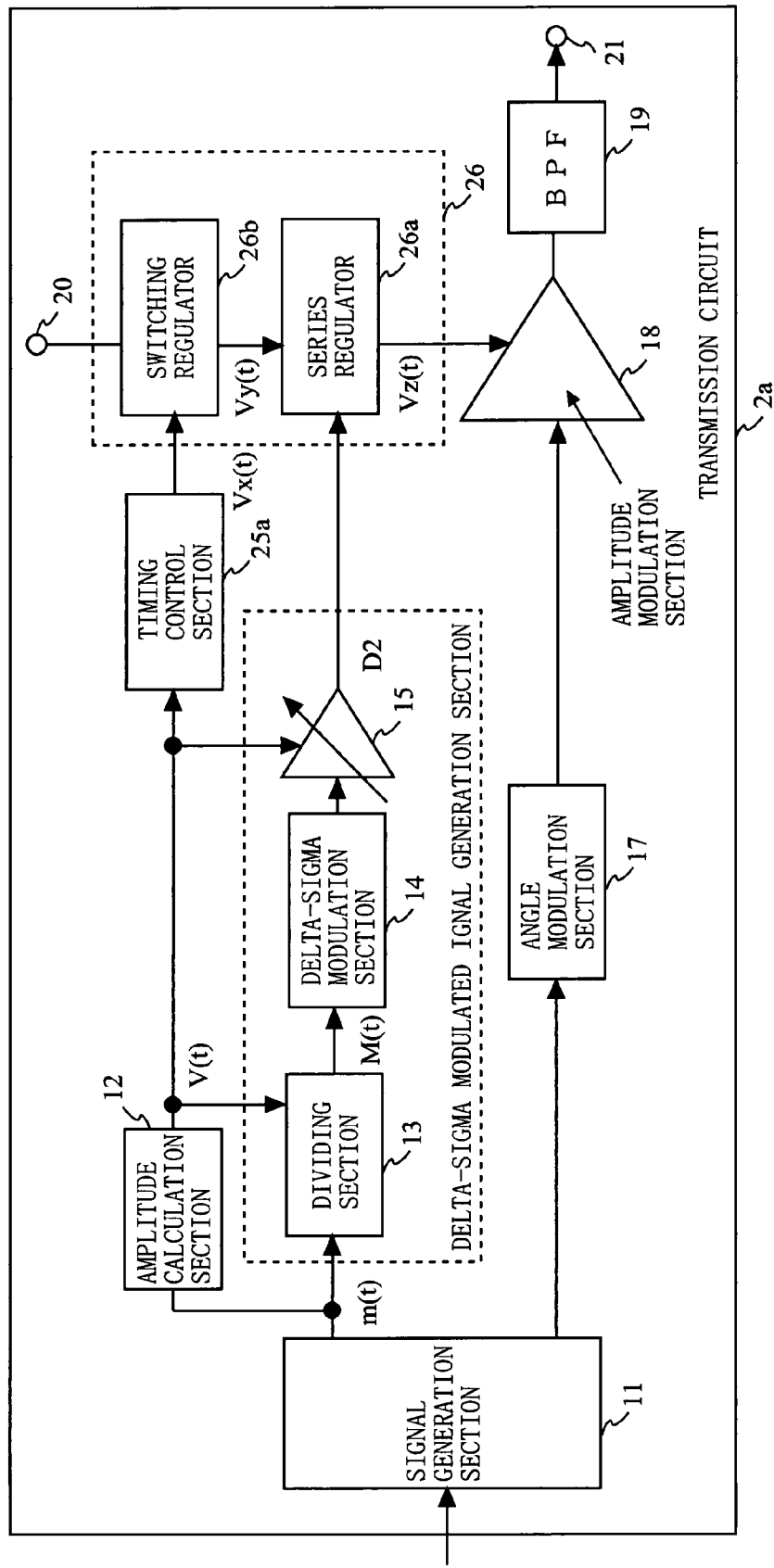
FIG. 10A is a block diagram showing an exemplary structure of a transmission circuit 2a according to the second embodiment of the present invention.

Further, similarly to a transmission circuit 2a shown in FIG. 10A, the transmission circuit 2 may further comprise a timing control section 25a. FIG. 10A is a block diagram showing an exemplary structure of the transmission circuit 2a according to the second embodiment of the present invention. In FIG. 10A, the timing control section 25a is connected between the amplitude calculation section 12 and switching regulator 26b. The timing control section 25a controls, so as to compensate for rising of the switching regulator 26b, a timing of inputting, to the switching regulator 26b, the discrete value signal V(t) outputted from the amplitude calculation section 12.

Figure 10B:
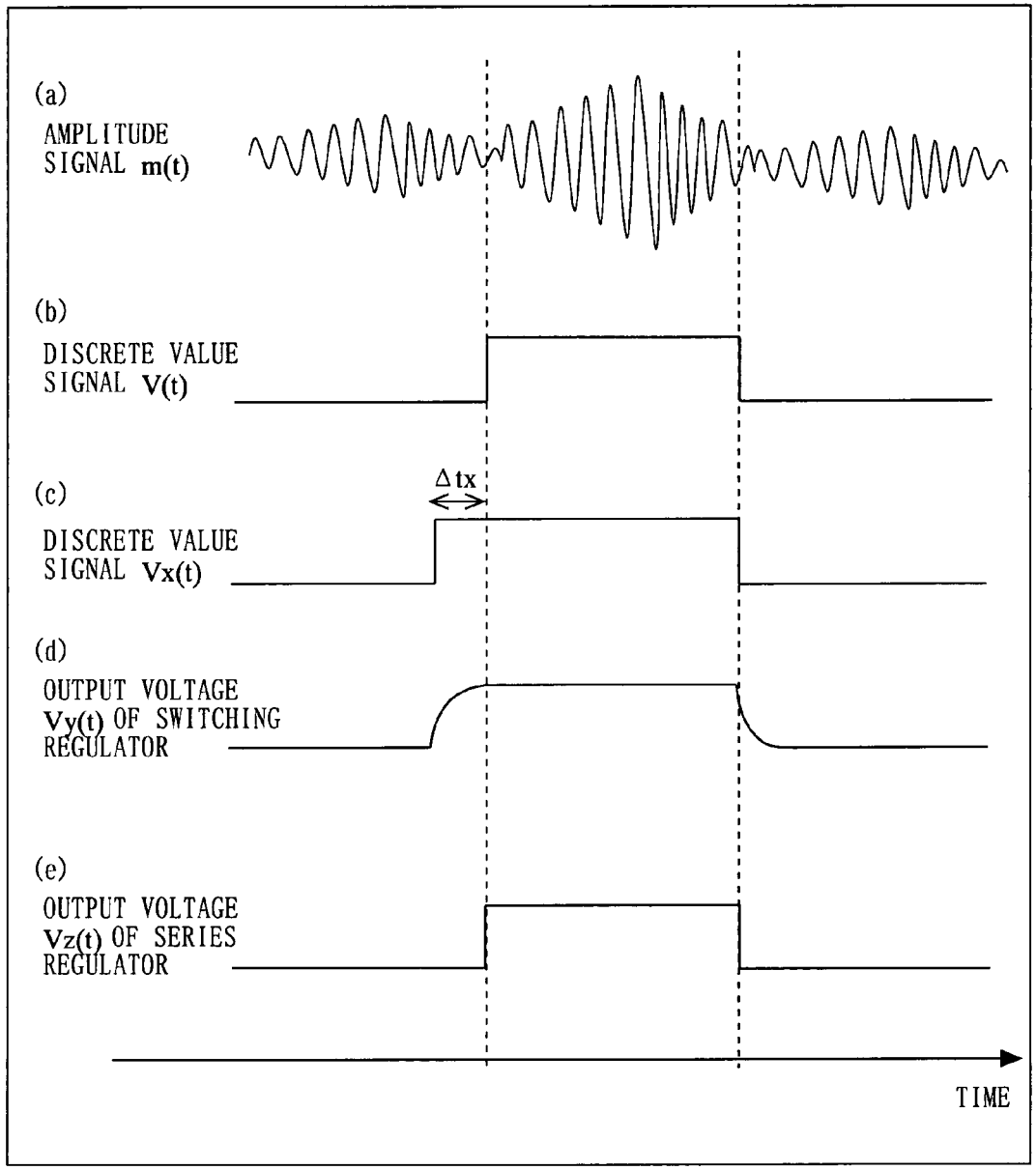

FIG. 10B shows an exemplary timing chart of signals which are handled by the transmission circuit 2a. Hereinafter, operations of the transmission circuit 2a will be described with reference to FIG. 10B. The amplitude signal m(t) is inputted to the amplitude calculation section 12 from the signal generation section 11 (see FIG. 10B(a)). The amplitude calculation section 12 performs the same processing as that of the first embodiment, and outputs the discrete value signal V(t) (see FIG. 10B(b)). The discrete value signal V(t) is inputted to the timing control section 25a.

In order to compensate for the rising of the switching regulator 26b, the timing control section 25a advances a timing of outputting the discrete value signal V(t) by Δtx, and outputs the signal as a discrete value signal Vx(t) (see FIG. 10B(c)). The discrete value signal Vx(t) is inputted to the switching regulator 26b. The switching regulator 26b supplies, to the series regulator 26a, a voltage Vy(t) corresponding to the magnitude of the discrete value signal Vx(t) (see FIG. 10B(d)). The series regulator 26a supplies, to the amplitude modulation section 18, a voltage Vz(t) corresponding to the magnitude of the delta-sigma modulated signal D2 (see FIG. 10B(e)).

As described above, by having the timing control section 25a between the amplitude calculation section 12 and switching regulator 26b, the transmission circuit 2a is able to eliminate instability of the switching regulator 26b at the time of rising thereof, and operate with further lowered distortion.

Note that, instead of advancing the timing of outputting the discrete value signal V(t) by Δtx, the timing control section 25a may cause the signal generation section 11 to delay, by Δtx, the output of the amplitude signal m(t) to the dividing section 13 and the output of the phase signal to the angle modulation section 17.

Figure 11A:
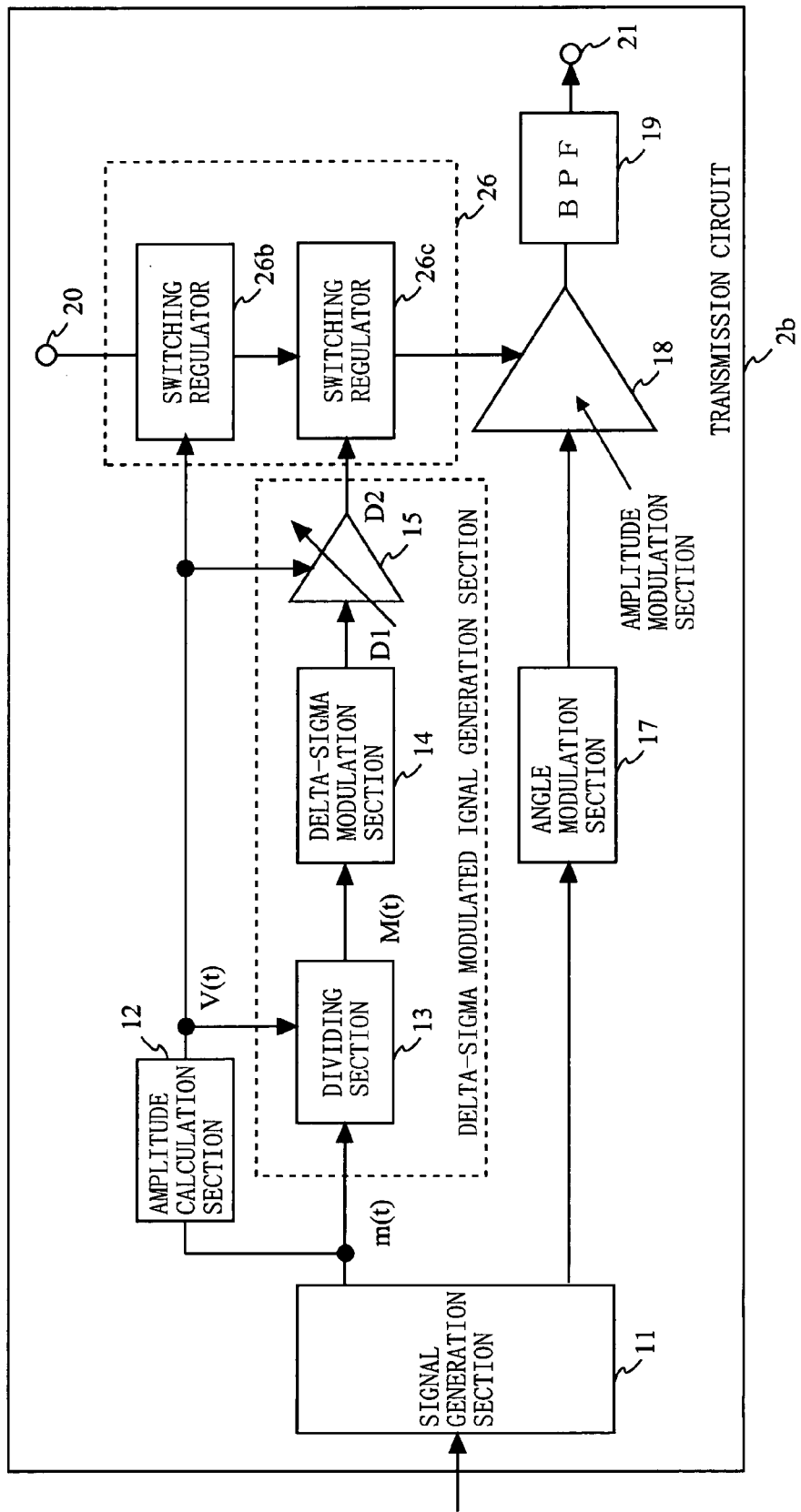
FIG. 11A is a block diagram showing an exemplary structure of a transmission circuit 2b according to the second embodiment of the present invention.
Figure 11B:
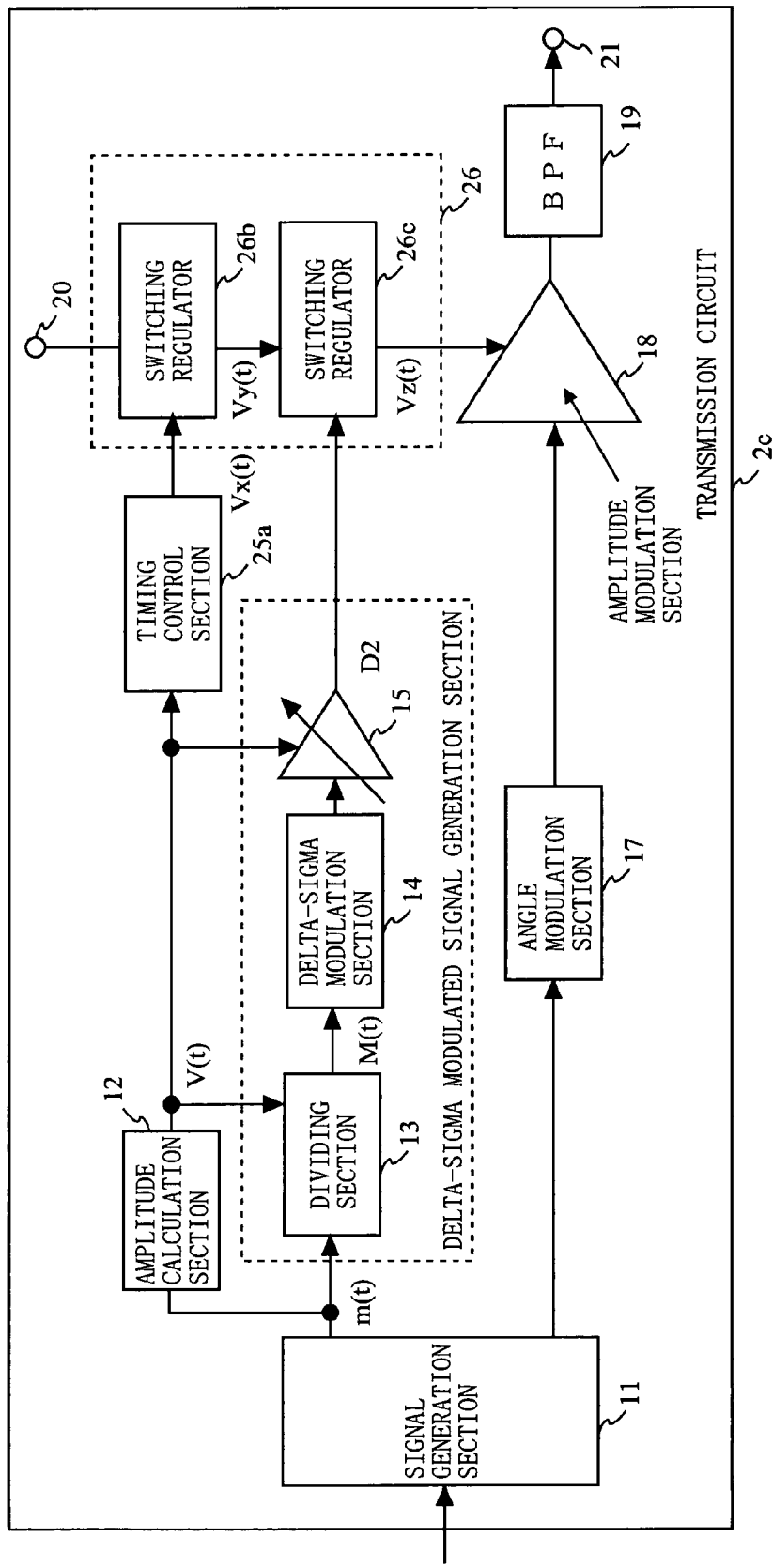
FIG. 11B is a block diagram showing an exemplary structure of a transmission circuit 2c according to the second embodiment of the present invention.

Still further, the transmission circuit 2 may have a similar structure to that of a transmission circuit 2b shown in FIG. 11A or a transmission circuit 2c shown in FIG. 11B in which the series regulator 26a included in the amplitude amplifying section 26 is replaced with a switching regulator 26c. FIG. 11A is a block diagram showing an exemplary structure of the transmission circuit 2b according to the second embodiment of the present invention. FIG. 11B is a block diagram showing an exemplary structure of the transmission circuit 2c according to the second embodiment of the present invention. In FIGS. 11A and 11B, the switching regulator 26c may have the same structure as that of the switching regulator 16b shown in FIG. 6B, or the switching regulator 16c shown in FIG. 6C. By having the switching regulator 26c instead of the series regulator 26a, the transmission circuit 2 is able to operate with higher efficiency.

Figure 11C:
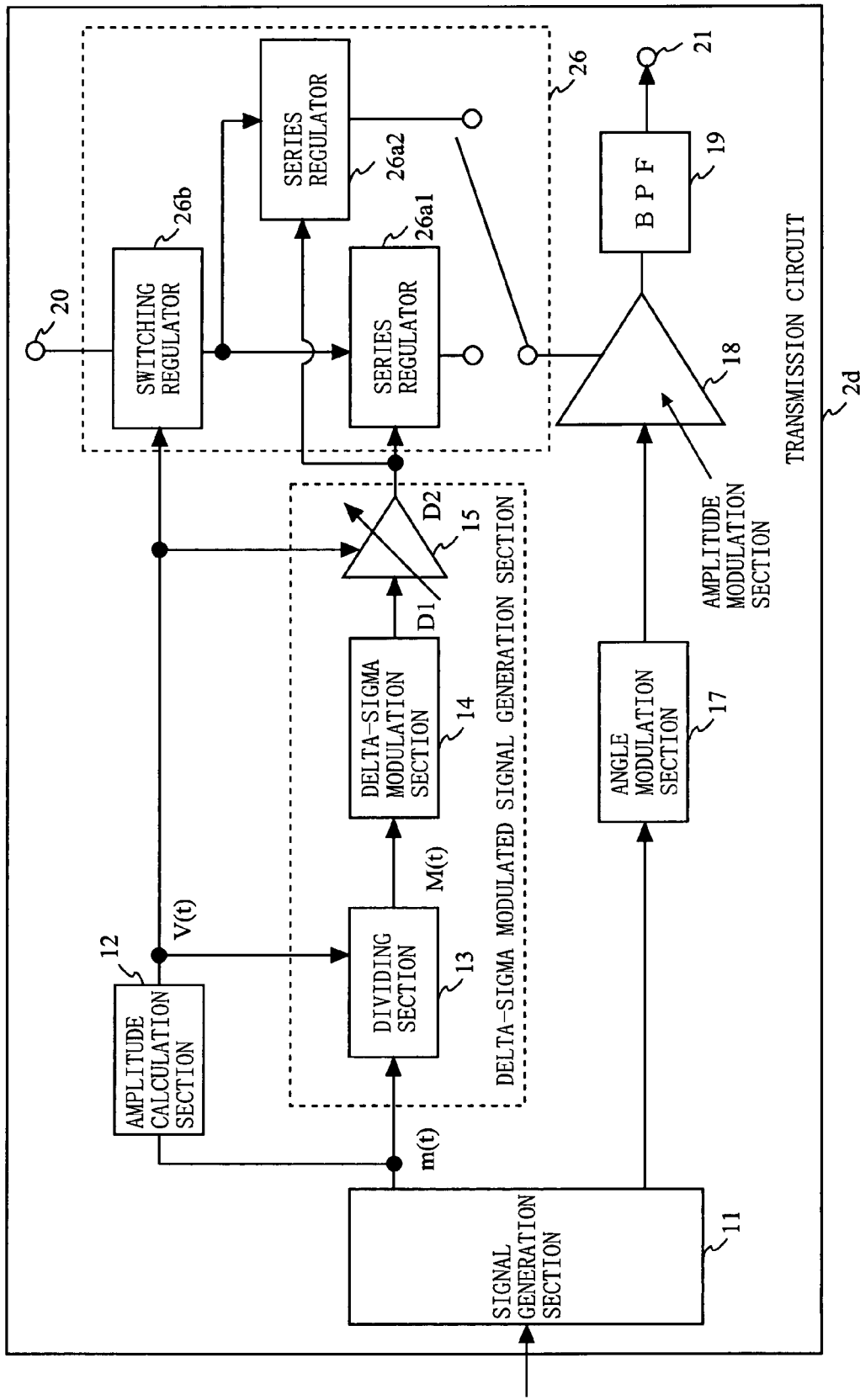
FIG. 11C is a block diagram showing an exemplary structure of a transmission circuit 2d according to the second embodiment of the present invention.

Still further, the transmission circuit 2 may comprise, similarly to a transmission circuit 2d shown in FIG. 11C, the amplitude amplifying section 26 which is structured by a series regulator 26a1, a series regulator 26a2, the switching regulator 26b and a switch. It is assumed here that the series regulator 26a1 and series regulator 26a2 are in different sizes, and that the series regulator 26a1 is smaller in size than the series regulator 26a2. The amplitude amplifying section 26 switches, in accordance with the magnitude of the discrete value signal V(t) outputted from the amplitude calculation section 12, a connection to the amplitude modulation section 18 between the series regulators 26a1 and 26a2.

Operations performed by the amplitude amplifying section 26 at the time of switching the connection to the amplitude modulation section 18 will be described in detail with reference to FIG. 11D. FIG. 11D shows an exemplary waveform of a delta-sigma modulated signal D2 (t) outputted from the variable gain amplifier section 15. Since the delta-sigma modulated signal D2(t) and a discrete value signal V(t) are proportional to each other, a magnitude of the discrete value signal V(t) is, in the example of FIG. 11D, small in a segment T1, large in a segment T2, and small in a segment T3. When the magnitude of the discrete value signal V(t) is smaller than a threshold value (i.e., in the segments T1 and T3), the amplitude amplifying section 26 switches the switch so as to connect the series regulator 26a1 to the amplitude amplifying section 18. When the magnitude of the discrete value signal V(t) is equal to or greater than the threshold value (i.e., in the segment T2), the amplitude amplifying section 26 switches the switch so as to connect the series regulator 26a2 to the amplitude amplifying section 18. This allows the transmission circuit 2d to select a series regulator of an appropriate size in accordance with the magnitude of the discrete value signal V(t), and thus operate with further improved efficiency.

Figure 11E:
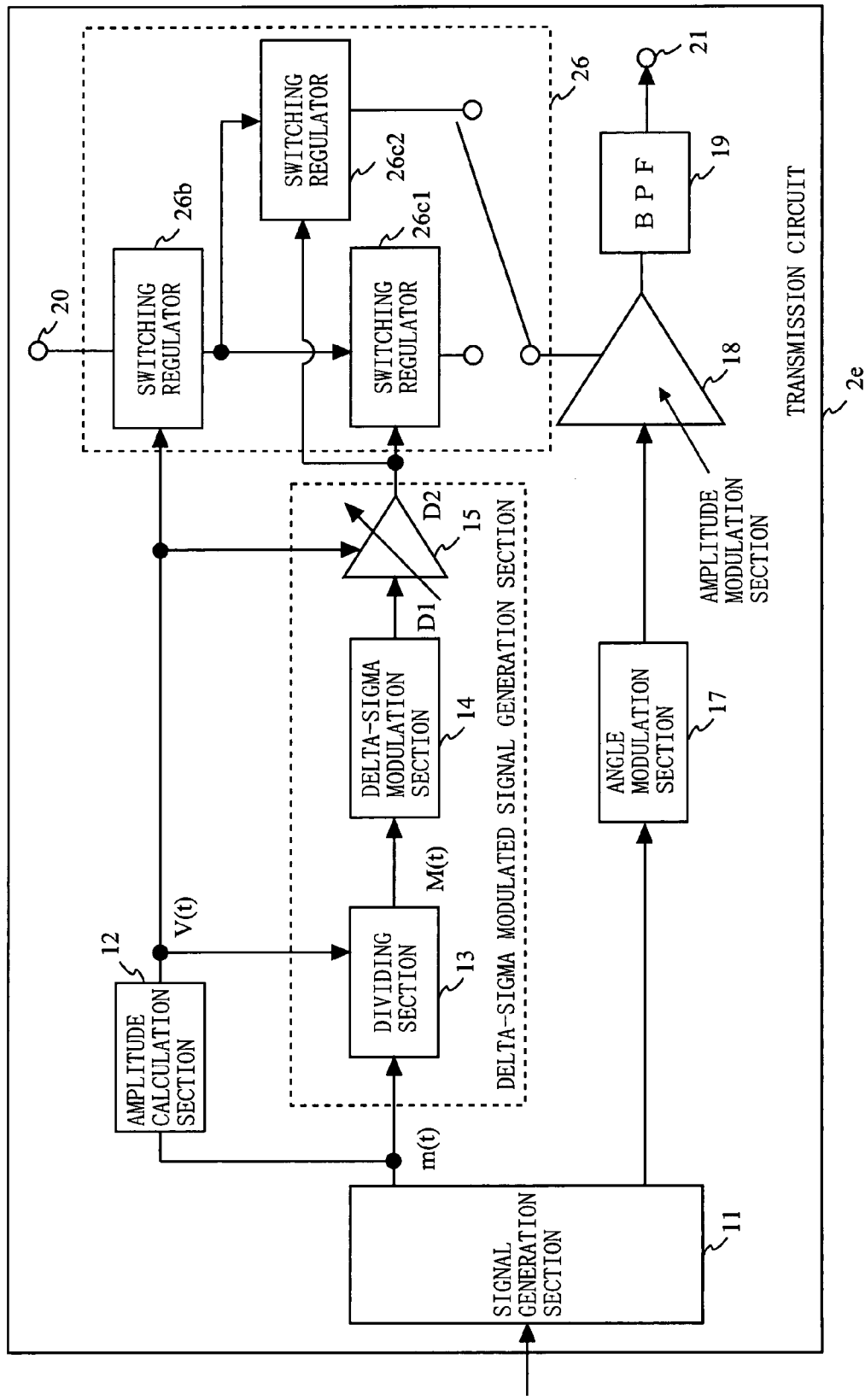
FIG. 11E is a block diagram showing an exemplary structure of a transmission circuit 2e according to the second embodiment of the present invention.

Still Further, the transmission circuit 2d may have a similar structure to that of a transmission circuit 2e shown in FIG. 11E in which the series regulators 26a1 and 26a2 are replaced with switching regulators 26c1 and 26c2. Although not shown, the transmission circuits 2d and 2e each may further comprise the timing control section 25a.

As described above, in the transmission circuit 2 according to the second embodiment of the present invention, the amplitude amplifying section 26, which includes the series regulator 26a and switching regulator 26b, uses the characteristics of the series regulator 26a and switching regulator 26b, thereby supplying, to the amplitude modulation section 18, the voltage corresponding to the magnitude of the delta-sigma modulated signal D2. This allows the transmission circuit 2 to operate with further improved efficiency and further lowered distortion.

Still further, by having the timing control section 25a subsequent to the amplitude calculation section 12, the transmission circuit 2 is able to eliminate the instability of the switching regulator 26b at the time of rising thereof, and operate with further lowered distortion.

Third Embodiment

Figure 12:
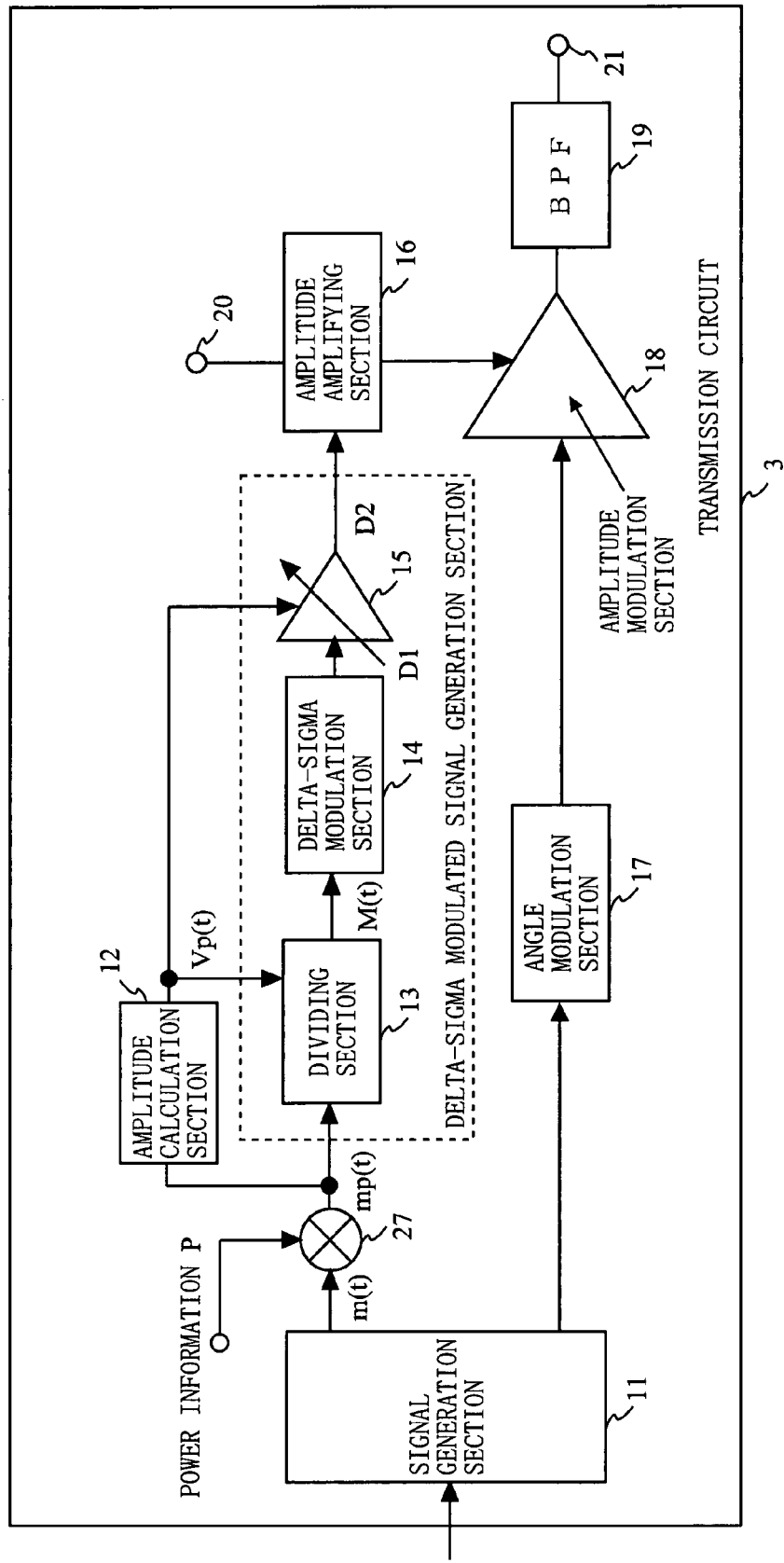
FIG. 12 is a block diagram showing an exemplary structure of a transmission circuit 3 according to a third embodiment of the present invention.
Figure 13:
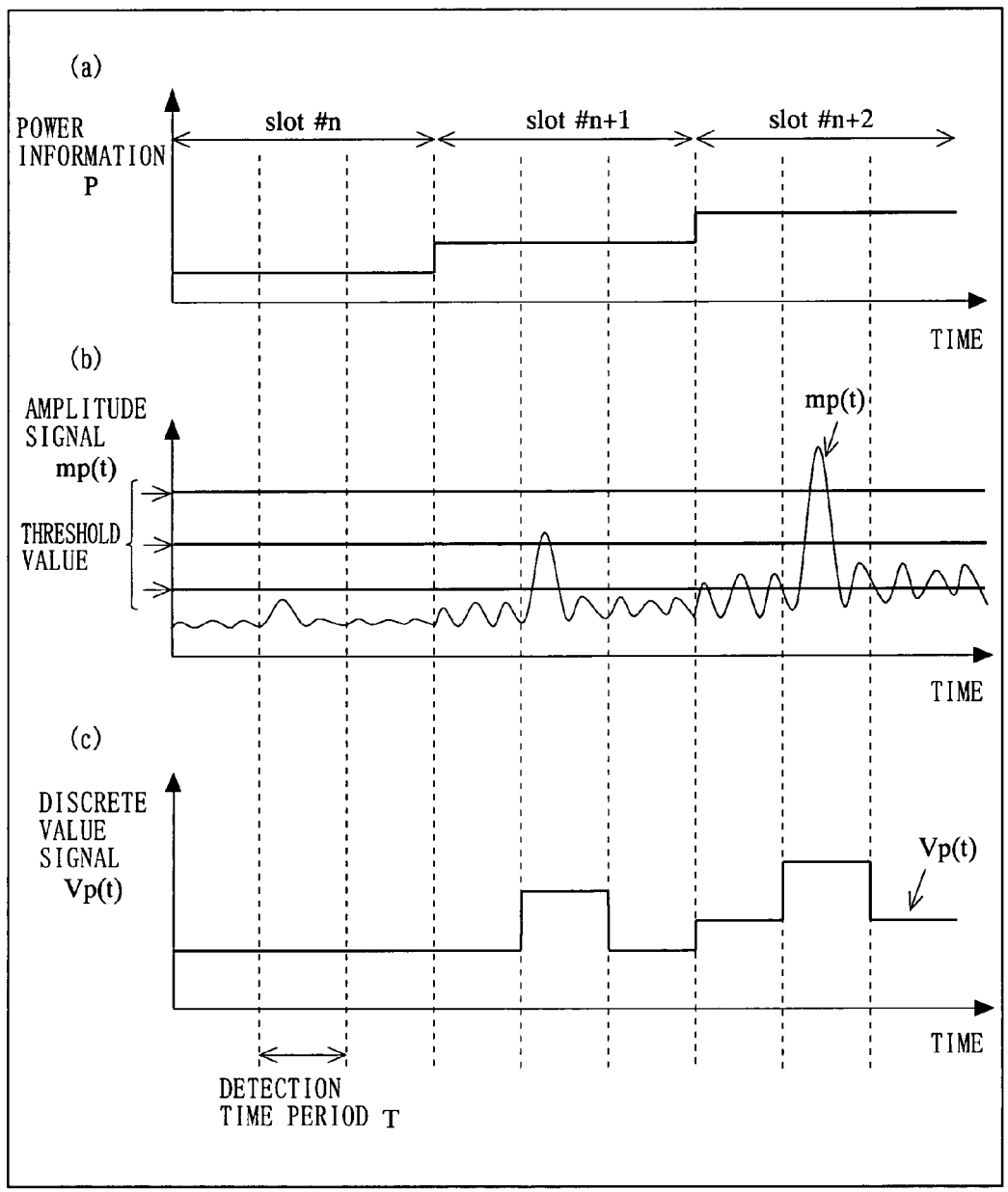
FIG. 13 illustrates operations of the transmission circuit 3 according to the third embodiment of the present invention.

FIG. 12 is a block diagram showing an exemplary structure of a transmission circuit 3 according to a third embodiment of the present invention. As shown in FIG. 12, the transmission circuit 3 further comprises, as compared with the transmission circuit 1 according to the first embodiment, a multiplying section 27 subsequent to the signal generation section 11. FIG. 13 illustrates operations of the transmission circuit 3 according to the third embodiment of the present invention. Power information P indicating a magnitude of output power of the transmission circuit is outputted from a baseband, and then inputted to the multiplying section 27 (see FIG. 13(a)). In the case of, e.g., a W-CDMA system, the power information P is controlled by a base station, and a transmission power between the transmission circuit and the base station is controlled at each slot time. Note that, in the transmission circuit 3, the signal generation section 11 outputs the power information P based on information from the base station.

The multiplying section 27 multiplies the power information P by the amplitude signal m(t), and outputs a resultant signal as an amplitude signal mp(t) which is controlled by electric power (see FIG. 13(b)). The amplitude calculation section 12 performs the same processing as that of the first embodiment, thereby selecting, at the predetermined time periods, a discrete value in accordance with a maximum value of the amplitude signal mp(t), and outputting the selected discrete value as a discrete value signal Vp(t) (see FIG. 13(c)). Note that, the amplitude calculation section 12 in this example has three threshold values and four discrete values. Since operations performed by the transmission circuit 3 thereafter are identical to those performed by the transmission circuit of the first embodiment, descriptions thereof will be omitted. Although not shown, the above multiplying section 27 is applicable to all the transmission circuits shown in FIGS. 8A, 8B and 8C.

Figure 14A:
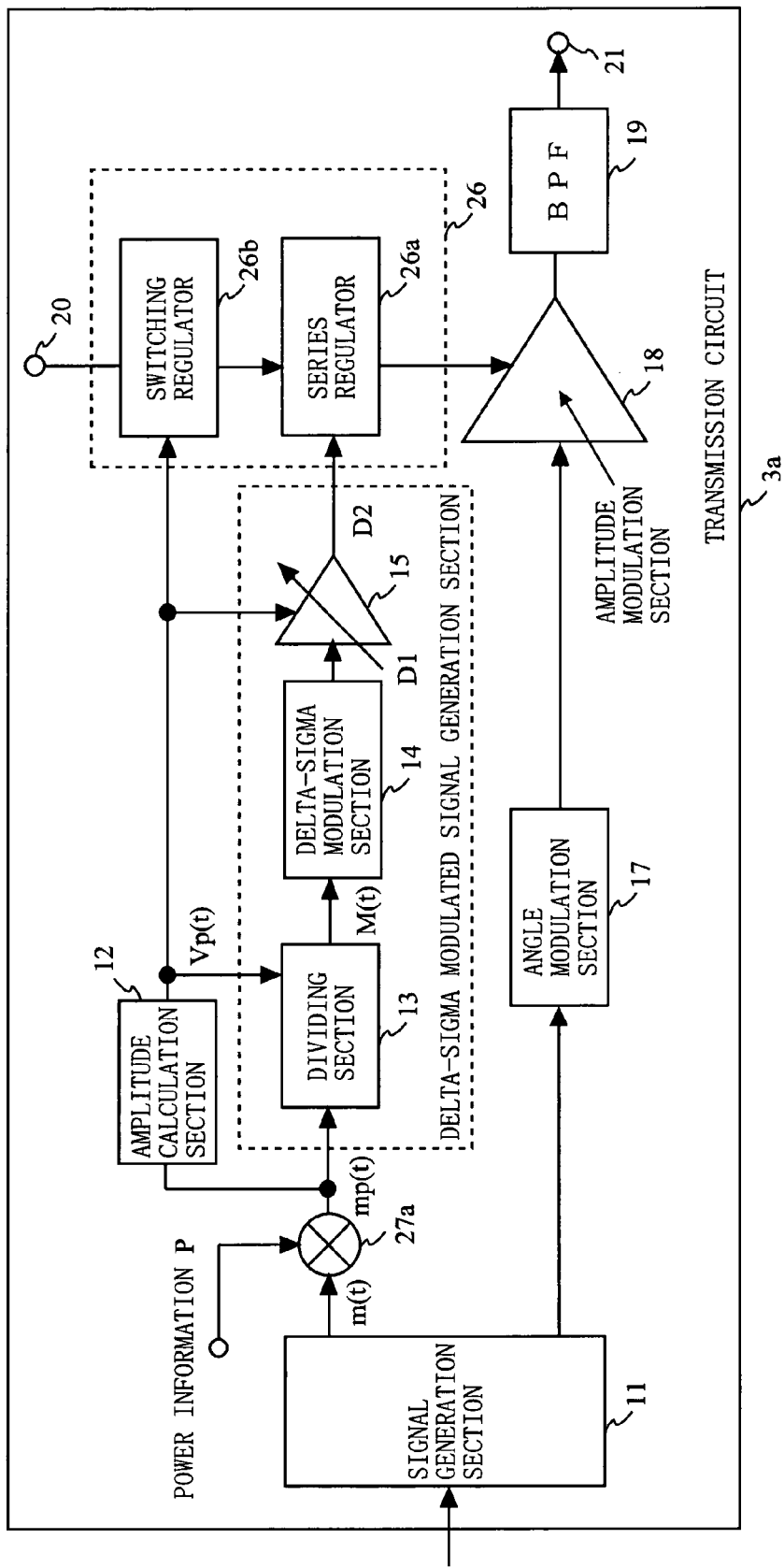
FIG. 14A is a block diagram showing an exemplary structure of a transmission circuit 3a according to the third embodiment of the present invention.

Further, features of the transmission circuit 3 according to the third embodiment are applicable to the transmission circuit 2 of the second embodiment in a similar manner to that of a transmission circuit 3a shown in FIG. 14A. FIG. 14A is a block diagram showing an exemplary structure of the transmission circuit 3a according to the third embodiment of the present invention. As shown in FIG. 14A, the transmission circuit 3a further comprises, as compared with the transmission circuit 2 according to the second embodiment, a multiplying section 27a subsequent to the signal generation section 11. Operations performed by the multiplying section 27a and amplitude calculation section 12 are the same as those performed by the multiplying section 27 and amplitude control section 12 of the above-described transmission circuit 3.

Figure 14B:
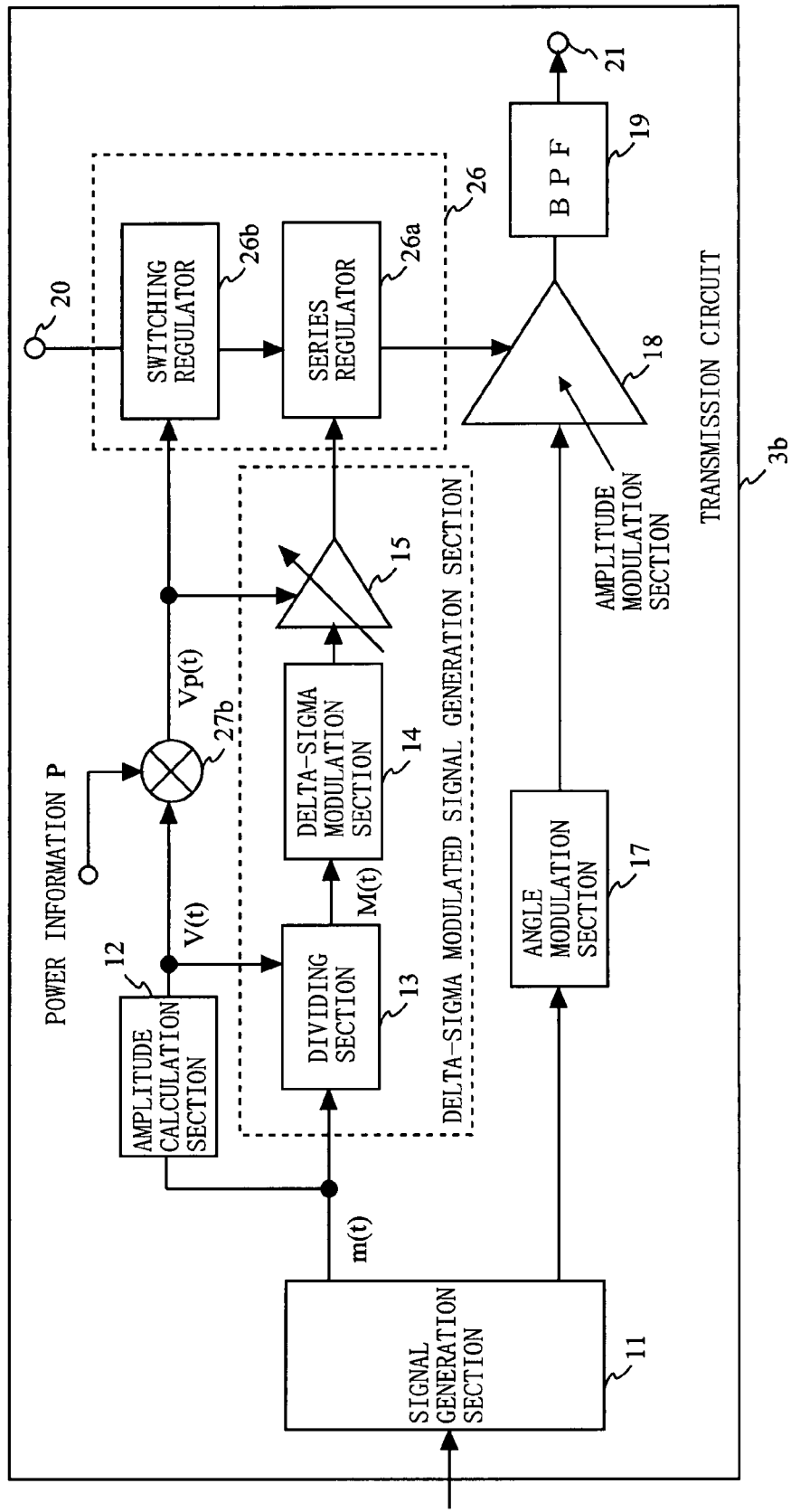
FIG. 14B is a block diagram showing an exemplary structure of a transmission circuit 3b according to the third embodiment of the present invention.

Alternatively, the above transmission circuit 3a may have a structure in which similarly to a transmission circuit 3b shown in FIG. 14B, a multiplying section 27b is provided between the amplitude calculation section 12 and switching regulator 26b. FIG. 14B is a block diagram showing an exemplary structure of the transmission circuit 3b according to the third embodiment of the present invention. In FIG. 14B, the multiplying section 27b multiplies the discrete value signal V(t) by the power information P, and outputs a resultant signal as the discrete value signal Vp(t) which is controlled by electric power. The discrete value signal Vp(t) is inputted to the variable gain amplifier section 15 and switching regulator 26b. Since operations performed by the transmission circuit 3a thereafter are the same as those described in the second embodiment, descriptions thereof will be omitted.

Further alternatively, the above transmission circuit 3a may have a structure in which similarly to a transmission circuit 3c shown in FIG. 14C, a multiplying section 27c is provided between the amplitude calculation section 12 and variable gain amplifier section 15. FIG. 14C is a block diagram showing an exemplary structure of the transmission circuit 3c according to the third embodiment of the present invention. In FIG. 14C, the multiplying section 27c multiplies the discrete value signal V(t) by the power information P, and outputs a resultant signal as the discrete value signal Vp(t) which is controlled by electric power. The discrete value signal Vp(t) is inputted to the variable gain amplifier section 15. The power information P is inputted to the switching regulator 26b. The switching regulator 26b supplies, to the series regulator 26a, a voltage corresponding to the power information P. Since the voltage supplied from the switching regulator 26b is controlled based on the power information P, the series regulator 26a is able to operate with high efficiency. Although not shown, the above-described multiplying sections 27a to 27c are applicable to all the transmission circuits of FIGS. 10A, 11A, 11B, 11C and 11E.

As described above, in the transmission circuit 3 according to the third embodiment of the present invention, the amplitude amplifying sections 16 and 26 each adjust, based on the power information P indicating the magnitude of the output power of the transmission circuit, the voltage, which is to be supplied to the amplitude modulation section 18, to an optimal level for the amplitude modulation section 18. This allows the transmission circuit 3 to operate with further improved efficiency and further lowered distortion.

Fourth Embodiment

Figure 15:
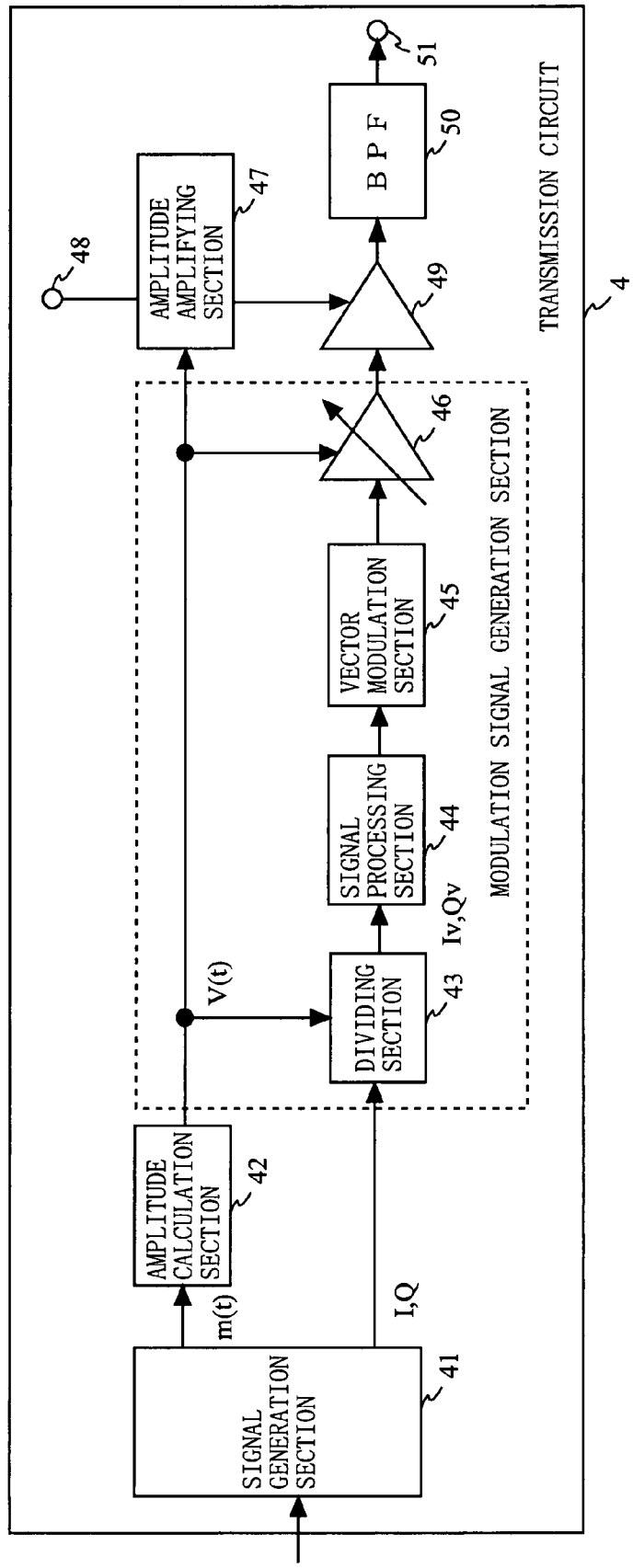
FIG. 15 is a block diagram showing an exemplary structure of a transmission circuit 4 according to a fourth embodiment of the present invention.

FIG. 15 is a block diagram showing an exemplary structure of a transmission circuit 4 according to a fourth embodiment of the present invention. As shown in FIG. 15, the transmission circuit 4 comprises a signal generation section 41, amplitude calculation section 42, dividing section 43, signal processing section 44, vector modulation section 45, variable gain amplifier section 46, amplitude amplifying section 47, power supply terminal 48, amplifier section 49, band-pass filter 50, and an output terminal 51. The signal generation section 41 generates, based on input data, the amplitude signal m(t) and the vector signal comprising I and Q signals orthogonal to each other. Here, the amplitude signal m(t) is representable by the equation (2) below. The amplitude signal m(t) is inputted to the amplitude calculation section 42. The I and Q signals are inputted to the dividing section 43.

$$m(t)=(I^2+Q^2)^{1/2} \quad \text{(equation 2)}$$

The amplitude calculation section 42 performs the same processing as that of the above-described amplitude calculation section 12 to output the discrete value signal V(t). The discrete value signal V(t) is inputted to the dividing section 43, variable gain amplifier section 46 and amplitude amplifying section 47. The dividing section 43 divides the I and Q signals by the discrete value signal V(t), and outputs resultant signals as an Iv signal and a Qv signal. The Iv and Qv signals are representable by the equation (3) below.

$$Iv, Qv=I/V(t), Q/V(t) \quad \text{(equation 3)}$$

The Iv and Qv signals outputted from the dividing section 43 are inputted to the signal processing section 44. The signal processing section 44 quantizes the inputted Iv and Qv signals by predetermined signal processing, and outputs resultant signals as quantized signals. The signal processing section 44 will be described later in detail. The quantized signals outputted from the signal processing section 44 are inputted to the vector modulation section 45. The vector modulation section 45 vector-modulates the inputted quantized signals, and outputs a resultant signal as a modulation signal. The modulation signal outputted from the vector modulation section 45 is inputted to the variable gain amplifier section 46. The variable gain amplifier section 46 amplifies the modulation signal by a gain corresponding to the magnitude of the discrete value signal V(t). The modulation signal amplified by the variable gain amplifier section 46 is inputted to the amplifier section 49.

The amplitude amplifying section 47 is supplied with a DC voltage from the power supply terminal 48. The amplitude amplifying section 47 supplies, to the amplifier section 49, a voltage corresponding to the magnitude of the discrete value signal V(t) inputted from the amplitude calculation section 42. Typically, the amplitude amplifying section 47 supplies, to the amplifier section 49, a voltage proportional to the magnitude of the discrete value signal V(t). Here, the amplitude amplifying section 47 may supply, to the amplifier section 49, an electric current proportional to the magnitude of the discrete value signal V(t). The amplifier section 49 amplifies the inputted modulation signal in accordance with the voltage supplied from the amplitude amplifying section 47. The band-pass filter 50 removes quantization noise contained in the modulation signal. The modulation signal, from which the quantization noise has been removed by the band-pass filter 50, is outputted from the output terminal 51 as a transmission signal.

For the amplitude amplifying section 47, a series regulator, switching regulator, current-driven regulator or the like may be used. The series regulator may be structured in the same manner as that of the series regulator 16a shown in FIG. 6A. The switching regulator may be structured in the same manner as that of the switching regulator 16b shown in FIG. 6B or switching regulator 16c shown in FIG. 6C. The current-driven regulator may be structured in the same manner as that of the current-driven regulator 16d shown in FIG. 6D. Further, the amplifier section 49 may be structured in the same manner as that of the amplitude modulation sections 18a and 18b shown in FIGS. 7A and 7B.

Note that, since the dividing section 43, signal processing section 44, vector modulation section 45 and the variable gain amplifier section 46 in the transmission circuit 4 are components for modulating, based on the discrete value signal V(t), the I and Q signals to generate the modulation signal to be inputted to the amplifier section 49, these components may be collectively referred to as a modulation signal generation section.

Figure 16A:
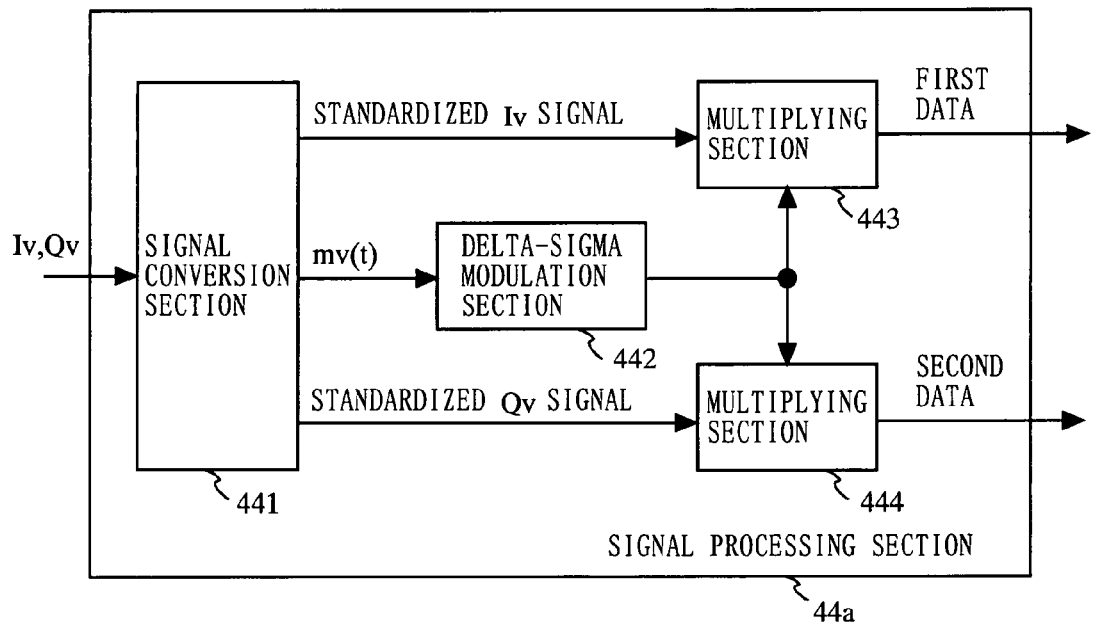

Next, a signal processing section 44a will be described in detail. FIG. 16A is a block diagram showing an exemplary structure of the signal processing section 44a. As shown in FIG. 16A, the signal processing section 44a includes a signal conversion section 441, delta-sigma modulation section 442, multiplying section 443 and a multiplying section 444. The Iv and Qv signals are inputted to the signal conversion section 441 from the dividing section 43. Based on the inputted Iv and Qv signals, the signal conversion section 441 outputs an amplitude signal mv(t) representing magnitudes of the Iv and Qv signals, and also outputs a standardized Iv signal and a standardized Qv signal. The amplitude signal mv(t) is representable by the equation (4) below.

$$mv(t) = (Iv^2 + Qv^2)^{1/2} \quad \text{(equation 4)}$$

The standardized Iv signal is calculated by dividing the inputted Iv signal by the amplitude signal mv(t). Similarly, the standardized Qv signal is calculated by dividing the inputted Qv signal by the amplitude signal mv(t). Here, the standardized Iv signal and standardized Qv signal may be collectively referred to as a standardized vector signal.

The amplitude signal mv(t) is inputted to the delta-sigma modulation section 442. The delta-sigma modulation section 442 delta-sigma modulates the amplitude signal mv(t), and outputs a resultant signal as a delta-sigma modulated signal. The multiplying section 443 multiplies the standardized Iv signal by the delta-sigma modulated signal, and outputs a signal resulting from the multiplication as first data. The multiplying section 444 multiplies the standardized Qv signal by the delta-sigma modulated signal, and outputs a signal resulting from the multiplication as second data. The first and second data are outputted from the signal processing section 44a as quantized signals.

Figure 16B:
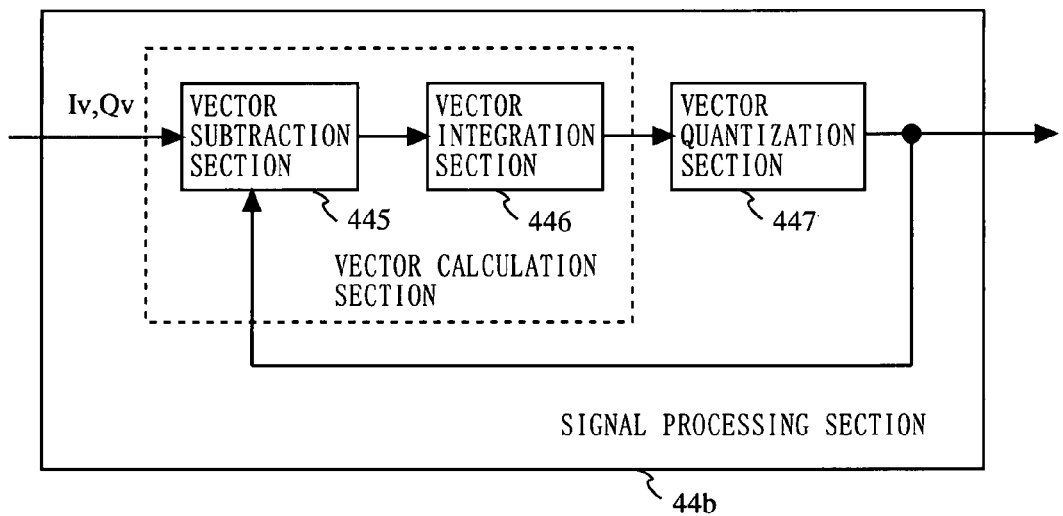
FIG. 16B is a block diagram showing an exemplary structure of a signal processing section 44b.

FIG. 16B is a block diagram showing an exemplary structure of a signal processing section 44b. In FIG. 16B, the signal processing section 44b includes a vector subtraction section 445, vector integration section 446 and vector quantization section 447. In FIG. 16B, the Iv and Qv signals are inputted to the signal processing section 44b from the dividing section 43. The Iv and Qv signals are inputted to the vector integration section 446 via the vector subtraction section 445. The vector integration section 446 integrates the Iv and Qv signals, and outputs resultant signals. The signals outputted from the vector integration section 446 are inputted to the vector quantization section 447. The vector quantization section 447 quantizes the inputted signals, and outputs resultant signals as quantized signals. The vector subtraction section 445 subtracts the quantized signals, which are outputted from the vector quantization section 447, from the Iv and Qv signals, and outputs resultant signals to the vector integration section 446. Note that, the vector subtraction section 445 and vector integration section 446 may be collectively referred to as a vector calculation section.

Figure 16C:
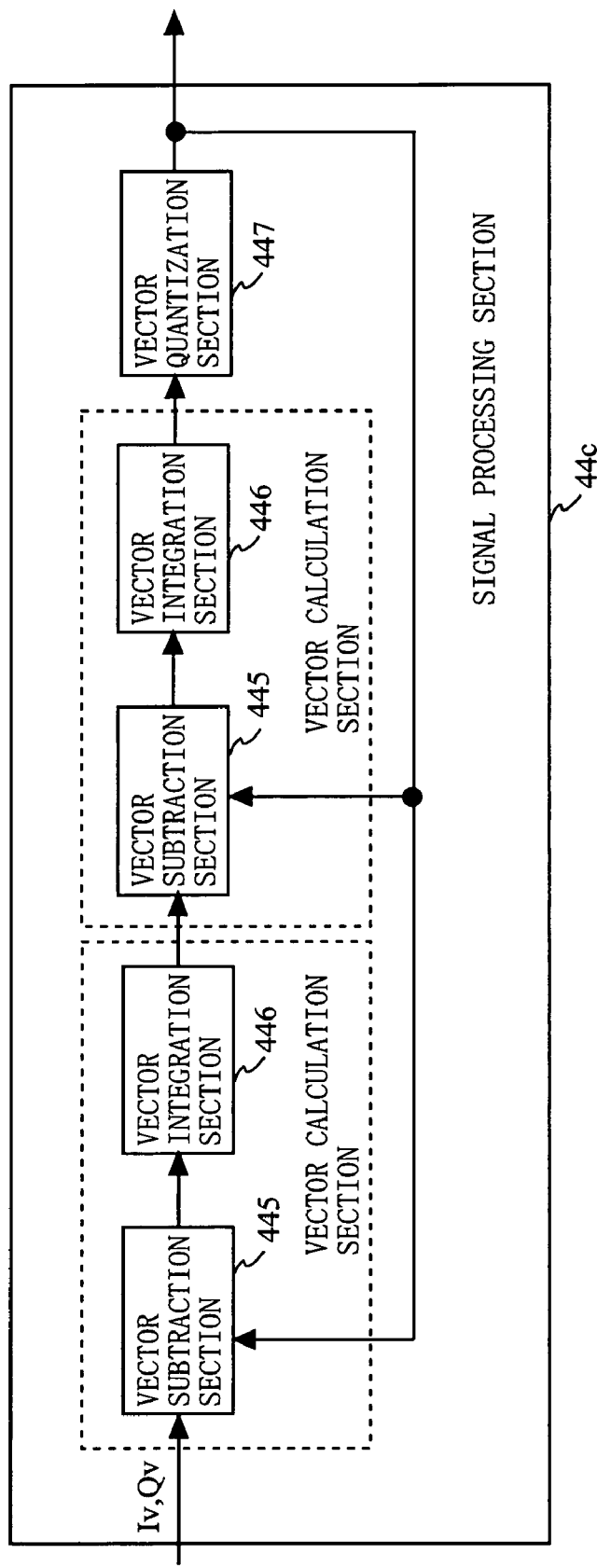
FIG. 16C is a block diagram showing an exemplary structure of a signal processing section 44c.

FIG. 16C is a block diagram showing an exemplary structure of a signal processing section 44c. In FIG. 16C, the signal processing section 44c includes a plurality of vector subtraction sections 445, a plurality of vector integration sections 446 and the vector quantization section 447. Since operations performed by the vector subtraction sections 445, vector integration sections 446 and vector quantization section 447 are the same as the operations described with reference to FIG. 16B, detailed descriptions thereof will be omitted.

Figure 17A:
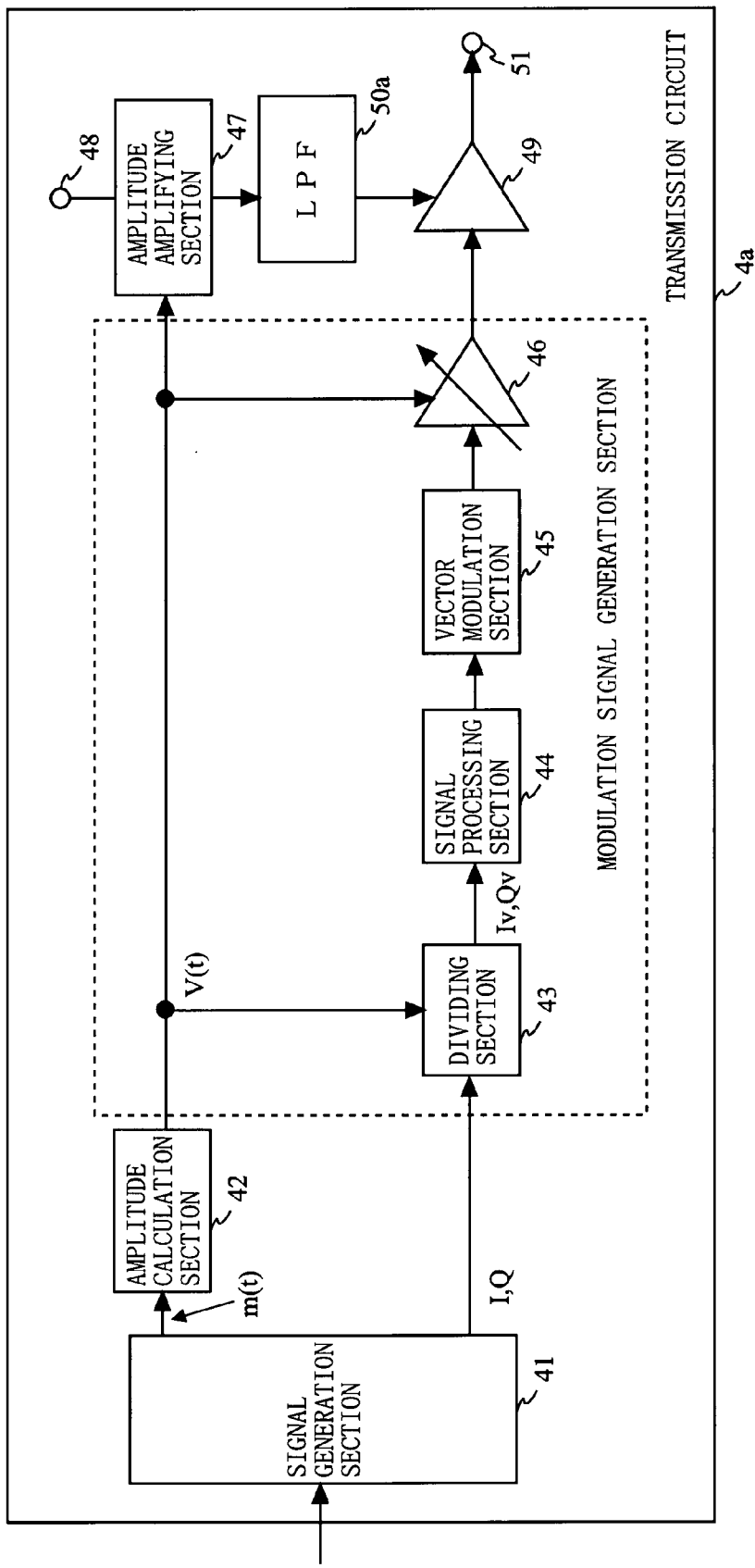
FIG. 17A is a block diagram showing an exemplary structure of a transmission circuit 4a according to the fourth embodiment of the present invention.

In the case where an output signal from the amplifier section 49 does not contain a significant amount of quantization noise, the above-described transmission circuit 4 may have a structure which does not have the band-pass filter 50. Further, the transmission circuit 4 may have such a structure as shown in FIG. 17A in which instead of the band-pass filter 50, a low-pass filter 50a is provided between the amplitude amplifying section 47 and the amplifier section 49. FIG. 17A is a block diagram showing an exemplary structure of a transmission circuit 4a according to the fourth embodiment of the present invention. In FIG. 17A, the low-pass filter 50a removes quantization noise from a signal outputted from the amplitude amplifying section 47.

Figure 17B:
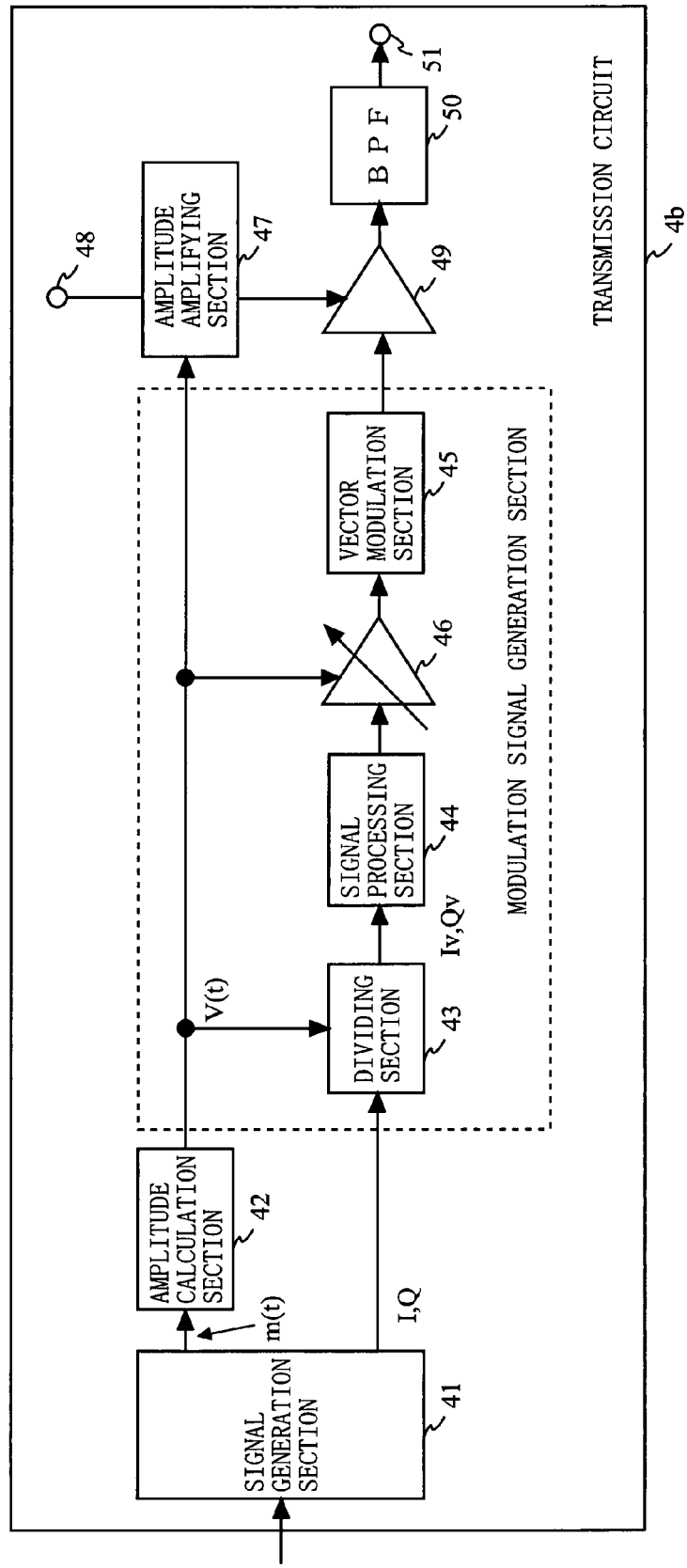
FIG. 17B is a block diagram showing an exemplary structure of a transmission circuit 4b according to the fourth embodiment of the present invention.

Further, the above transmission circuit 4 may have a similar structure to that of a transmission circuit 4b shown in FIG. 17B in which the positions of the vector modulation section 45 and variable gain amplifier section 46 are switched. FIG. 17B is a block diagram showing an exemplary structure of the transmission circuit 4b according to the fourth embodiment of the present invention. In FIG. 17B, the quantized signals are inputted to the variable gain amplifier section 46 from the signal processing section 44. The variable gain amplifier section 46 amplifies the quantized signals by the gain corresponding to the magnitude of the discrete value signal V(t). The vector modulation section 45 vector-modulates the quantized signals amplified by the variable gain amplifier section 46, and outputs a resultant signal as the modulation signal. In the transmission circuit 4b, other components than the variable gain amplifier section 46 and vector modulation section 45 operate in the same manner as that of the transmission circuit 4.

Figure 17C:
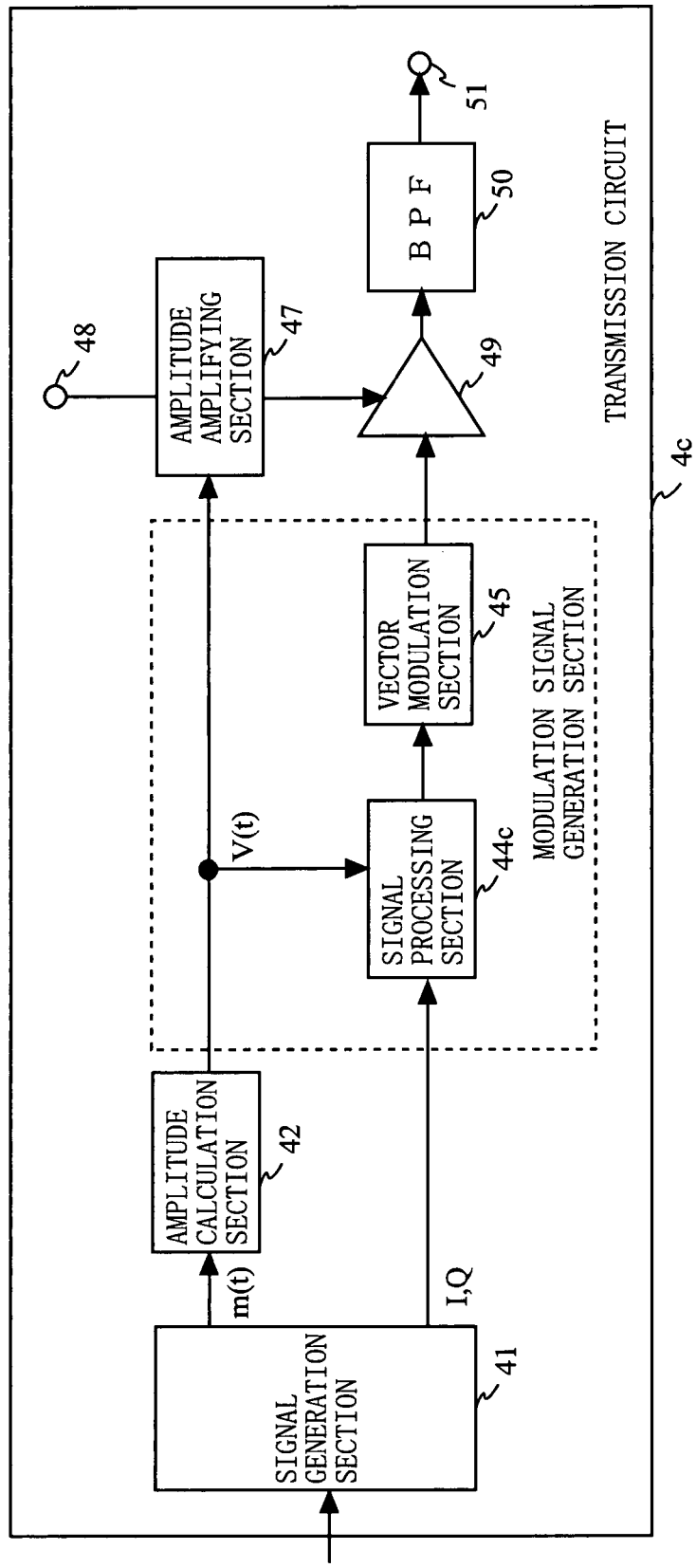
FIG. 17C is a block diagram showing an exemplary structure of a transmission circuit 4c according to the fourth embodiment of the present invention.

Still further, the above transmission circuit 4 may have a similar structure to that of a transmission circuit 4c shown in FIG. 17C. FIG. 17C is a block diagram showing an exemplary structure of the transmission circuit 4c according to the fourth embodiment of the present invention. As shown in FIG. 17C, the transmission circuit 4c comprises the signal generation section 41, amplitude calculation section 42, signal processing section 44c, vector modulation section 45, amplitude amplifying section 47, power supply terminal 48, amplifier section 49, band-pass filter 50 and the output terminal 51. I and Q signals and the discrete value signal V(t) are inputted to the signal processing section 44c. The signal processing section 44c changes a magnitude of a signal to be outputted, such that the magnitude of the signal has a same characteristic as that of the magnitude of the discrete value signal V(t). Typically, the signal processing section 44c changes the magnitude of the signal to be outputted, so as to be proportional to the magnitude of the discrete value signal V(t). Here, the signal processing section 44a shown in FIG. 16A or the signal processing section 44b shown in FIG. 16B may be used as the signal processing section 44c.

As described above, in the transmission circuit 4 according to the fourth embodiment of the present invention, the signal processing section 44 quantizes the Iv and Qv signals which have been calculated by dividing the I and Q signals by the discrete value signal V(t). This allows the quantization noise occurring at the time of performing quantization to be reduced. As a result, a filter for reducing the quantization noise is not required to have a steep characteristic, and power consumption and a size thereof are reduced. This allows the transmission circuit 4 to be small in size, operate with high efficiency, and output a transmission signal having high linearity.

Figure 18:
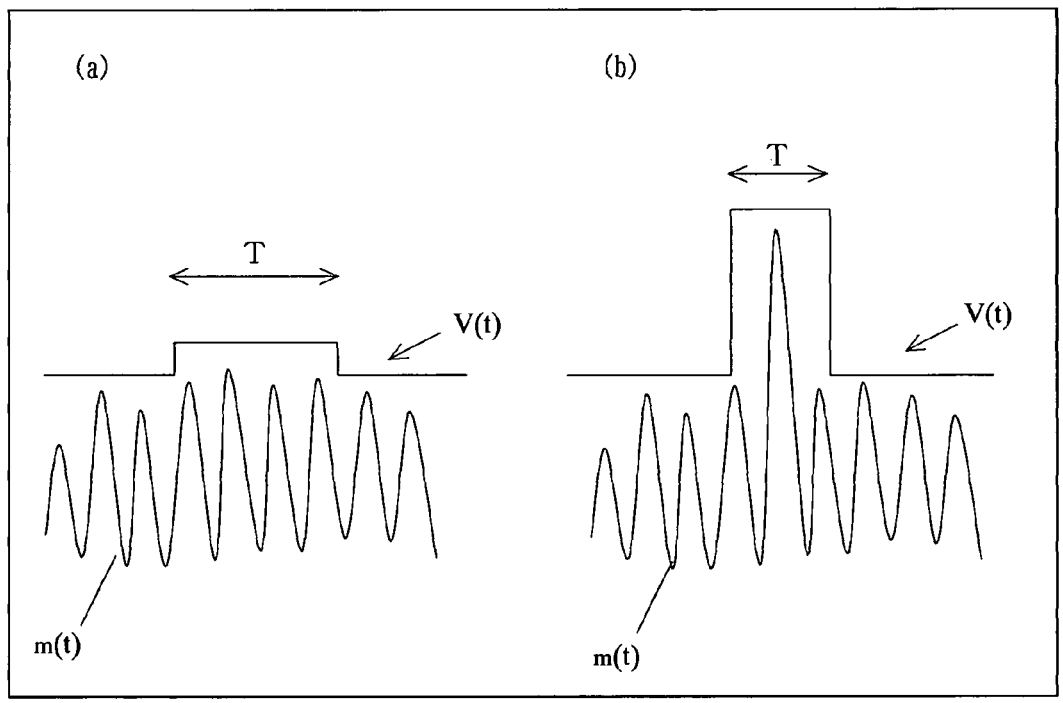
FIG. 18 illustrates a power consumption reduction effect in the case of changing a length of a predetermined time T.

In the above-described transmission circuits according to the first to fourth embodiments, the amplitude calculation sections 12 and 42 may change, by a modulation mode of the transmission signal, a length of the predetermined time period T so as to reduce the power consumption of the transmission circuit. FIG. 18 illustrates a power consumption reduction effect in the case where the length of the predetermined time period T is changed. When an envelope variation of the transmission signal is small as shown in FIG. 18(a), the power consumption reduction effect is small even if the amplitude calculation sections 12 and 42 changes the predetermined time period T so as to be relatively short. For this reason, the amplitude calculation sections 12 and 42 changes the predetermined time period T so as to be relatively long. On the other hand, when the envelope variation of the transmission signal is large as shown in FIG. 18(b), shortening the predetermined time period T enhances the power consumption reduction effect. For example, since the envelope variation is greater in the 16 QAM modulation mode than in the QPSK modulation mode, the amplitude calculation sections 12 and 42 shorten the predetermined time period T when the modulation mode is in the 16 QAM modulation mode. In this manner, the amplitude calculation sections 12 and 42 are able to reduce the power consumption of the transmission circuit.

Figure 19:
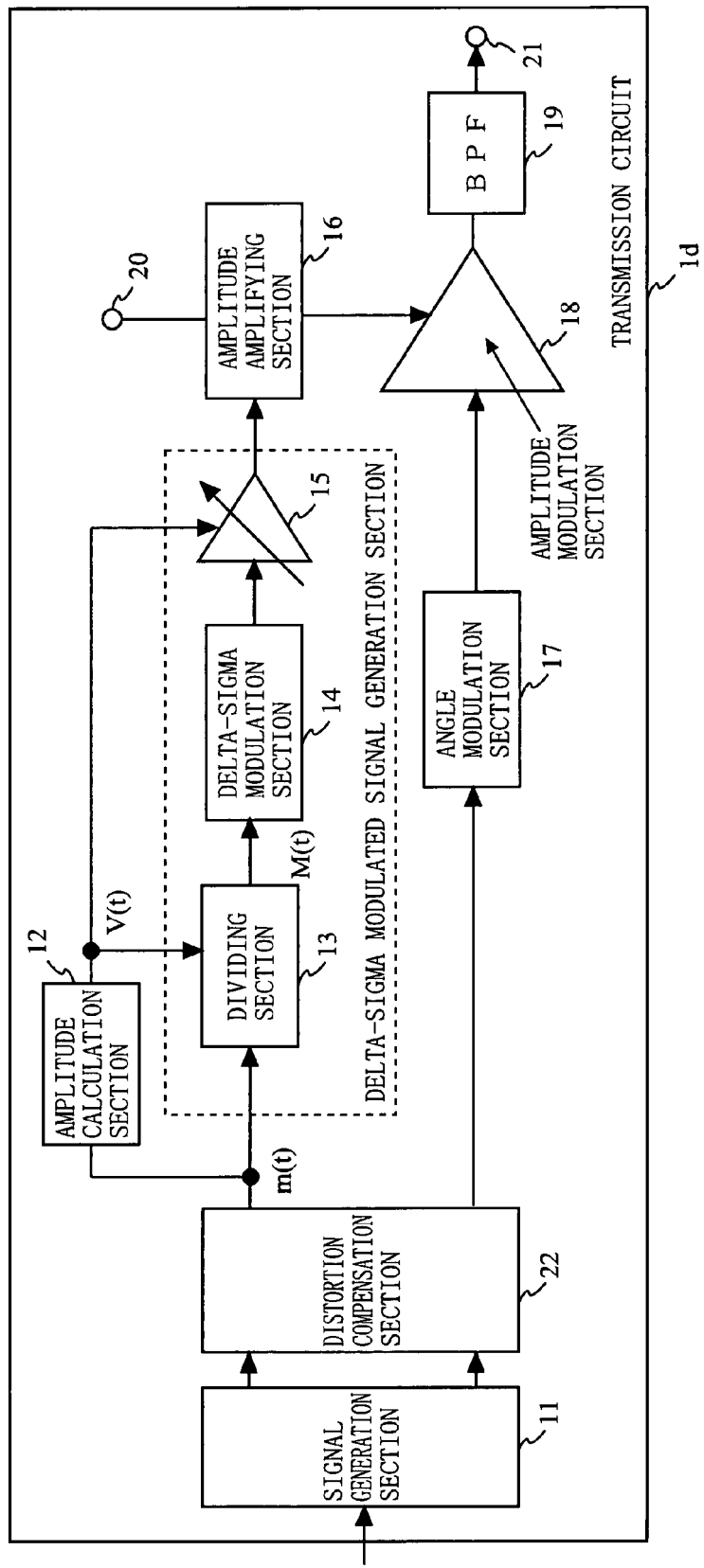
FIG. 19 is a block diagram showing an exemplary structure of a transmission circuit 1d comprising a distortion compensation section 22.

Further, in order to compensate for at least non-linearity of the amplitude modulation section 18, the transmission circuits according to the above first to third embodiments may each further comprise, at an output of the signal generation section 11, a distortion compensation section 22 for compensating for distortion of the amplitude signal and/or phase signal. For example, the transmission circuit 1 according to the first embodiment may have a similar structure to that of a transmission circuit 1*d* shown in FIG. 19. FIG. 19 is a block diagram showing an exemplary structure of the transmission circuit 1*d* having the distortion compensation section 22. In FIG. 19, the distortion compensation section 22 compensates for the amplitude signal and/or the phase signal generated by the signal generation section 11 such that at least distortion occurring at the amplitude modulation section 18 is suppressed. This allows the transmission circuit 1*d* to have higher linearity of the transmission signal than that of the transmission signals of the above transmission circuits.

Figure 20:
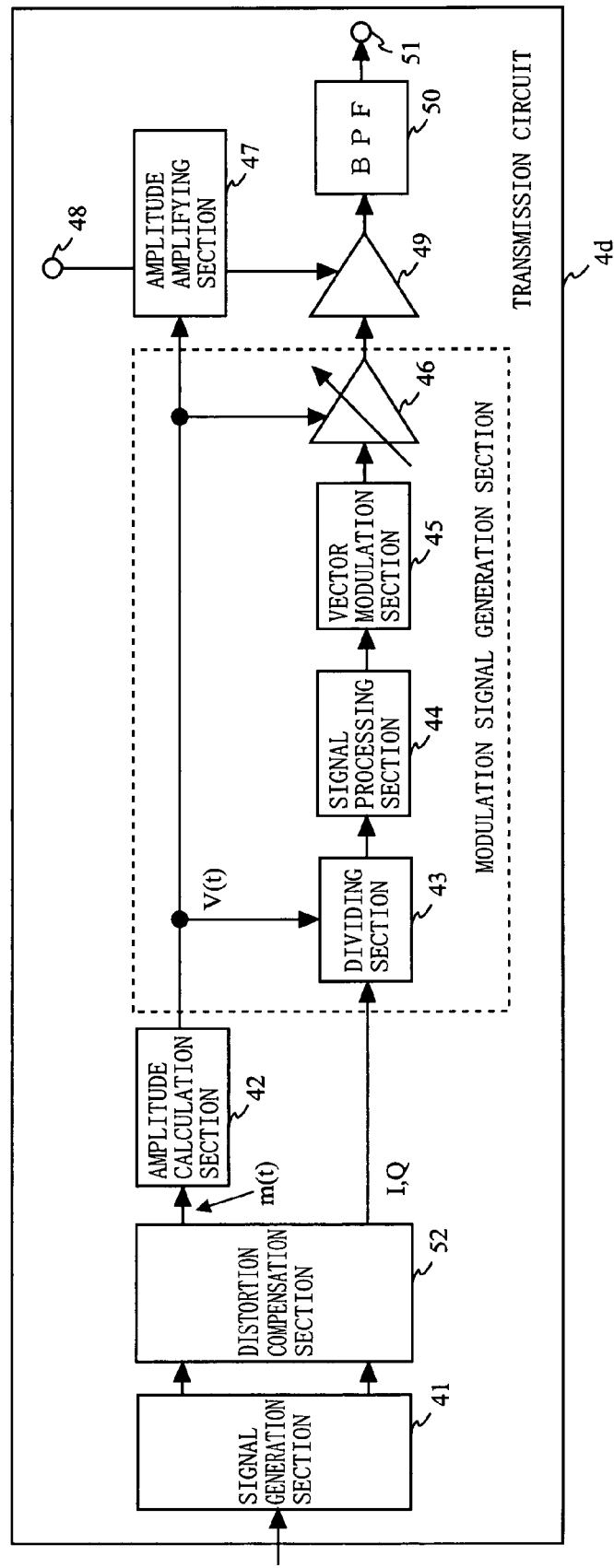
FIG. 20 is a block diagram showing an exemplary structure of a transmission circuit 4d comprising a distortion compensation section 52.

Still further, in order to compensate for at least non-linearity of the amplifier section 49, the transmission circuit according to the above fourth embodiment may further comprise, at an output of the signal generation section 41, a distortion compensation section 52 for compensating for distortion of the amplitude signal and/or I and Q signals. FIG. 20 is a block diagram showing an exemplary structure of a transmission circuit 4*d* comprising the distortion compensation section 52. In FIG. 20, the distortion compensation section 52 compensates for the amplitude signal and/or the I and Q signals generated by the signal generation section 41, such that at least distortion occurring at the amplifier section 49 is suppressed. This allows the transmission circuit 4*d* to have higher linearity of the transmission signal than that of the transmission signals of the above-described transmission circuits.

Fifth Embodiment

Figure 21:
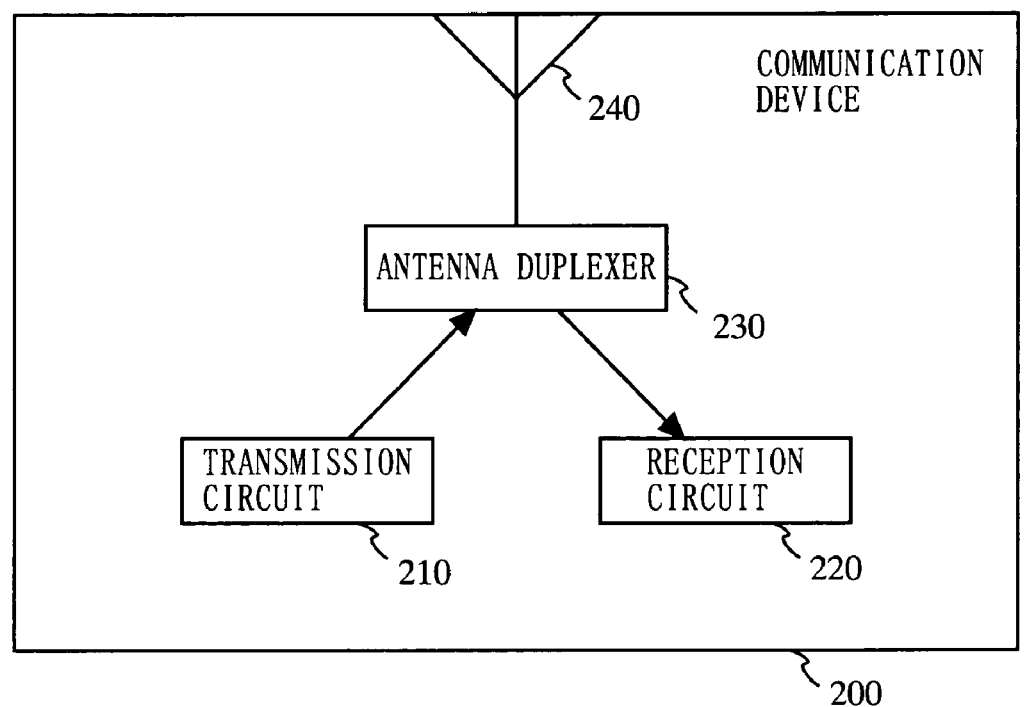
FIG. 21 is a block diagram showing an exemplary structure of a communication device according to a fifth embodiment of the present invention.
Figure 23A:
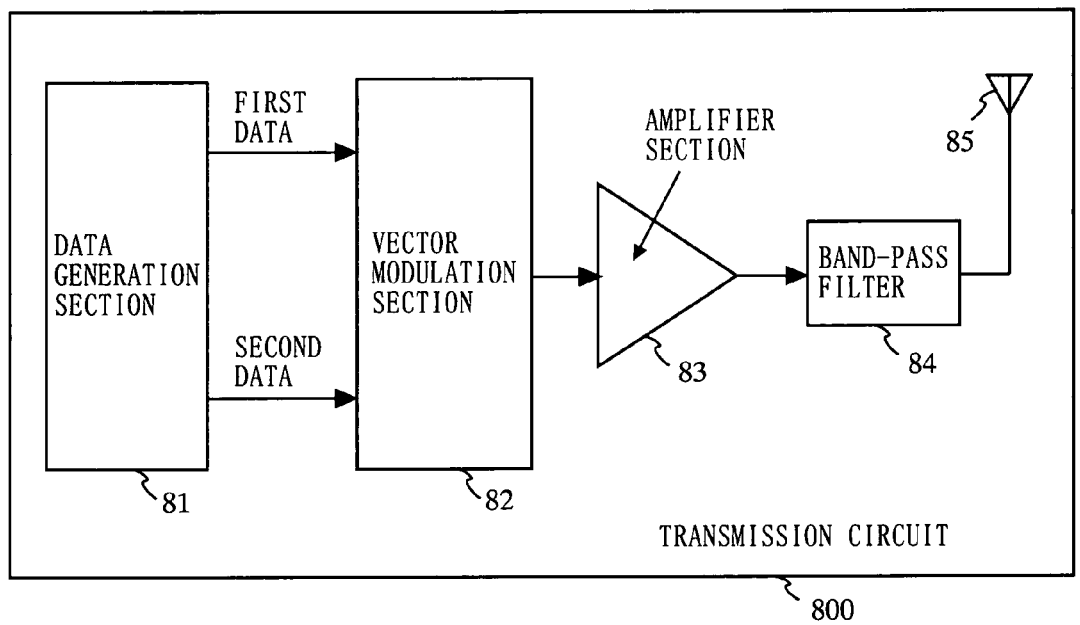
FIG. 23A is a block diagram showing an exemplary structure of a conventional transmission circuit 800.
Figure 23B:
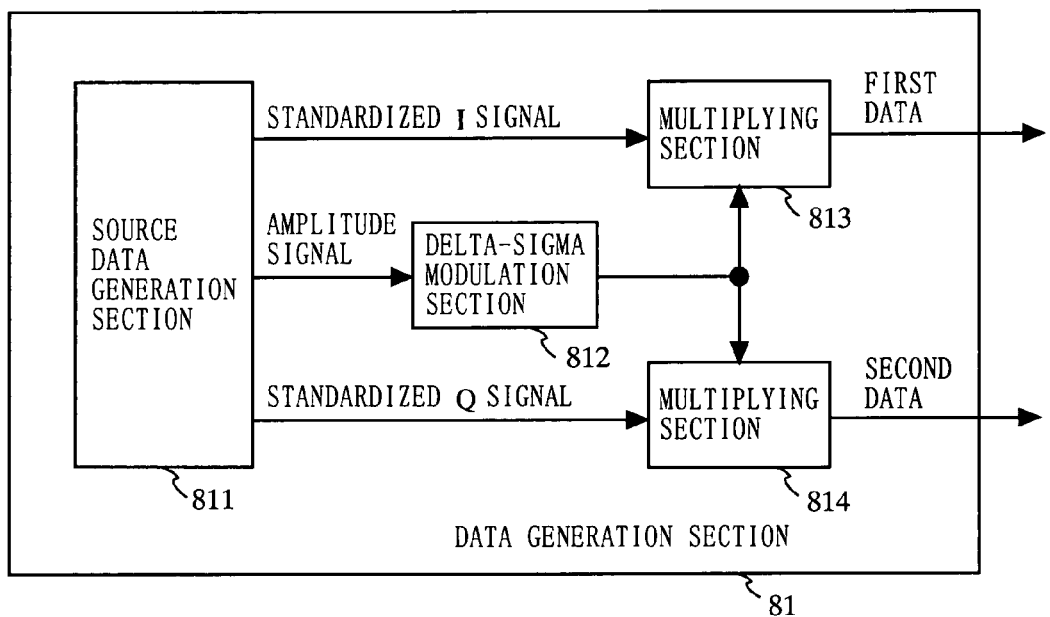
FIG. 23B is a block diagram showing an exemplary structure of a data generation section 81.
Figure 24A:
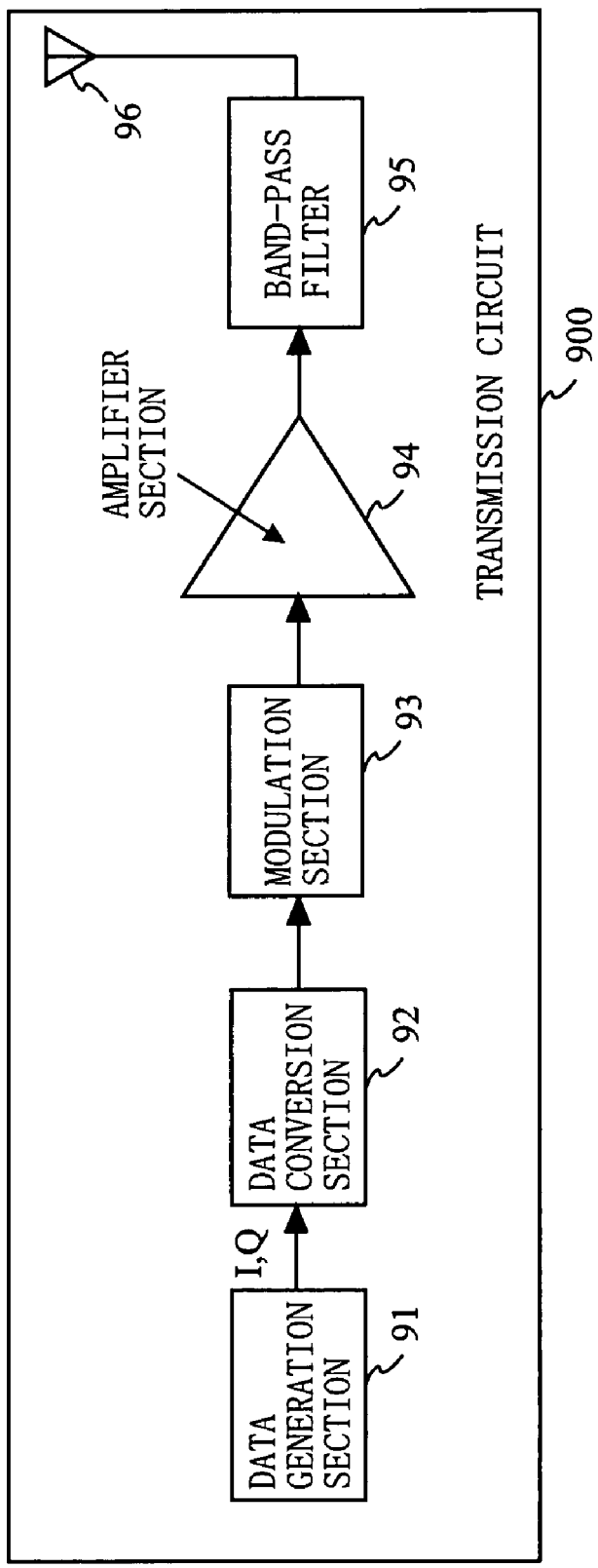
FIG. 24A is a block diagram showing an exemplary structure of a conventional transmission circuit 900.

FIG. 21 is a block diagram showing an exemplary structure of a communication device according to a fifth embodiment of the present invention. As shown in FIG. 21, a communication device 200 according to the fifth embodiment comprises a transmission circuit 210, reception circuit 220, antenna duplexer 230 and an antenna 240. The transmission circuit 210 is any one of the transmission circuits described in the above first to fourth embodiments. The antenna duplexer 230 transmits to the antenna 240 a transmission signal outputted from the transmission circuit 210, and prevents the transmission signal from leaking to the reception circuit 220. Also, the antenna duplexer 230 transmits to the reception circuit 220 a reception signal inputted from the antenna 240, and prevents the reception signal from leaking to the transmission circuit 210.

Accordingly, the transmission signal is outputted from the transmission circuit 210, and released from the antenna 240 to the exterior space via the antenna duplexer 230. The reception signal is received by the antenna 240, and then received by the reception circuit 220 via the antenna duplexer 230. The communication device 200 according to the fifth embodiment uses any of the transmission circuits according to the first to fourth embodiments, thereby securing the linearity of the transmission signal and also realizing low distortion of a radio device. Since there is no branching element, such as a directional coupler, on an output of the transmission circuit 210, loss from the transmission circuit 210 to the antenna 240 is reduced, whereby power consumption at the time of transmission is reduced. As a result, the communication device 200 is capable of operating for a long period of time as a radio communication device. Note that, the communication device 200 may have a structure which includes only the transmission circuit 210 and antenna 240.

The transmission circuits according to the present invention are applicable to communication devices such as mobile phones and wireless LAN devices.

While the invention has been described in detail, the foregoing description is in all aspects illustrative and not restrictive. It is understood that numerous other modifications and variations can be devised without departing from the scope of the invention.

What is claimed is:

1. A transmission circuit for generating and outputting a transmission signal based on input data, the transmission circuit comprising:

a signal generation section for performing predetermined signal processing on the input data, thereby generating an amplitude signal and an angle-modulated signal;

an amplitude calculation section for performing predetermined arithmetic processing on the amplitude signal, and outputting a resultant signal as a discrete value signal having a plurality of discrete values corresponding to a magnitude of the amplitude signal;

a delta-sigma modulated signal generation section for delta-sigma modulating the amplitude signal in accordance with the discrete value signal, and outputting a resultant signal as a delta-sigma modulated signal;

an amplitude amplifying section for outputting a signal corresponding to a magnitude of the delta-sigma modulated signal; and an amplitude modulation section for amplitude-modulating, by amplifying the angle-modulated signal in accordance with the signal outputted from the amplitude amplifying section, the angle-modulated signal, and outputting a resultant signal as a transmission signal having been angle-modulated and amplitude-modulated, wherein the amplitude calculation section retains at least one threshold value and two or more discrete values corresponding to the at least one threshold value, and determines, at predetermined time periods, whether or not the amplitude signal exceeds the at least one threshold value; selects, based on a determination result, a discrete value to be outputted; and outputs the selected discrete value as the discrete value signal.

2. The transmission circuit according to claim 1, wherein the delta-sigma modulated signal generation section includes:

a dividing section for dividing the amplitude signal by the discrete value signal, and outputting a resultant signal as an amplitude signal whose envelope variation is small;

a delta-sigma modulation section for delta-sigma modulating the amplitude signal outputted from the dividing section, and outputting a resultant signal as the delta-sigma modulated signal; and a variable gain amplifier section for amplifying the delta-sigma modulated signal by a gain corresponding to a magnitude of the discrete value signal.

3. The transmission circuit according to claim 2, further comprising a multiplying section which is connected subsequent to the amplitude calculation section and to which power information indicating a magnitude of output power of the transmission circuit is inputted, wherein the amplitude amplifying section includes:

a series regulator for supplying, to the amplitude modulation section, a voltage corresponding to the magnitude of the delta-sigma modulated signal generated by the delta-sigma modulated signal generation section; and a switching regulator for supplying, to the series regulator, a voltage corresponding to a magnitude of an output signal of the multiplying section, the multiplying section multiplies the discrete value signal, which is outputted from the amplitude calculation section, by the power information, and the discrete value signal, which has been multiplied by the power information, is inputted to the switching regulator and the variable gain amplifier section from the multiplying section.

4. The transmission circuit according to claim 2, further comprising a multiplying section which is connected subsequent to the amplitude calculation section and to which power information indicating a magnitude of output power of the transmission circuit is inputted, wherein the amplitude amplifying section includes:

a series regulator for supplying, to the amplitude modulation section, a voltage corresponding to the magnitude of the delta-sigma modulated signal generated by the delta-sigma modulated signal generation section; and a switching regulator for supplying, to the series regulator, a voltage corresponding to the power information, the multiplying section multiplies the discrete value signal, which is outputted from the amplitude calculation section, by the power information, and the discrete value signal is inputted to the variable gain amplifier section from the multiplying section.

5. The transmission circuit according to claim 1, wherein the delta-sigma modulated signal generation section includes a delta-sigma modulation section for delta-sigma modulating the amplitude signal, and outputting a resultant signal as the delta-sigma modulated signal, and the delta-sigma modulation section changes the magnitude of the delta-sigma modulated signal to be outputted, such that the magnitude of the delta-sigma modulated signal has a same characteristic as that of a magnitude of the discrete value signal.

6. The transmission circuit according to claim 5, wherein the delta-sigma modulation section changes the magnitude of the delta-sigma modulated signal to be outputted, so as to be proportional to the magnitude of the discrete value signal.

7. The transmission circuit according to claim 5, wherein the delta-sigma modulation section refers to a look-up table, in which an optimal value is preset, thereby changing, in accordance with the magnitude of the discrete value signal, the magnitude of the delta-sigma modulated signal to be outputted.

8. The transmission circuit according to claim 1, wherein the signal generation section includes a polar coordinate signal generation section for generating the amplitude signal and a phase signal respectively based on an amplitude component and a phase component which are obtained by performing signal processing on the input data, and an angle modulation section for angle-modulating the phase signal, and outputting a resultant signal as the angle-modulated signal.

9. The transmission circuit according to claim 1, wherein the signal generation section includes:

a quadrature signal generation section for generating, by performing signal processing on the input data, a vector signal comprising an in-phase signal (I signal) and a quadrature-phase signal (Q signal) which are orthogonal to each other;

a vector modulation section for vector-modulating the vector signal;

an envelope detection section for detecting an envelope component of a signal outputted from the vector modulation section, and outputting the detected envelope component as the amplitude signal; and a limiter for limiting, to a particular magnitude, the envelope component of the signal outputted from the vector modulation section, and outputting the signal, whose envelope component has been limited in magnitude, as the angle-modulated signal.

10. The transmission circuit according to claim 1, wherein the amplitude calculation section includes a maximum amplitude detection section for detecting, at the predetermined time periods, a maximum value of the amplitude signal, and a quantization section for: retaining the at least one threshold value and the two or more discrete values corresponding to the at least one threshold value; determining, at the predetermined time periods, whether or not the maximum value of the amplitude signal exceeds the at least one threshold value; selecting, based on a determination result, the discrete value to be outputted; and outputting the selected discrete value as the discrete value signal.

11. The transmission circuit according to claim 1, further comprising a band-pass filter, which is connected subsequent to the amplitude modulation section, for removing a quantization noise from the transmission signal outputted from the amplitude modulation section.

12. The transmission circuit according to claim 1, further comprising a low-pass filter, which is connected between the amplitude amplifying section and the amplitude modulation section, for removing a quantization noise from the signal outputted from the amplitude amplifying section.

13. The transmission circuit according to claim 1, further comprising a low-pass filter, which is provided between the delta-sigma modulated signal generation section and the amplitude amplifying section, for removing a quantization noise from the delta-sigma modulated signal.

14. The transmission circuit according to claim 1, wherein the amplitude amplifying section is structured by a switching regulator, and the amplitude amplifying section supplies, to the amplitude modulation section, a voltage corresponding to the magnitude of the delta-sigma modulated signal generated by the delta-sigma modulated signal generation section.

15. The transmission circuit according to claim 1, wherein the amplitude amplifying section is structured by a series regulator, and the amplitude amplifying section supplies, to the amplitude modulation section, a voltage corresponding to the magnitude of the delta-sigma modulated signal generated by the delta-sigma modulated signal generation section.

16. The transmission circuit according to claim 1, wherein the amplitude amplifying section is structured by a current-driven regulator, and the amplitude amplifying section supplies, to the amplitude modulation section, an electric current corresponding to the magnitude of the delta-sigma modulated signal generated by the delta-sigma modulated signal generation section.

17. The transmission circuit according to claim 1, wherein the amplitude amplifying section includes
a series regulator for supplying, to the amplitude modulation section, a voltage corresponding to the magnitude of the delta-sigma modulated signal generated by the delta-sigma modulated signal generation section, and
a switching regulator for supplying, to the series regulator, a voltage corresponding to a magnitude of the discrete value signal outputted from the amplitude calculation section.

18. The transmission circuit according to claim 15, further comprising a timing control section, which is connected between the amplitude calculation section and the switching regulator, for controlling, so as to compensate for rising of the switching regulator, a timing of inputting, to the switching regulator, the discrete value signal outputted from the amplitude calculation section.

19. The transmission circuit according to claim 1, further comprising a multiplying section which is connected subsequent to the signal generation section and to which power information indicating a magnitude of output power of the transmission circuit is inputted, wherein
the multiplying section multiplies the amplitude signal, which is generated by the signal generation section, by the power information, and
the amplitude signal is inputted to the amplitude calculation section and the delta-sigma modulated signal generation section from the multiplying section.

20. The transmission circuit according to claim 1, wherein the amplitude amplifying section includes:
a plurality of series regulators for supplying, to the amplitude modulation section, a voltage corresponding to the magnitude of the delta-sigma modulated signal generated by the delta-sigma modulated signal generation section;
a switch for switching a connection between the amplitude modulation section and the plurality of series regulators; and
a switching regulator for supplying, to the plurality of series regulators, a voltage corresponding to a magnitude of the discrete value signal outputted from the amplitude calculation section,
the plurality of series regulators include a first series regulator, which is connectable to the amplitude modulation section via the switch, and a second series regulator, which is larger in size than the first series regulator and which is connectable to the amplitude modulation section via the switch, and
when the magnitude of the delta-sigma modulated signal is smaller than a predetermined threshold value, the switch is switched such that the first series regulator and the amplitude modulation section are connected, and when the magnitude of the delta-sigma modulated signal is equal to or greater than the threshold value, the switch is switched such that the second series regulator and the amplitude modulation section are connected.

21. The transmission circuit according to claim 1, wherein the amplitude amplifying section includes
one switching regulator for supplying, to the amplitude modulation section, a voltage corresponding to the magnitude of the delta-sigma modulated signal generated by the delta-sigma modulated signal generation section, and
another switching regulator for supplying, to said one switching regulator, a voltage corresponding to a magnitude of the discrete value signal outputted from the amplitude calculation section.

22. The transmission circuit according to claim 1, wherein the amplitude amplifying section includes:
a plurality of switching regulators for supplying, to the amplitude modulation section, a voltage corresponding to the magnitude of the delta-sigma modulated signal generated by the delta-sigma modulated signal generation section;
a switch for switching a connection between the amplitude modulation section and the plurality of switching regulators; and
a switching regulator for supplying, to the plurality of switching regulators, a voltage corresponding to a magnitude of the discrete value signal outputted from the amplitude calculation section,
the plurality of switching regulators include a first switching regulator, which is connectable to the amplitude modulation section via the switch, and a second switching regulator, which is larger in size than the first switching regulator and which is connectable to the amplitude modulation section via the switch, and
when the magnitude of the delta-sigma modulated signal is smaller than a predetermined threshold value, the switch is switched such that the first switching regulator and the amplitude modulation section are connected, and when the magnitude of the delta-sigma modulated signal is equal to or greater than the threshold value, the switch is switched such that the second switching regulator and the amplitude modulation section are connected.

23. The transmission circuit according to claim 1, wherein the predetermined time periods are each shorter than a time period for controlling an output power of the transmission circuit.

24. The transmission circuit according to claim 1, wherein the amplitude calculation section changes a length of the predetermined time periods in accordance with a degree of envelope variation of the transmission signal.

25. The transmission circuit according to claim 1, wherein when a degree of envelope variation of the transmission signal is small, the amplitude calculation section shortens the predetermined time periods, and when the degree of envelope variation of the transmission signal is large, the amplitude calculation section lengthens the predetermined time periods.

26. The transmission circuit according to claim 1, wherein the amplitude calculation section changes a length of the predetermined time periods in accordance with a modulation mode of the transmission signal.

27. The transmission circuit according to claim 1, further comprising, at an output of the signal generation section, a distortion compensation section for compensating for at least either one of the amplitude signal and the angle-modulated signal so as to suppress at least distortion occurring at the amplitude modulation section.

28. A communication device comprising:
a transmission circuit for generating a transmission signal; and
an antenna for outputting the transmission signal generated by the transmission circuit, wherein
the transmission circuit is the transmission circuit according to claim 1.

29. The communication device according to claim 28, further comprising:
a reception circuit for processing a reception signal received from the antenna; and an antenna duplexer for outputting the transmission signal generated by the transmission circuit to the antenna, and outputting the reception signal received from the antenna to the reception circuit.

30. A transmission circuit for generating and outputting a transmission signal based on input data, the transmission circuit comprising:
　　a signal generation section for generating, based on the input data, a vector signal comprising an in-phase signal (I signal) and a quadrature-phase signal (Q signal), which are orthogonal to each other, and an amplitude signal representing a magnitude of the vector signal;
　　an amplitude calculation section for performing predetermined arithmetic processing on the amplitude signal, and outputting a resultant signal as a discrete value signal having a plurality of discrete values corresponding to a magnitude of the amplitude signal;
　　a modulation signal generation section for modulating the vector signal in accordance with the discrete value signal, thereby generating a modulation signal;
　　an amplitude amplifying section for outputting a signal corresponding to a magnitude of the discrete value signal; and
　　an amplifier section for amplifying the modulation signal in accordance with the signal outputted from the amplitude amplifying section, and outputting a resultant signal as a transmission signal, wherein
　　the amplitude calculation section
　　　　retains at least one threshold value and two or more discrete values corresponding to the at least one threshold value, and
　　　　determines at predetermined time periods whether or not the amplitude signal exceeds the at least one threshold value; selects, based on a determination result, a discrete value to be outputted; and outputs the selected discrete value as the discrete value signal.

31. The transmission circuit according to claim 30, wherein
　　the modulation signal generation section includes:
　　　　a dividing section for dividing the vector signal by the discrete value signal;
　　　　a signal processing section for performing predetermined signal processing on the vector signal to quantize the vector signal which has been divided by the dividing section, and outputting a resultant signal as a quantized signal;
　　　　a vector modulation section for vector-modulating the quantized signal, and outputting a resultant signal as the modulation signal; and
　　　　a variable gain amplifier section for amplifying the modulation signal outputted from the vector modulation section, by a gain corresponding to the magnitude of the discrete value signal.

32. The transmission circuit according to claim 31, wherein
　　the signal processing section includes:
　　　　a signal conversion section, to which the divided vector signal is inputted from the dividing section, for converting the inputted vector signal into a signal, which represents a magnitude of the inputted vector signal, and into a standardized vector signal, which is calculated by dividing the inputted vector signal by the signal representing the magnitude of the inputted vector signal;
　　　　a delta-sigma modulation section for delta-sigma modulating the signal representing the magnitude of the inputted vector signal; and
　　　　a multiplying section for multiplying the delta-sigma modulated signal by the standardized vector signal, and outputting a resultant signal as the quantized signal.

33. The transmission circuit according to claim 31, wherein
　　the signal processing section includes:
　　　　a vector calculation section to which the divided vector signal is inputted from the dividing section; and
　　　　a vector quantization section for quantizing an output signal of the vector calculation section, and outputting a resultant signal as the quantized signal, and
　　the vector calculation section has:
　　　　a vector subtraction section for subtracting the quantized signal from the divided vector signal inputted thereto; and
　　　　a vector integration section for integrating a signal inputted thereto via the vector subtraction section, and outputting a resultant signal.

34. The transmission circuit according to claim 33, wherein the signal processing section further comprises, at an output of the vector calculation section, at least one vector calculation section.

35. The transmission circuit according to claim 30, wherein
　　the modulation signal generation section includes:
　　　　a dividing section for dividing the vector signal by the discrete value signal;
　　　　a signal processing section for performing predetermined signal processing on the divided vector signal to quantize the vector signal, and outputting a resultant signal as a quantized signal;
　　　　a variable gain amplifier section for amplifying the quantized signal by a gain corresponding to the magnitude of the discrete value signal; and
　　　　a vector modulation section for vector-modulating the quantized signal, which has been amplified by the variable gain amplifier section, and outputting a resultant signal as the modulation signal.

36. The transmission circuit according to claim 30, wherein
　　the modulation signal generation section includes:
　　　　a signal processing section for performing predetermined signal processing on the vector signal to quantize the vector signal, and outputting a resultant signal as a quantized signal; and
　　　　a vector modulation section for vector-modulating the quantized signal, and outputting a resultant signal as the modulation signal, and
　　the signal processing section changes a magnitude of the quantized signal, such that the magnitude of the quantized signal has a same characteristic as that of the magnitude of the discrete value signal.

37. The transmission circuit according to claim 36, wherein the signal processing section changes the magnitude of the quantized signal so as to be proportional to the magnitude of the discrete value signal.

38. The transmission circuit according to claim 36, wherein the signal processing section refers to a look-up table, in which an optimal value is preset, thereby changing the magnitude of the quantized signal in accordance with the magnitude of the discrete value signal.

39. The transmission circuit according to claim 30, further comprising a band-pass filter for removing a quantization noise from the transmission signal outputted from the amplifier section.

40. The transmission circuit according to claim 30, further comprising a low-pass filter for removing a quantization noise from the signal outputted from the amplitude amplifying section.

41. The transmission circuit according to claim 30, further comprising, at an output of the signal generation section, a distortion compensation section for compensating for at least either one of the amplitude signal and the vector signal so as to suppress at least distortion occurring at the amplifier section.

* * * * *